US012410199B2

United States Patent
Shim et al.

(10) Patent No.: US 12,410,199 B2
(45) Date of Patent: *Sep. 9, 2025

(54) ORGANIC LIGHT EMITTING COMPOUND AND ORGANIC LIGHT EMITTING DEVICE

(71) Applicant: SFC CO., LTD, Cheongju-si (KR)

(72) Inventors: So-young Shim, Cheongju-si (KR); Se-jin Yu, Cheongju-si (KR)

(73) Assignee: SFC CO., LTD, Cheongju-si (KR)

(*) Notice: Subject to any disclaimer, the term of this patent is extended or adjusted under 35 U.S.C. 154(b) by 906 days.

This patent is subject to a terminal disclaimer.

(21) Appl. No.: 17/628,318

(22) PCT Filed: Jul. 24, 2020

(86) PCT No.: PCT/KR2020/009813
§ 371 (c)(1),
(2) Date: Jan. 19, 2022

(87) PCT Pub. No.: WO2021/015594
PCT Pub. Date: Jan. 28, 2021

(65) Prior Publication Data
US 2022/0403233 A1    Dec. 22, 2022

(30) Foreign Application Priority Data
Jul. 24, 2019  (KR) .................. 10-2019-0089855

(51) Int. Cl.
*C07F 5/02*    (2006.01)
*C09K 11/06*   (2006.01)
(Continued)

(52) U.S. Cl.
CPC .............. *C07F 5/027* (2013.01); *C09K 11/06* (2013.01); *H10K 85/657* (2023.02);
(Continued)

(58) Field of Classification Search
None
See application file for complete search history.

(56) References Cited

U.S. PATENT DOCUMENTS 12,137,613 B2 * 11/2024 Shin ............... H10K 85/658
2019/0211038 A1   7/2019 Xia
(Continued)

FOREIGN PATENT DOCUMENTS

CN    106188141 A    12/2016
CN    106207000 A    12/2016
(Continued)

OTHER PUBLICATIONS

Machine translated English version of JP 2012/142479 A and the original JP 2012/142479 A, Sekine Noboru (Year: 2012).*
(Continued)

*Primary Examiner* — Seokmin Jeon
(74) *Attorney, Agent, or Firm* — NSIP Law

(57) ABSTRACT

The present invention relates to the following polycyclic aromatic derivative organic light emitting compound, and an organic light emitting device employing same as a dopant compound of a device light emitting layer. The organic light emitting device according to the present invention comprises a polycyclic aromatic derivative compound as a dopant compound in a light emitting layer, and also, at the same time, employs, alongside the dopant compound, an anthracene derivative compound having a characteristic structure in the light emitting layer by combining same as a host. Accordingly, the organic light emitting device according to the present invention has excellent color purity, high luminous efficiency, and a remarkably improved long life, and thus can be usefully used in various display devices.

21 Claims, 1 Drawing Sheet

(51) Int. Cl.
  *H10K 50/11* (2023.01)
  *H10K 85/60* (2023.01)

(52) U.S. Cl.
  CPC .... *H10K 85/658* (2023.02); *C09K 2211/1022* (2013.01); *H10K 50/11* (2023.02)

(56) References Cited

U.S. PATENT DOCUMENTS

2023/0189646 A1* 6/2023 Shin ............... H10K 85/658
2024/0018164 A1* 1/2024 Shin ............... C07F 5/02

FOREIGN PATENT DOCUMENTS

| CN | 106467554 A | 3/2017 |
|---|---|---|
| CN | 108409761 A | 8/2018 |
| CN | 108409762 A | 8/2018 |
| CN | 109804043 A | 5/2019 |
| CN | 110003254 A | 7/2019 |
| EP | 4 122 937 A1 | 1/2023 |
| JP | 2012-142479 A | 7/2012 |
| JP | 2012-234873 A | 11/2012 |
| KR | 10-2018-0037717 A | 4/2018 |
| WO | WO 2010/104047 A1 | 9/2010 |
| WO | WO 2017/188111 A1 | 11/2017 |

OTHER PUBLICATIONS

Huiqing Pang et al. "A full-color, low-power, wearable display for mobile applications", SPIE, Mar. 29, 2012 (Year: 2012).*

Extended European search report issued on Jun. 12, 2023, in counterpart European Patent Application No. 20843932.3 (8 pages).

Chinese Office Action issued on Apr. 19, 2023, in corresponding Chinese Patent Application No. 202080052613.3 (10 pages in Chinese).

Japanese Notice of Allowance issued on Mar. 7, 2023, in corresponding Japanese Patent Application No. 2022-504718 (2 pages in Japanese).

* cited by examiner

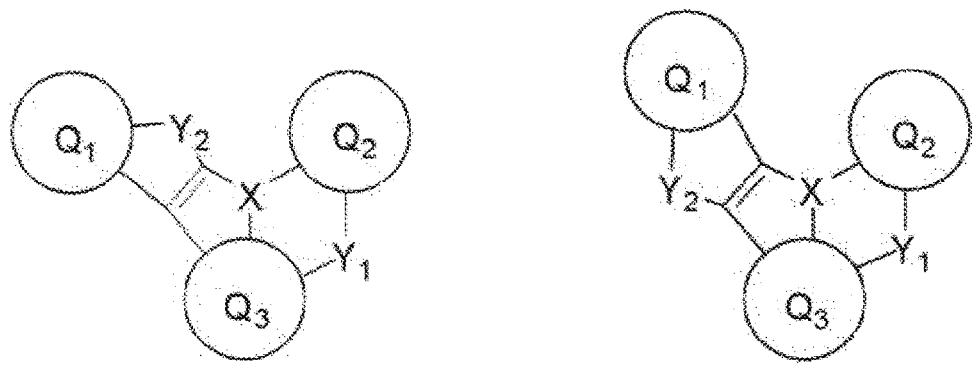

ORGANIC LIGHT EMITTING COMPOUND AND ORGANIC LIGHT EMITTING DEVICE

CROSS REFERENCE TO RELATED APPLICATIONS

This application is a U.S. National Stage Application of International Application No. PCT/KR2020/009813, filed on Jul. 24, 2020, which claims the benefit under 35 USC 119(a) and 365(b) of Korean Patent Application No. 10-2019-0089855, filed on Jul. 24, 2019 in the Korean Intellectual Property Office, the entire disclosure of which is incorporated herein by reference for all purposes.

TECHNICAL FIELD

The present invention relates to a polycyclic aromatic derivative as an organic electroluminescent compound and an organic electroluminescent device. More specifically, the present invention relates to an organic electroluminescent device in which a combination of a polycyclic aromatic derivative as a dopant compound and an anthracene derivative as a host compound is employed in a light emitting layer, achieving high luminous efficiency, high color purity, and significantly improved lifetime.

BACKGROUND ART

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized structures of organic layers for organic electroluminescent devices and stable and efficient materials for organic layers of organic electroluminescent devices.

Particularly, for maximum efficiency in a light emitting layer, an appropriate combination of energy band gaps of a host and a dopant is required such that holes and electrons migrate to the dopant through stable electrochemical paths to form excitons.

DETAILED DESCRIPTION OF THE INVENTION

Problems to be Solved by the Invention

Thus, the present invention intends to provide a polycyclic aromatic derivative as an organic electroluminescent compound and an organic electroluminescent device in which a combination of the polycyclic aromatic derivative as a dopant compound and a specific host material is employed in a light emitting layer, achieving improved luminescent properties such as high color purity, high luminous efficiency, and long lifetime.

Means for Solving the Problems

One aspect of the present invention provides an organic electroluminescent compound represented by Formula A:

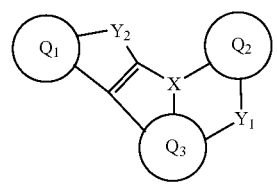

[Formula A]

or Formula B:

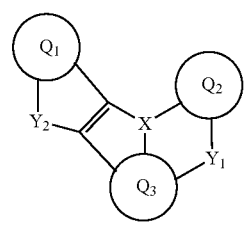

[Formula B]

A further aspect of the present invention provides an organic electroluminescent device including a first electrode, a second electrode opposite to the first electrode, and a light emitting layer interposed between the first and second electrodes wherein the light emitting layer includes a compound represented by Formula A.

Another aspect of the present invention provides an organic electroluminescent device including a light emitting layer employing a combination of a dopant compound represented by Formula A:

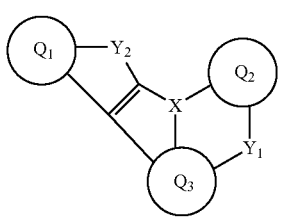

[Formula A]

or Formula B:

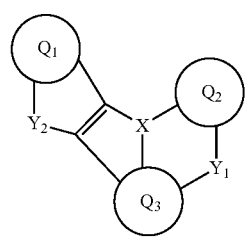

[Formula B]

and a host compound represented by Formula H1:

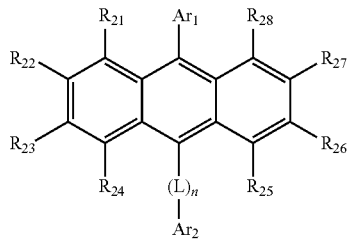
[Formula H1]

or Formula H2:

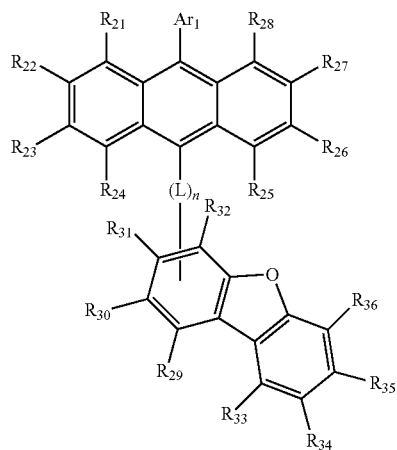
[Formula H2]

The structures of Formulae A, B, H1, and H2 are described below and the substituents in Formulae A, B, H1, and H2 are as defined below.

Effects of the Invention

The organic electroluminescent device of the present invention includes a light emitting layer employing a combination of (1) a polycyclic aromatic derivative as a dopant compound and (2) an anthracene derivative with a specific structure as a host compound. The use of the dopant and host compounds ensures high purity, high luminous efficiency, and significantly improved longtime. Due to these advantages, the organic electroluminescent device of the present invention can find useful applications in a variety of displays.

BRIEF DESCRIPTION OF THE DRAWINGS

FIGURE shows the structures of exemplary polycyclic aromatic derivatives according to the present invention.

BEST MODE FOR CARRYING OUT THE INVENTION

The present invention will now be described in more detail.
The present invention is directed to a polycyclic aromatic derivative as an organic electroluminescent compound, represented by Formula A:

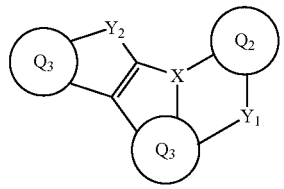
[Formula A]

wherein $Q_1$ to $Q_3$ are identical to or different from each other and are each independently a substituted or unsubstituted $C_6$-$C_{50}$ aromatic hydrocarbon ring or a substituted or unsubstituted $C_2$-$C_{50}$ aromatic heterocyclic ring, X is selected from B, P, P=O, and P=S, $Y_1$ is a single bond or is selected from $NR_1$, $CR_2R_3$, O, S, and $SiR_4R_5$, $Y_2$ is selected from $NR_6$, $CR_7R_8$, O, S, and $SiR_9R_{10}$, and $R_1$ to $R_{10}$ are identical to or different from each other and are each independently selected from hydrogen, deuterium, substituted or unsubstituted $C_1$-$C_{30}$ alkyl, substituted or unsubstituted $C_2$-$C_{30}$ alkenyl, substituted or unsubstituted $C_2$-$C_{30}$ alkynyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that $R_1$ to $R_{10}$ are optionally bonded to each other or each of $R_1$ to $R_{10}$ is optionally bonded to one or more of the rings $Q_1$ to $Q_3$ to form an alicyclic or aromatic monocyclic or polycyclic ring, $R_2$ and $R_3$ are optionally linked together to form an alicyclic or aromatic monocyclic or polycyclic ring, $R_4$ and $R_5$ are optionally linked together to form an alicyclic or aromatic monocyclic or polycyclic ring, $R_7$ and $R_8$ are optionally linked together to form an alicyclic or aromatic monocyclic or polycyclic ring, and $R_9$ and $R_{10}$ are optionally linked together to form an alicyclic or aromatic monocyclic or polycyclic ring, or Formula B:

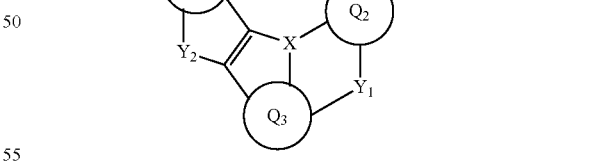
[Formula B]

wherein $Q_1$ to $Q_3$, X, $Y_1$, and $Y_2$ are as defined in Formula A.

According to a preferred embodiment of the present invention, X in Formula A may be boron (B). The structure of the polycyclic aromatic derivative represented by Formula A or B wherein X is selected from B, P, P=O, and P=S enables the fabrication of a high-efficiency, long-lasting organic electroluminescent device.

According to one embodiment of the present invention, the organic electroluminescent compound of Formula A or B may be represented by Formula A-1:

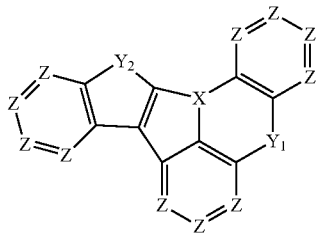

[Formula A-1]

wherein each Z is independently CR or N, each R is independently selected from hydrogen, deuterium, substituted or unsubstituted $C_1$-$C_{30}$ alkyl, substituted or unsubstituted $C_2$-$C_{30}$ alkenyl, substituted or unsubstituted $C_2$-$C_{30}$ alkynyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_4$-$C_{30}$ arylheteroarylamine, substituted or unsubstituted $C_1$-$C_{30}$ alkylsilyl, substituted or unsubstituted $C_5$-$C_{30}$ arylsilyl, nitro, cyano, and halogen, with the proviso that the groups R are optionally bonded to each other to form an alicyclic or aromatic monocyclic or polycyclic ring or each of the groups R is optionally linked to an adjacent substituent to form an alicyclic or aromatic monocyclic or polycyclic ring and that the alicyclic or aromatic monocyclic or polycyclic ring is optionally interrupted by one or more heteroatoms selected from N, S, and O, and X, $Y_1$, and $Y_2$ are as defined in Formula A or B, or Formula B-1:

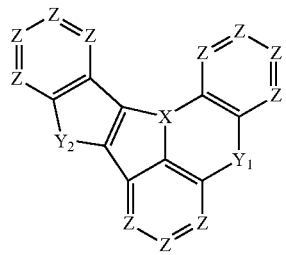

[Formula B-1]

wherein X, $Y_1$, $Y_2$, and Z are as defined in Formula A-1.

As used herein, the term "substituted" in the definition of $Q_1$ to $Q_3$ and $R_1$ to $R_{10}$ in Formulae A and B, R in Formulae A-1 and B-1, and groups in other formulae that are provided below indicates substitution with one or more substituents selected from deuterium, cyano, halogen, hydroxyl, nitro, $C_1$-$C_{24}$ alkyl, $C_3$-$C_{24}$ cycloalkyl, $C_1$-$C_{24}$ haloalkyl, $C_2$-$C_{24}$ alkenyl, $C_2$-$C_{24}$ alkynyl, $C_1$-$C_{24}$ heteroalkyl, $C_1$-$C_{24}$ heterocycloalkyl, $C_6$-$C_{24}$ aryl, $C_6$-$C_{24}$ arylalkyl, $C_2$-$C_{24}$ heteroaryl, $C_2$-$C_{24}$ heteroarylalkyl, $C_1$-$C_{24}$ alkoxy, $C_1$-$C_{24}$ alkylamino, $C_6$-$C_{24}$ arylamino, $C_2$-$C_{24}$ heteroarylamine, $C_6$-$C_{24}$ arylheteroarylamine, $C_1$-$C_{24}$ alkylsilyl, $C_6$-$C_{24}$ arylsilyl, and $C_6$-$C_{24}$ aryloxy, or a combination thereof. The term "unsubstituted" in the same definition indicates having no substituent.

In the "substituted or unsubstituted $C_1$-$C_{10}$ alkyl", "substituted or unsubstituted $C_6$-$C_{30}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

In the present invention, the alkyl groups may be straight or branched. The number of carbon atoms in the alkyl groups is not particularly limited but is preferably from 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and stilbenyl groups. Examples of the polycyclic aryl groups include naphthyl, anthracenyl, phenanthrenyl, pyrenyl, perylenyl, tetracenyl, chrysenyl, fluorenyl, acenaphthacenyl, triphenylene, and fluoranthrene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The alkoxy group may be specifically a methoxy, ethoxy, propoxy, isobutyloxy, sec-butyloxy, pentyloxy, iso-amyloxy or hexyloxy group but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, —NH$_2$, alkylamine groups, arylamine groups, and arylheteroarylamine groups. The arylamine groups are aryl-substituted amine groups, the alkylamine groups are alkyl-substituted amine groups, and the arylheteroarylamine groups are aryl- and heteroaryl-substituted amine groups. Examples of the arylamine groups include substituted or unsubstituted monoarylamine groups, substituted or unsubstituted diarylamine groups, and substituted or unsubstituted triarylamine groups. The aryl moieties in the arylamine groups and the aryl and heteroaryl moieties in the arylheteroarylamine groups may be monocyclic or polycyclic ones. The arylamine groups may include two or more aryl moieties. In this case, the aryl moieties may be monocyclic aryl moieties, monocyclic heteroaryl moieties, polycyclic aryl moieties or polycyclic heteroaryl moieties. Alternatively, the aryl moieties may consist of a monocyclic aryl (or heteroaryl) moiety and a polycyclic aryl (or heteroaryl) moiety. The aryl moieties in the arylamine groups and the aryl and heteroaryl moieties in the arylheteroarylamine groups may be selected from those exemplified above.

The aryl moieties in the aryloxy group and the arylthioxy group are the same as those described above for the aryl groups. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

The polycyclic aromatic derivative represented by Formula A or B according to the present invention can be employed as a dopant compound in an organic layer, preferably a light emitting layer of an organic electroluminescent device. The polycyclic aromatic derivative may be selected from, but not limited to, the following compounds 1 to 152:

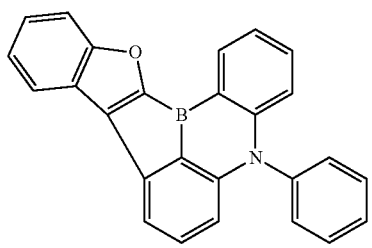

1

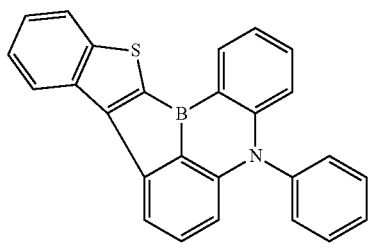

2

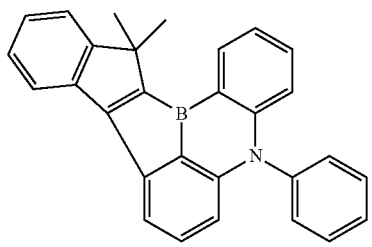

3

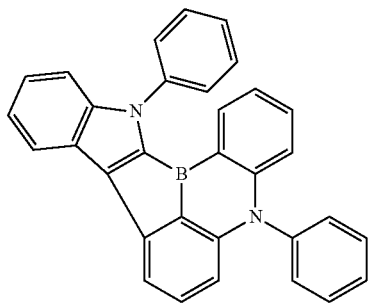

4

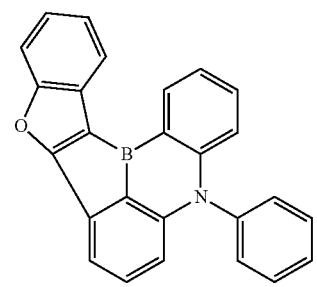

5

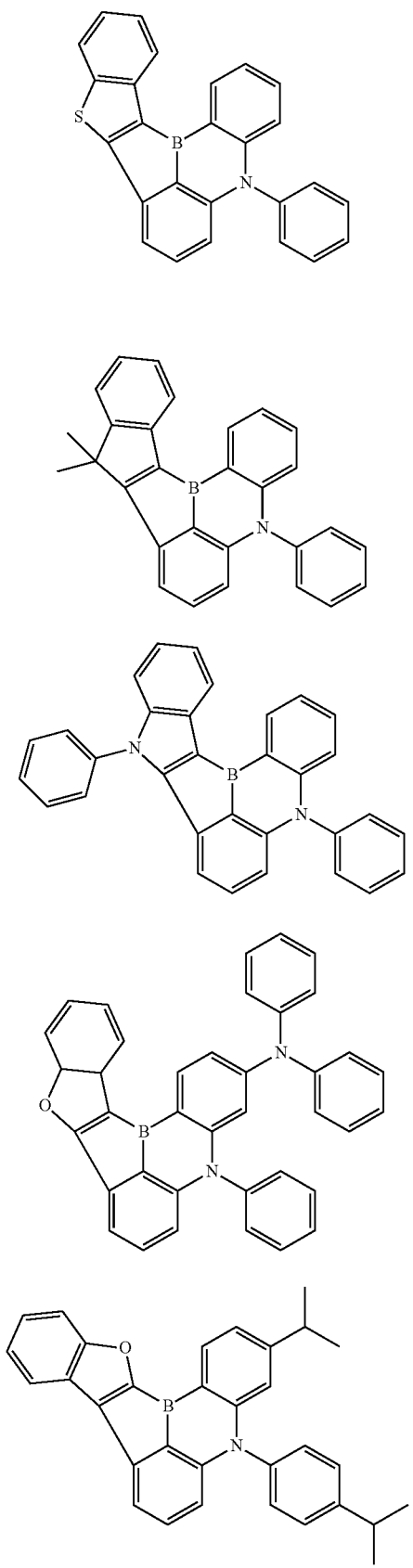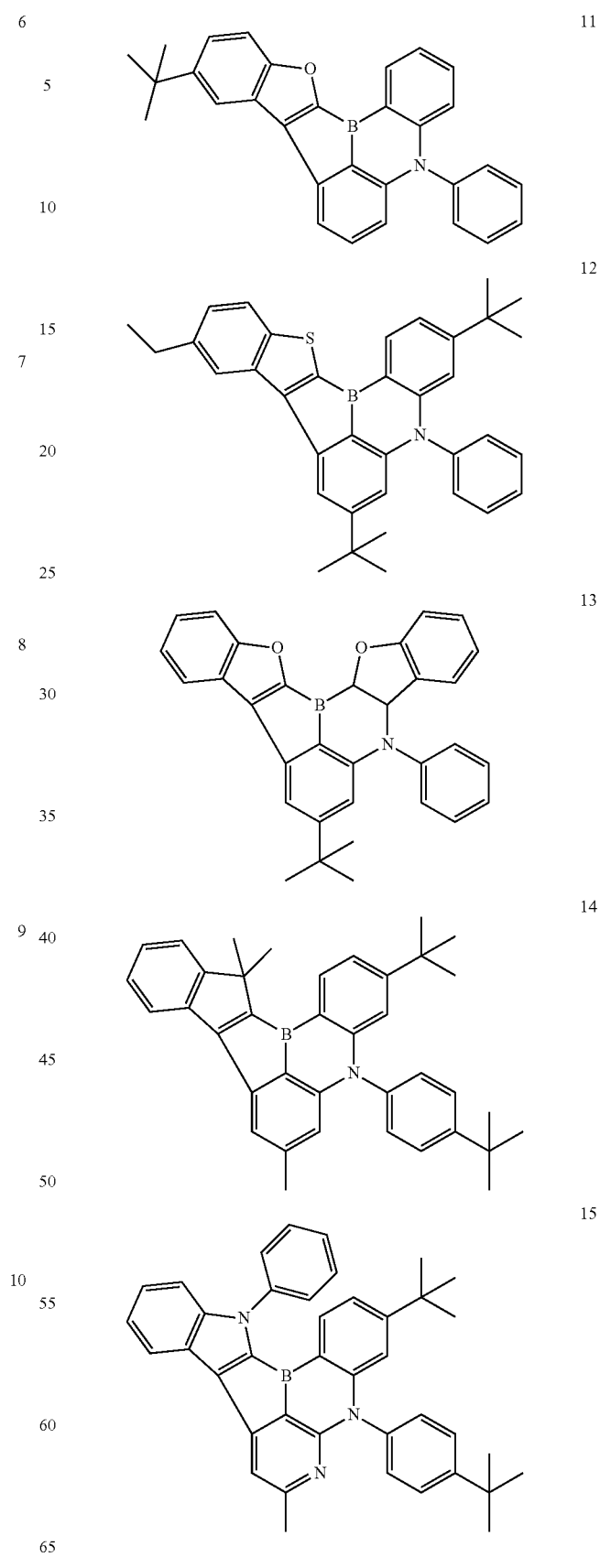

16
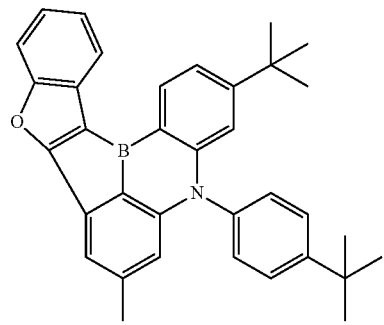
17
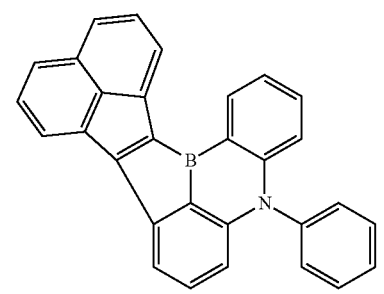
18
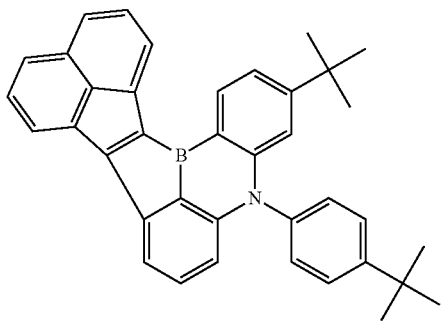
19
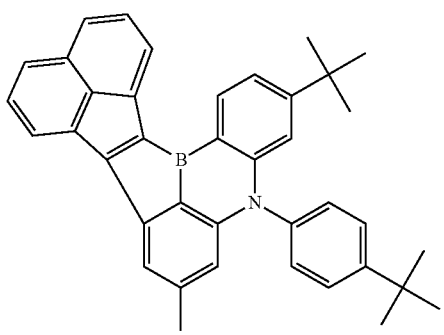
20
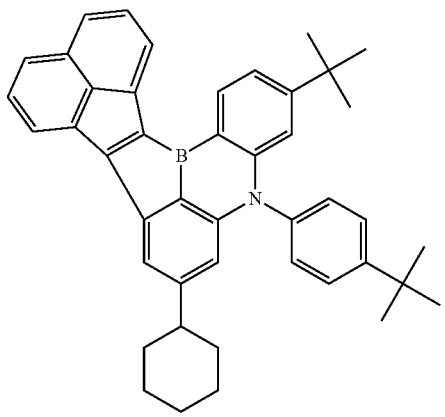
21
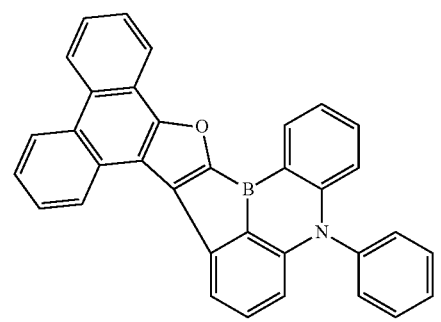
22
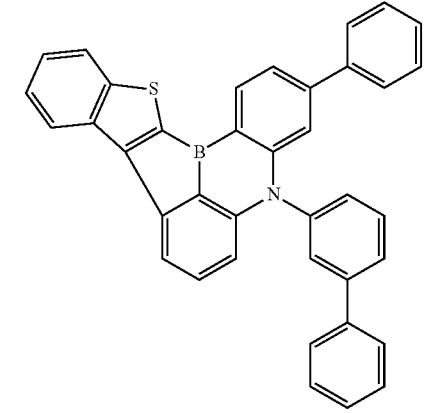
23
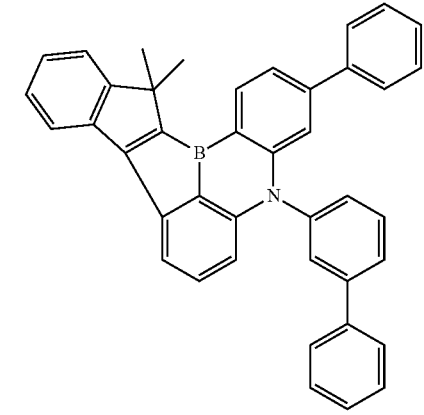

24
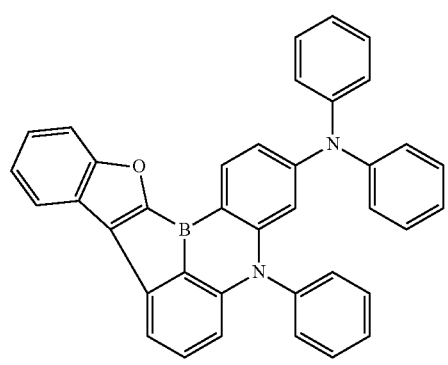
25
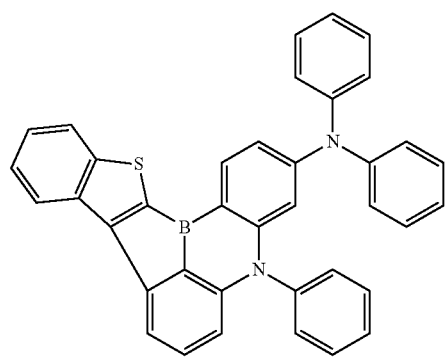
26
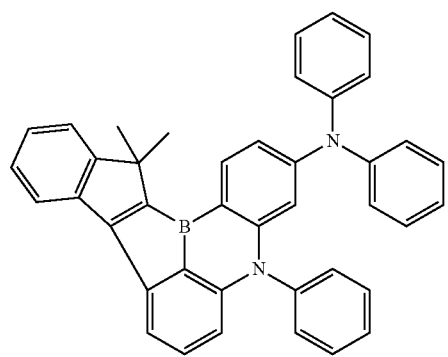
27
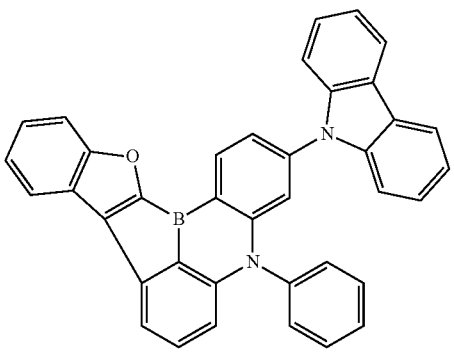
28
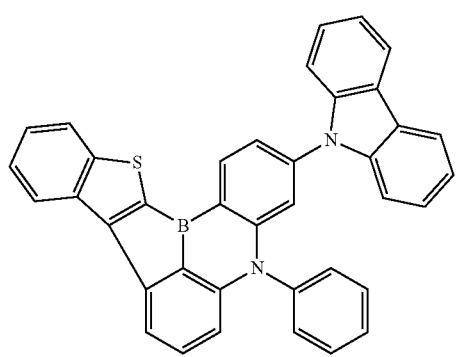
29
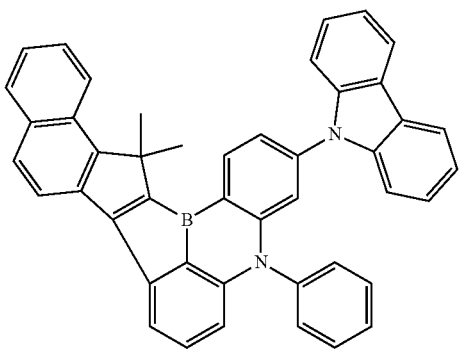
30
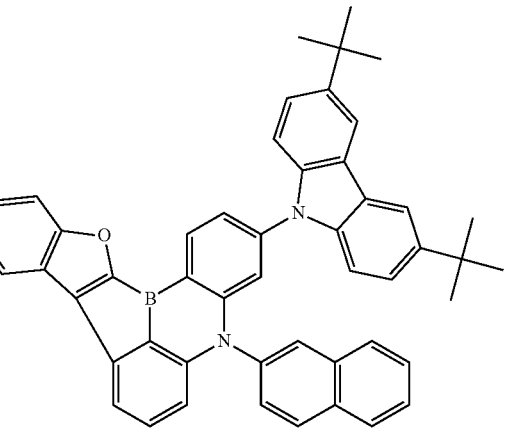
31
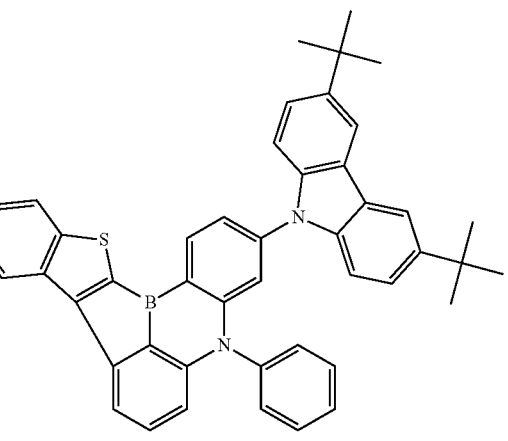

32
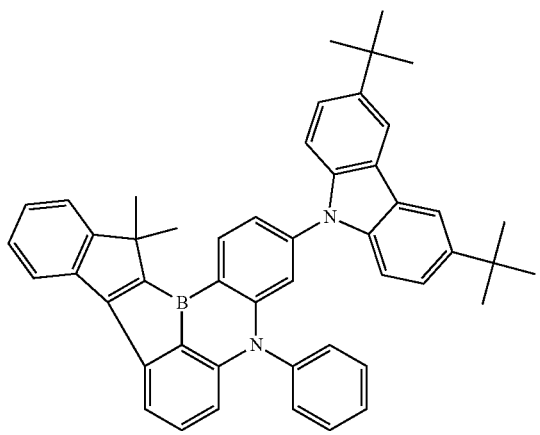
33
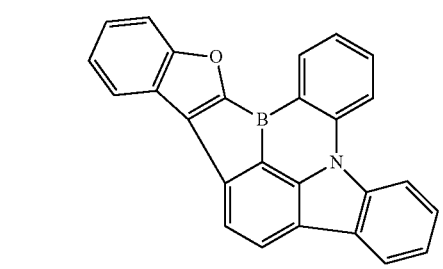
34
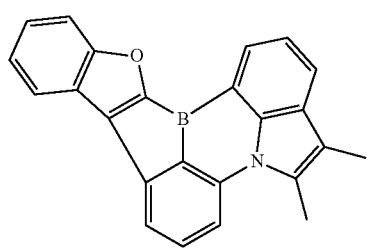
35
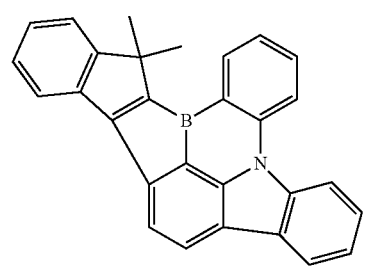
36
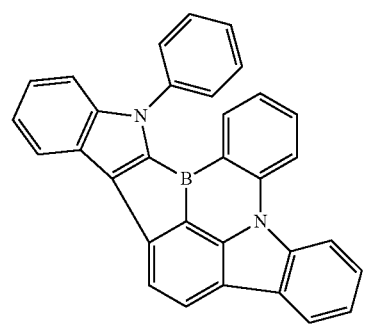
37
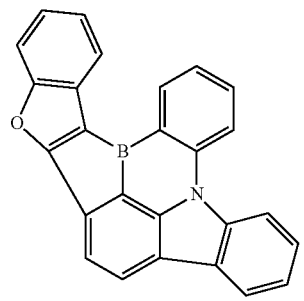
38
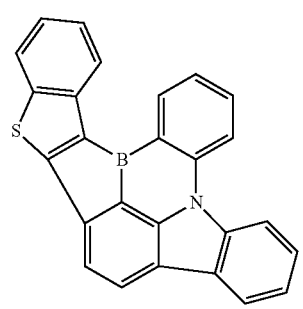
39
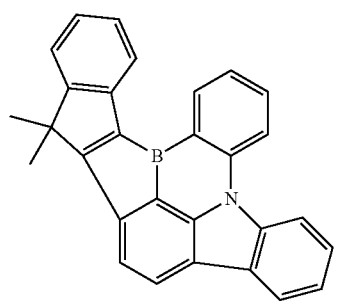
40
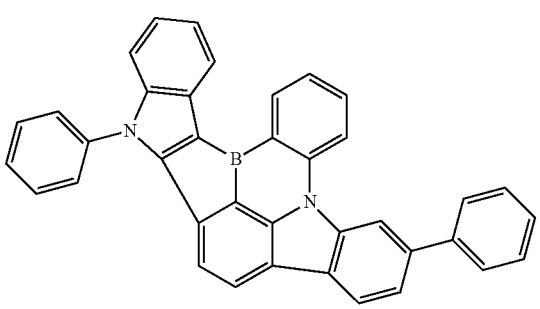
41
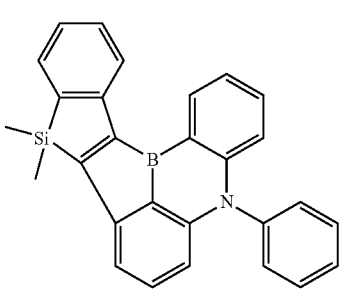

42
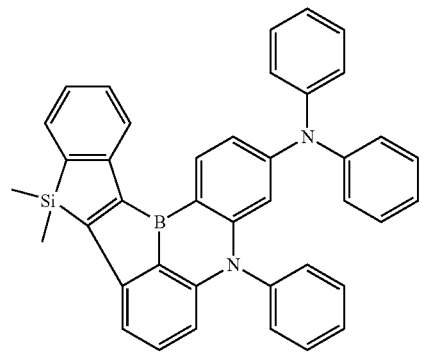
43
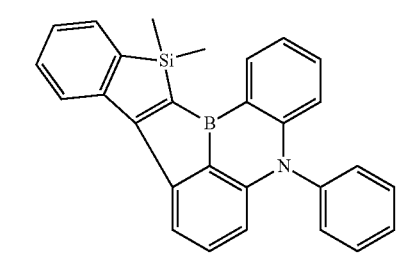
44
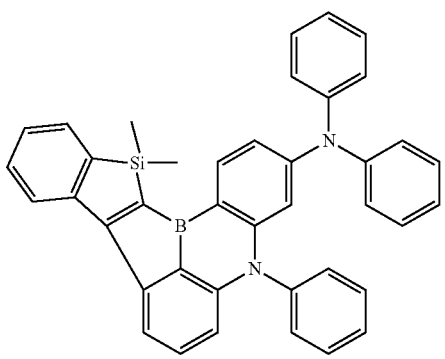
45
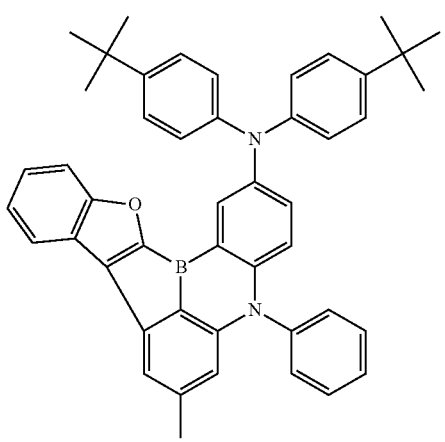
46
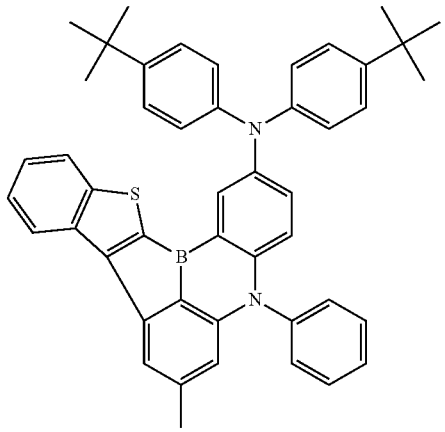
47
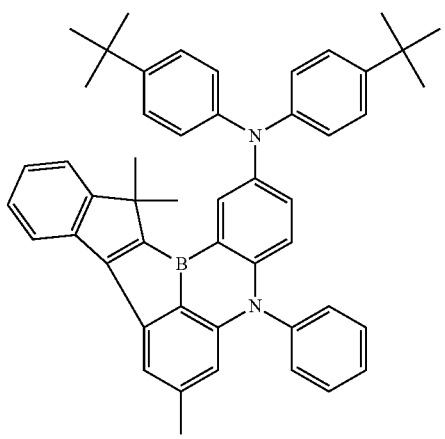
48
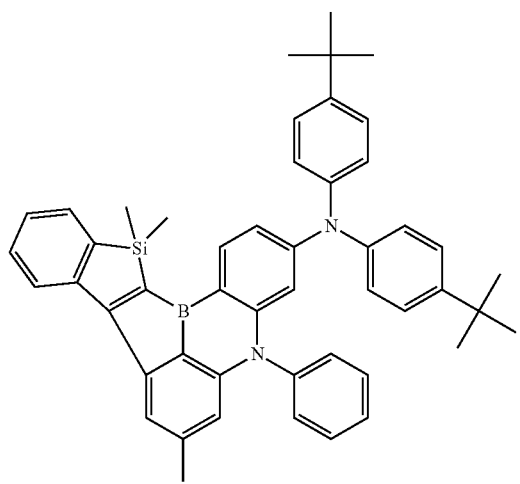

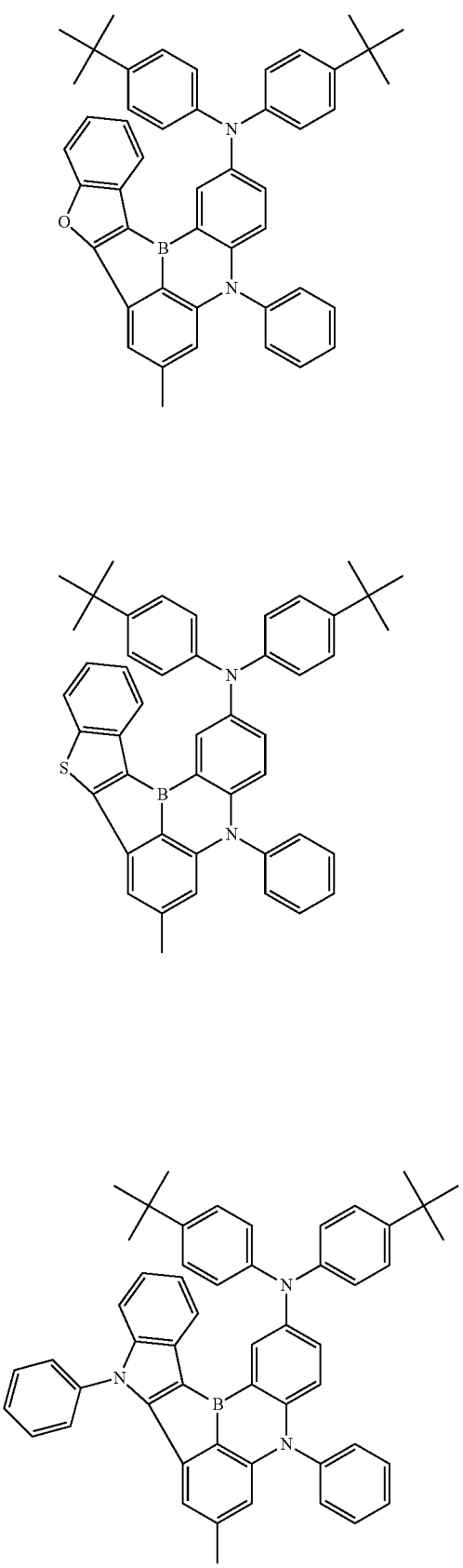
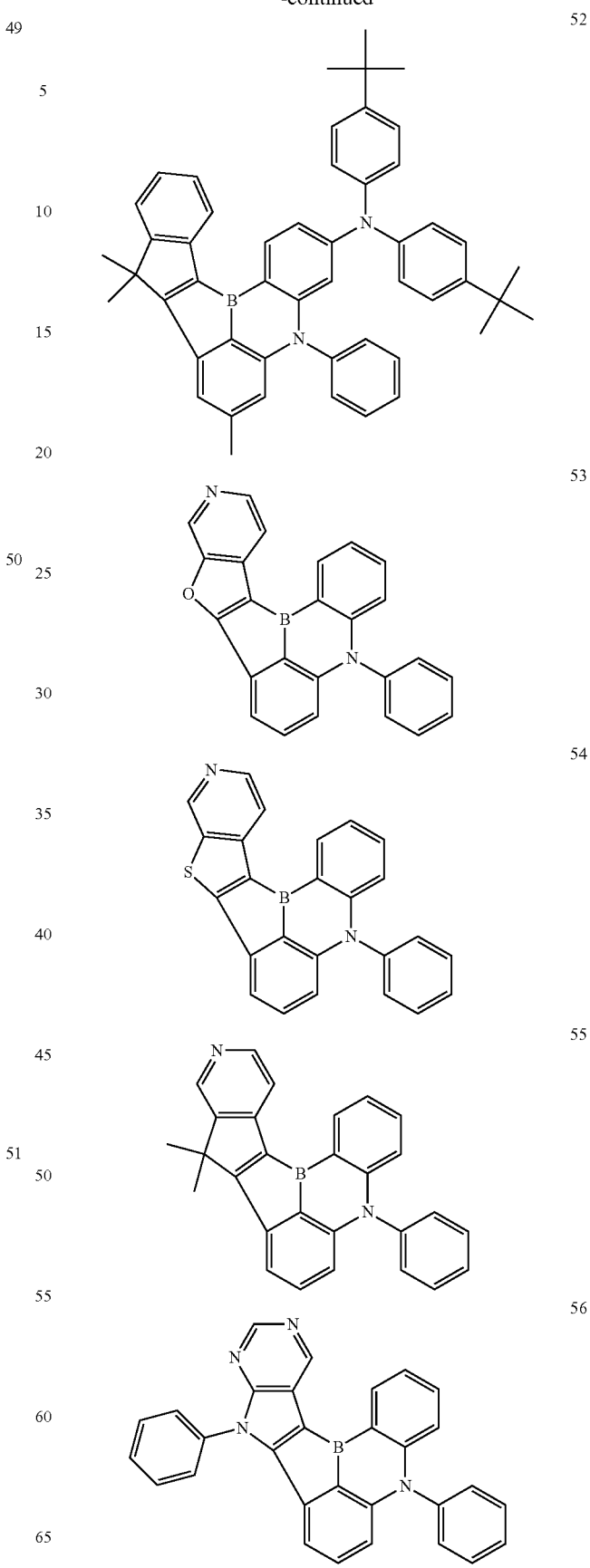

57
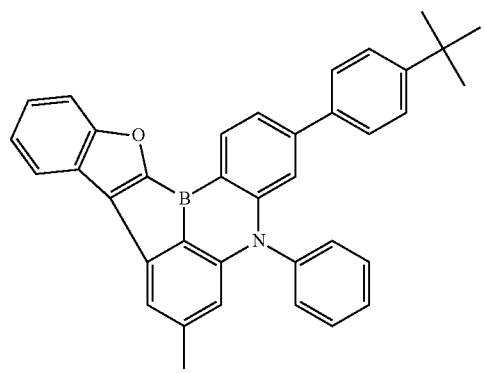
58
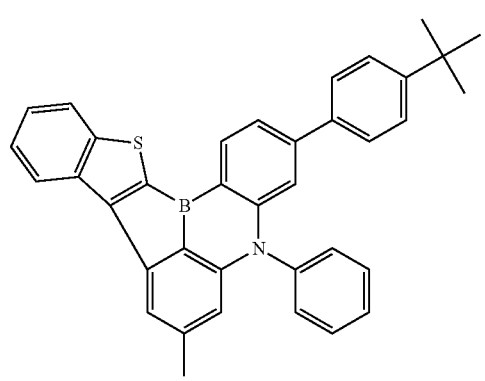
59
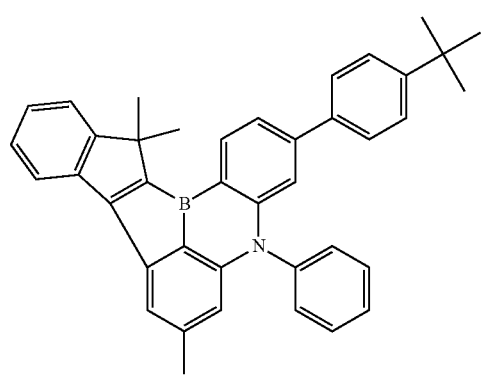
60
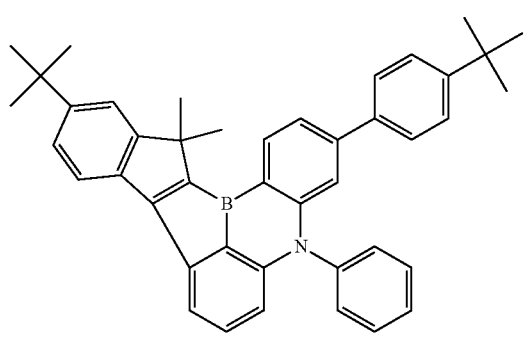
61
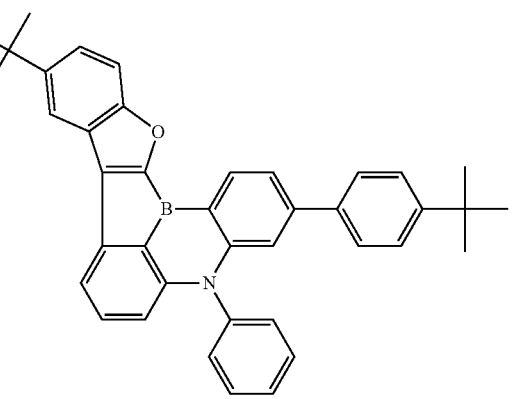
62
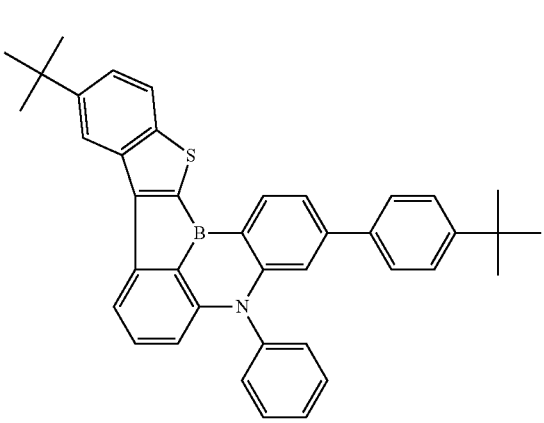
63
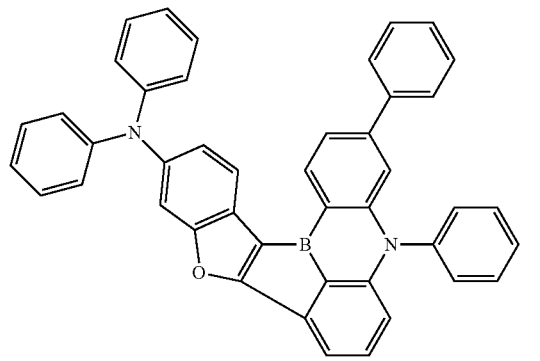
64
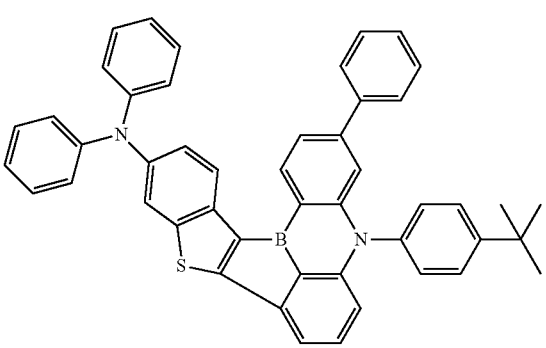

65
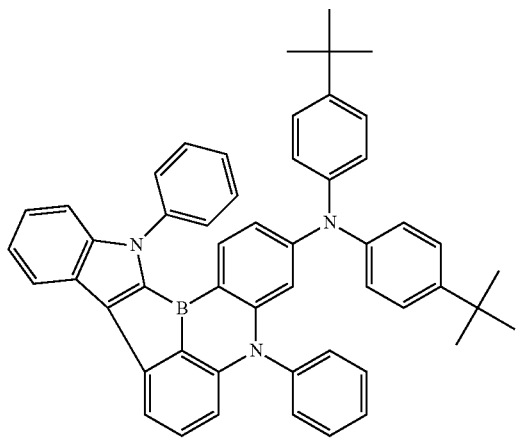
66
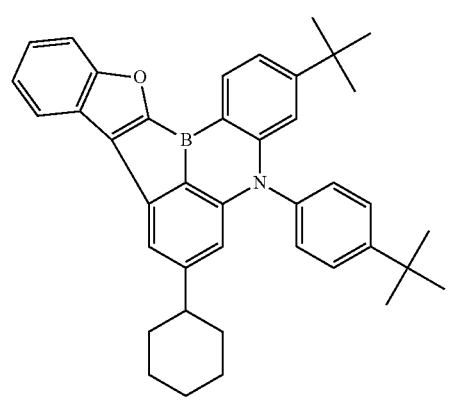
67
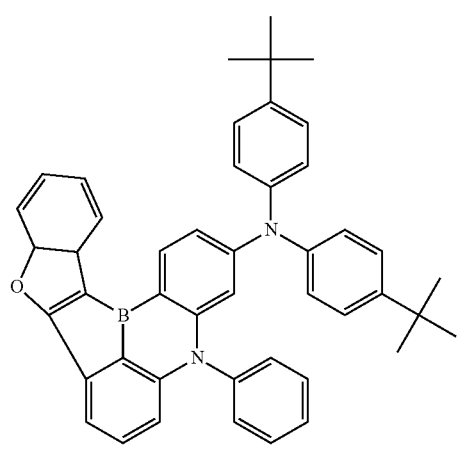
68
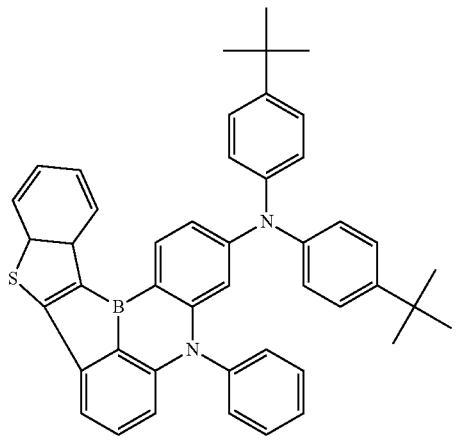
69
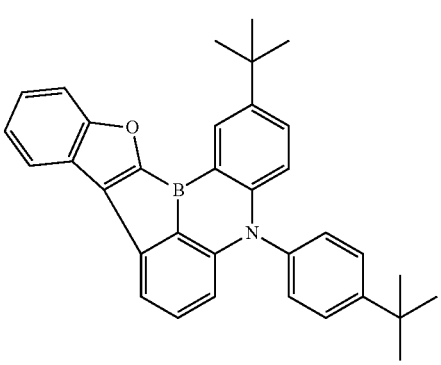
70
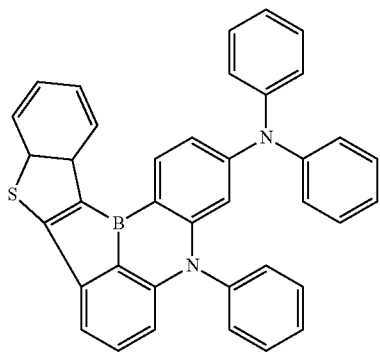
71
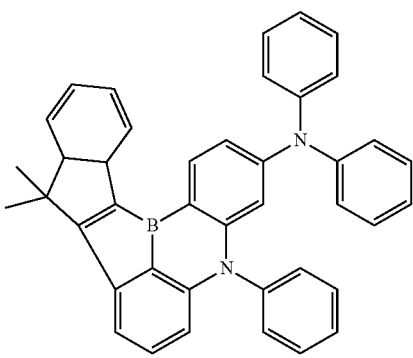

72
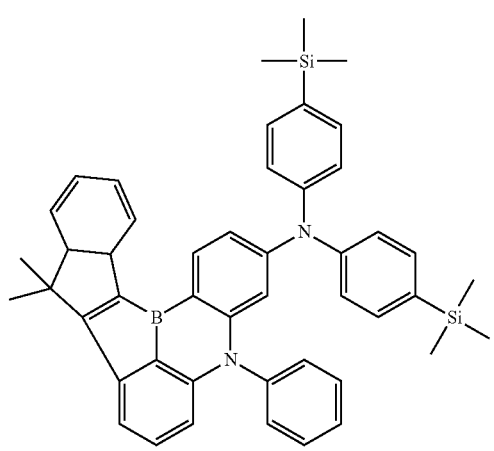
73
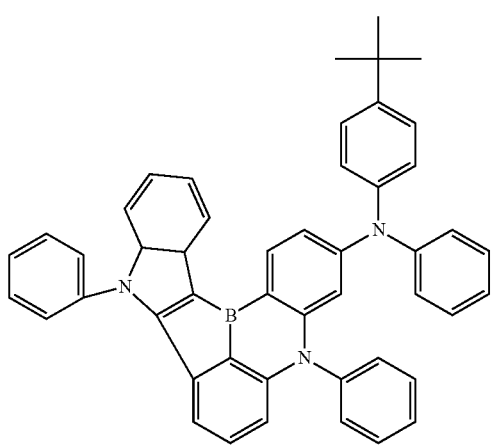
74
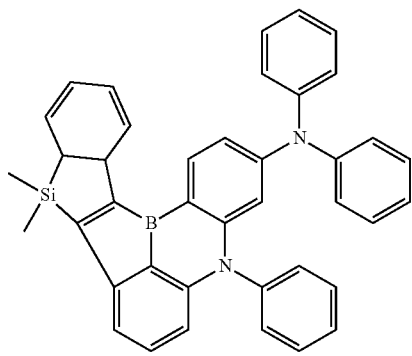
75
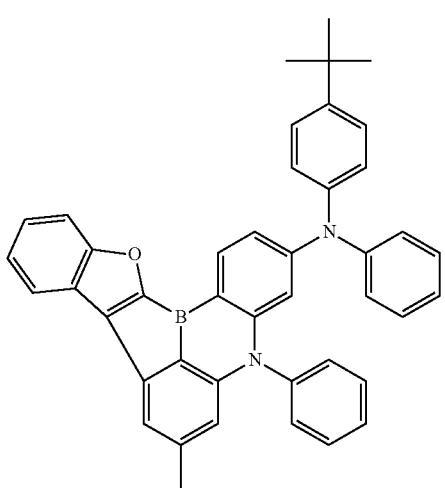
76
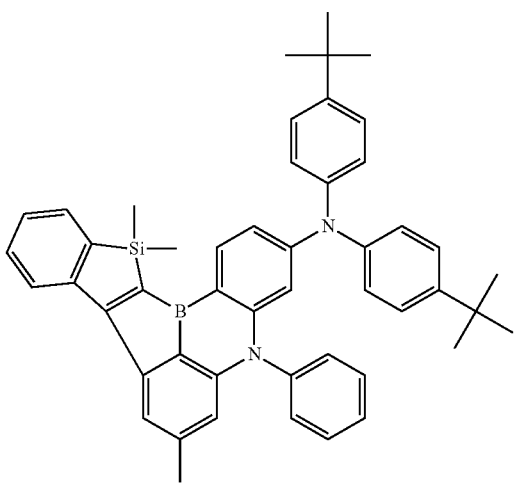
77
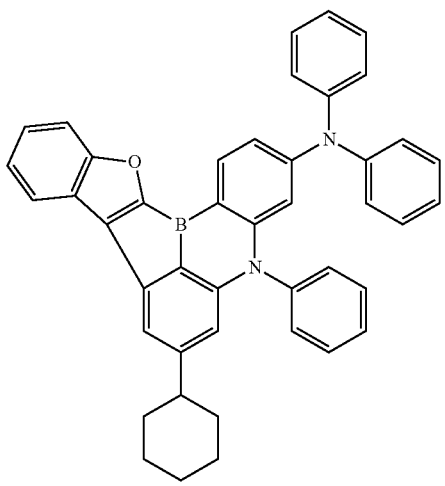

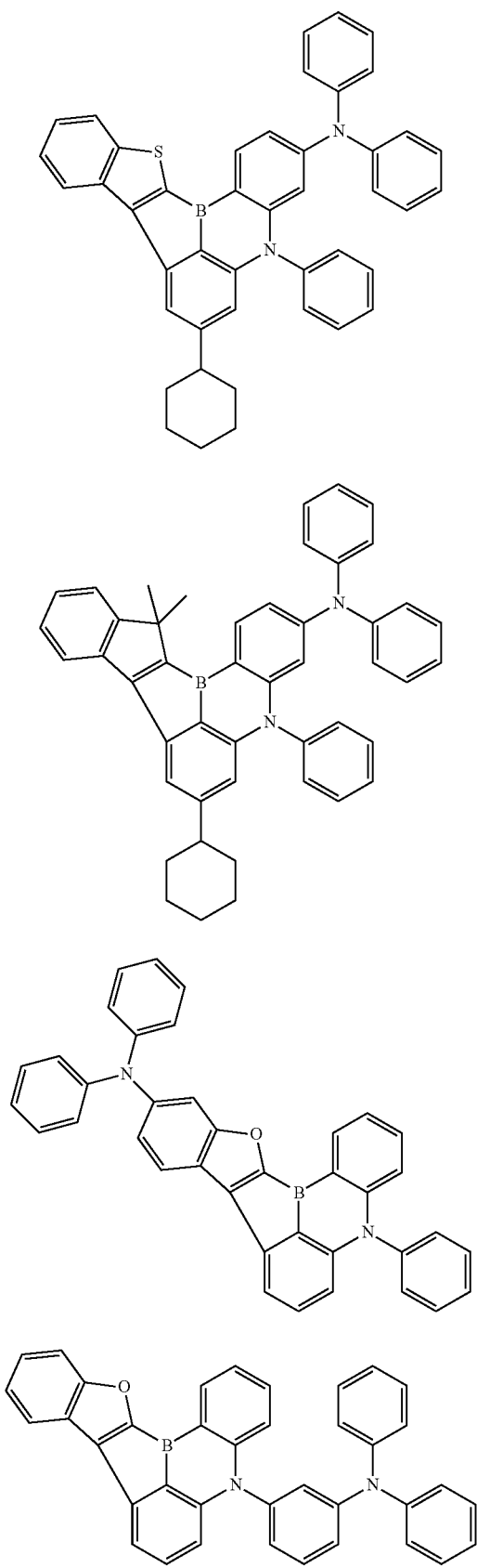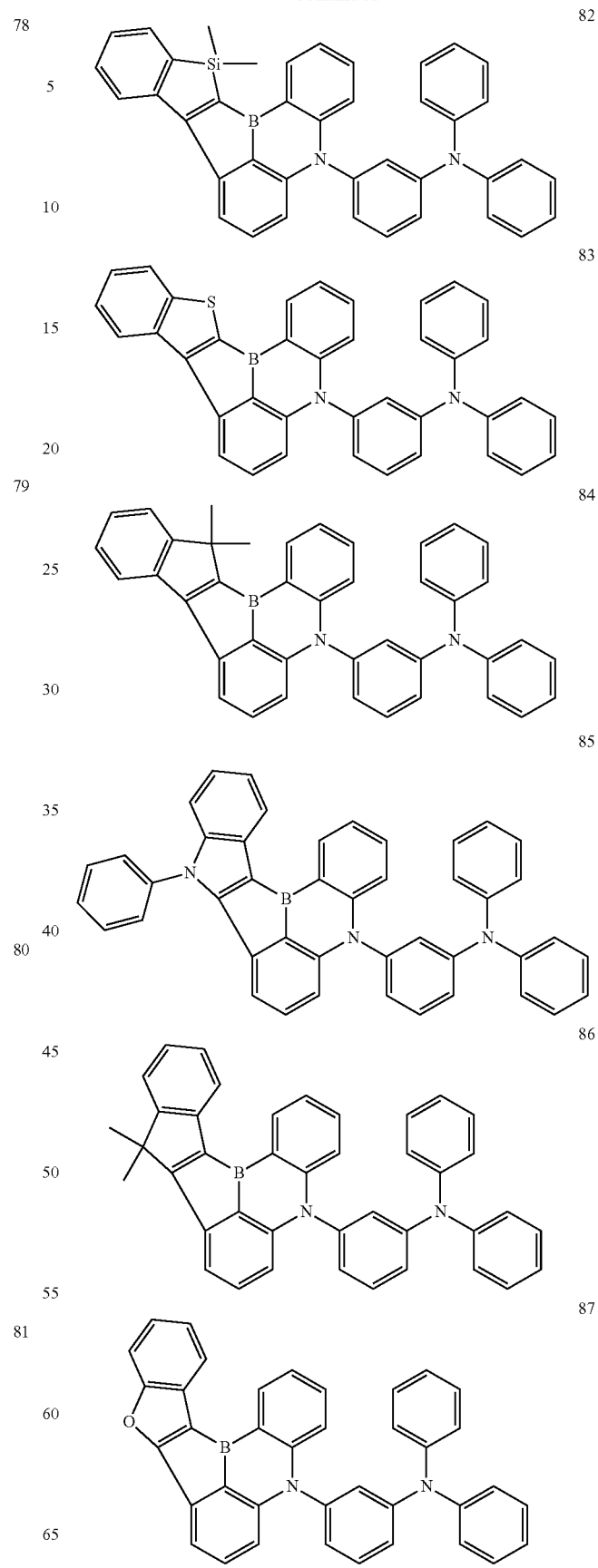

88
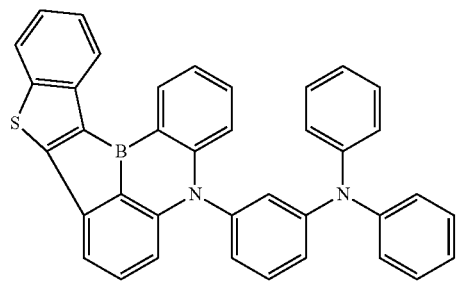
89
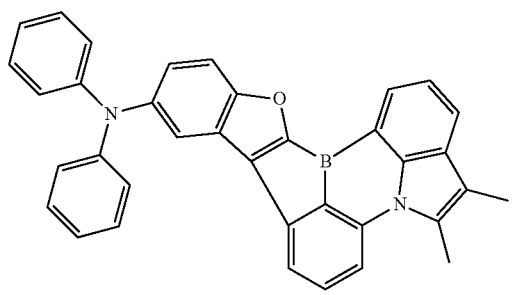
90
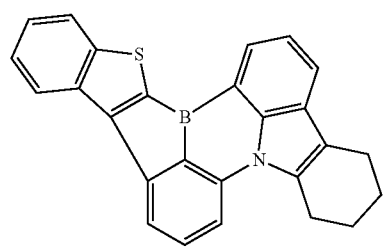
91
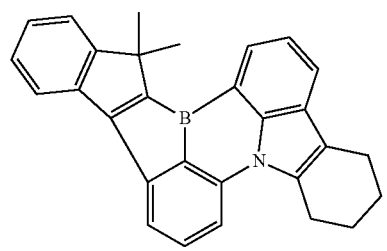
92
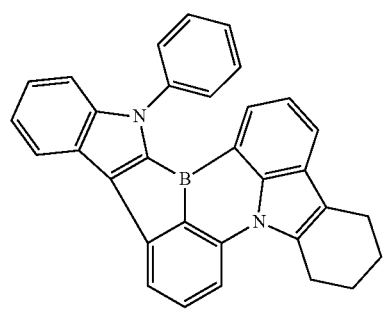
93
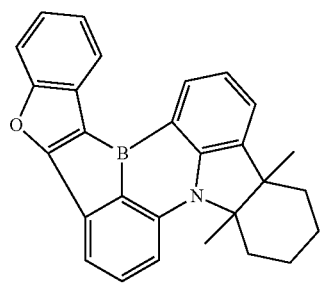
94
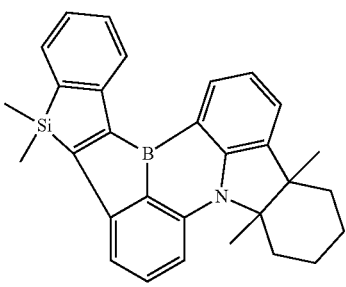
95
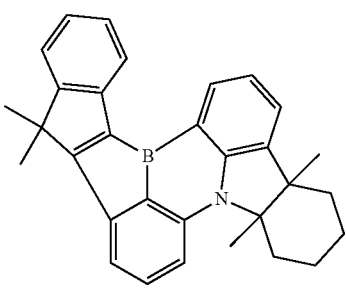
96
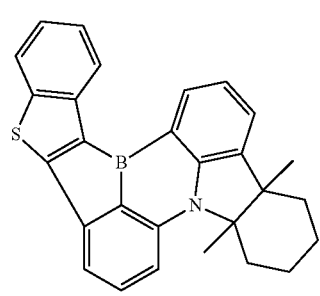
97
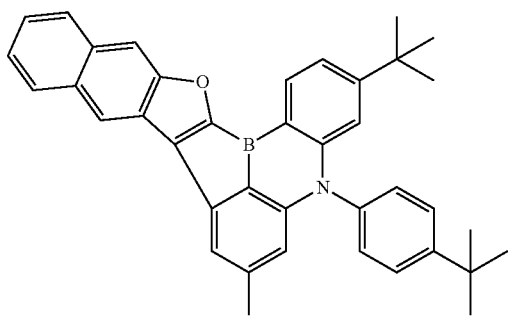

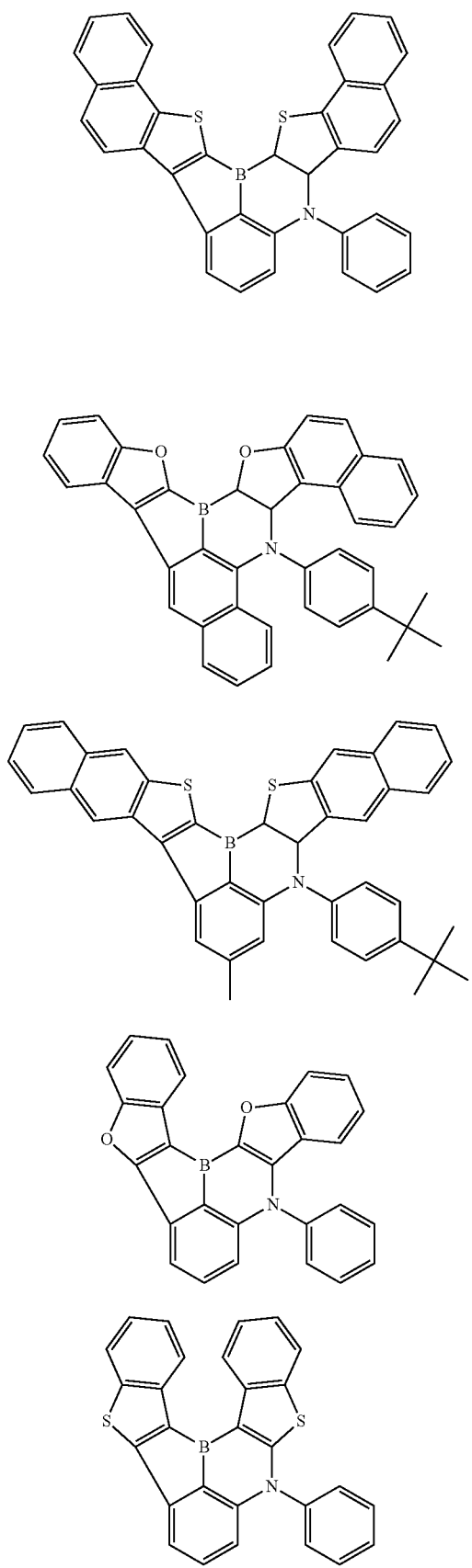
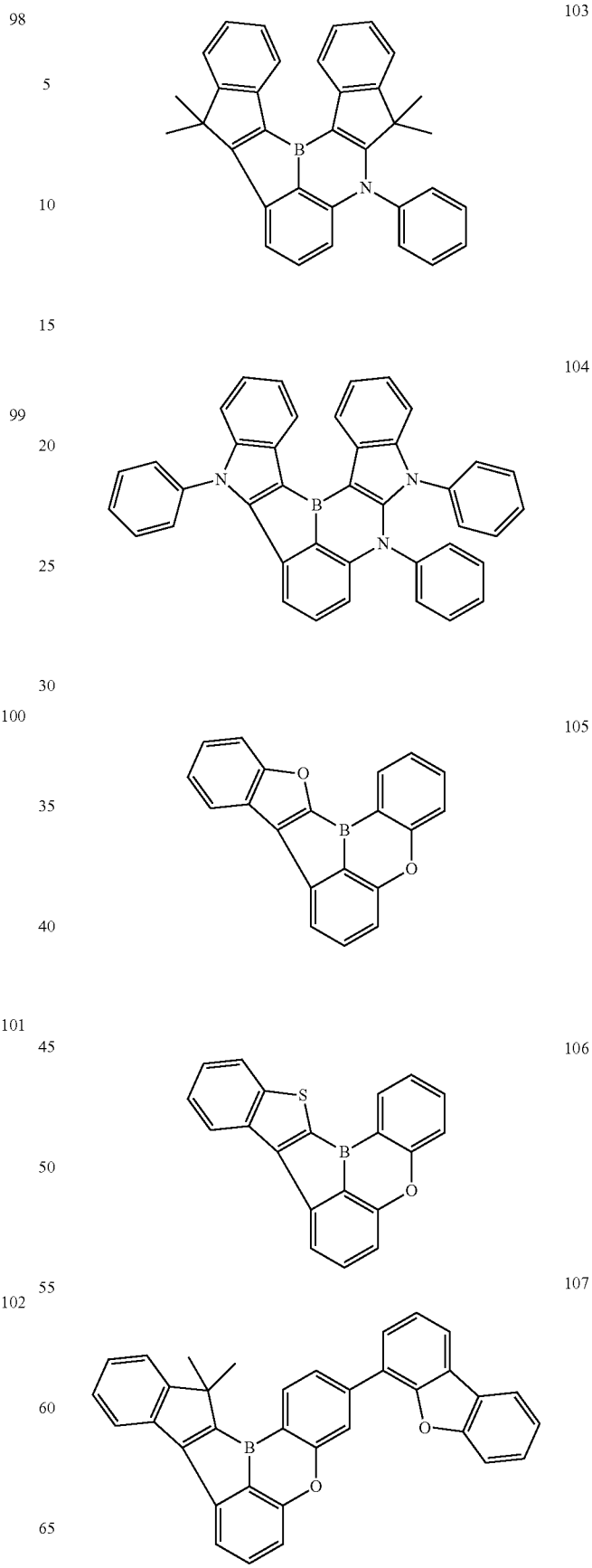

108
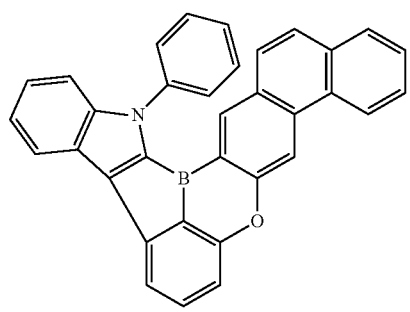
109
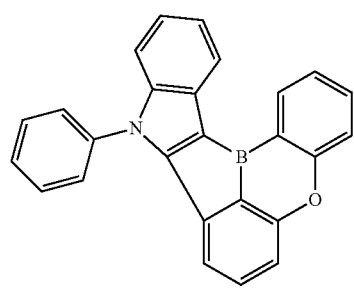
110
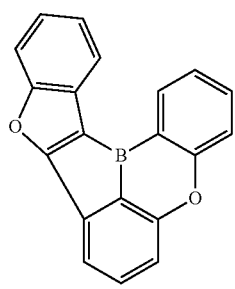
111
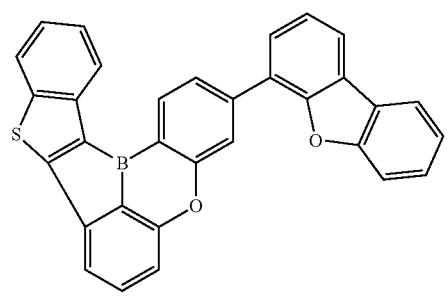
112
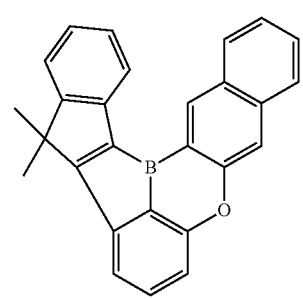
113
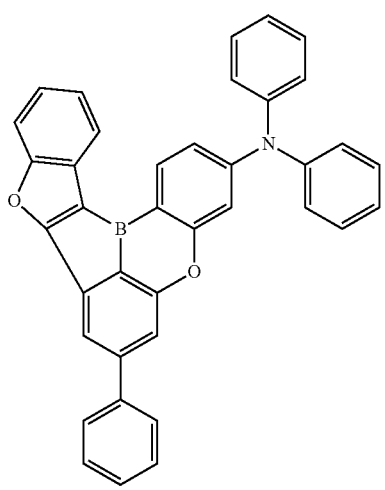
114
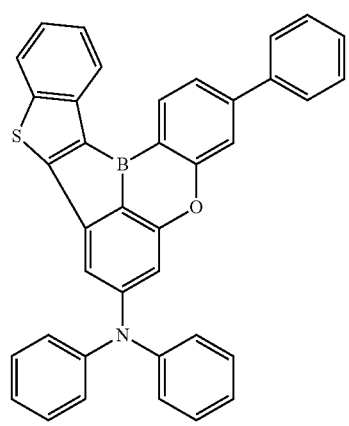
115
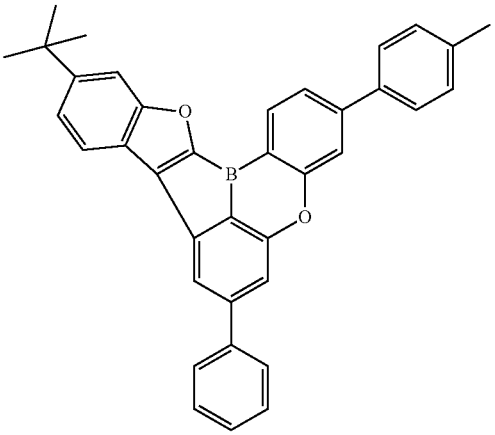

-continued
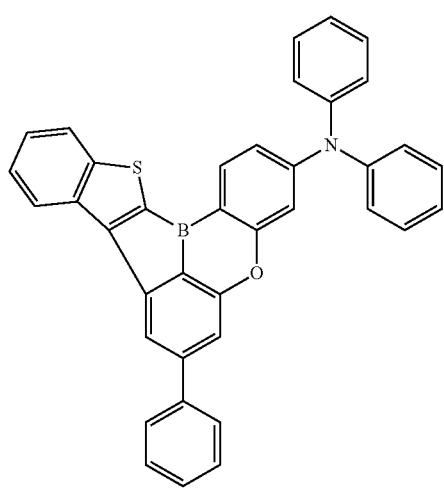
116
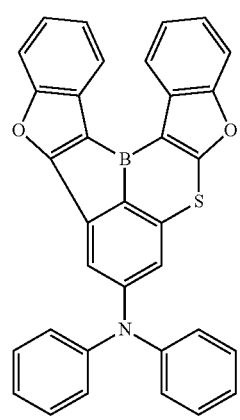
117
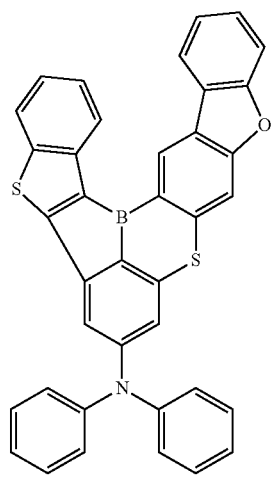
118
-continued
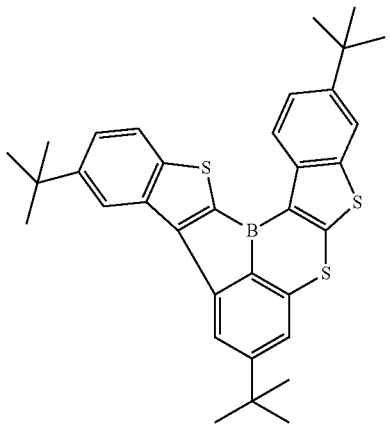
119
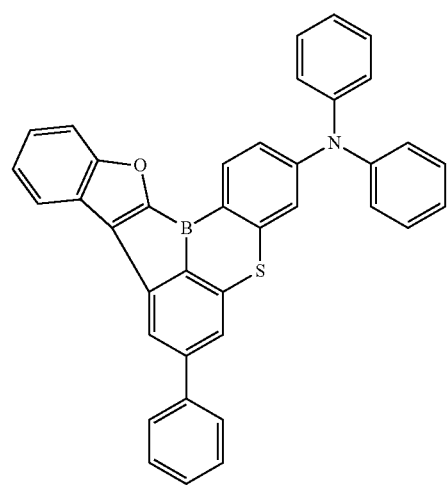
120
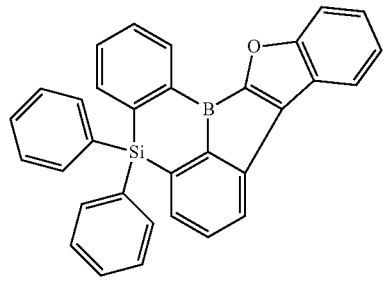
121
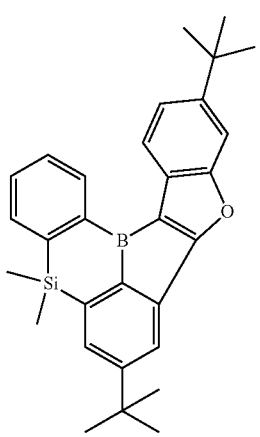
122

123
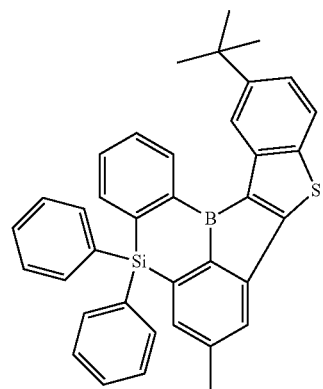
124
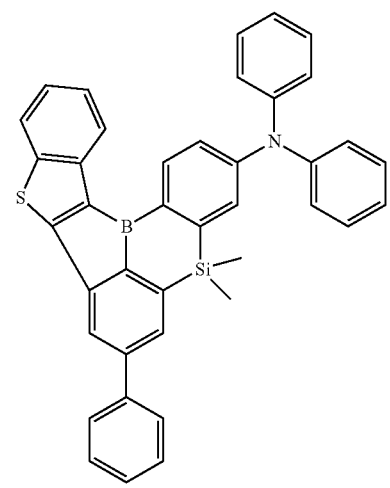
125
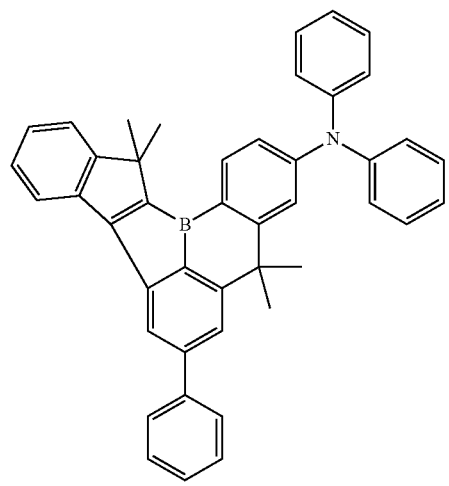
126
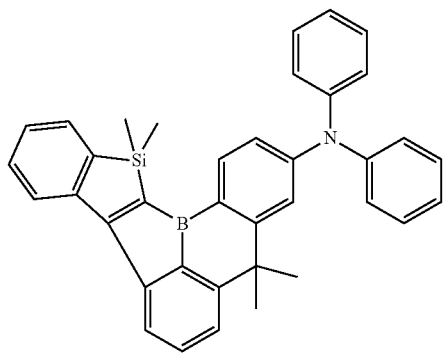
127
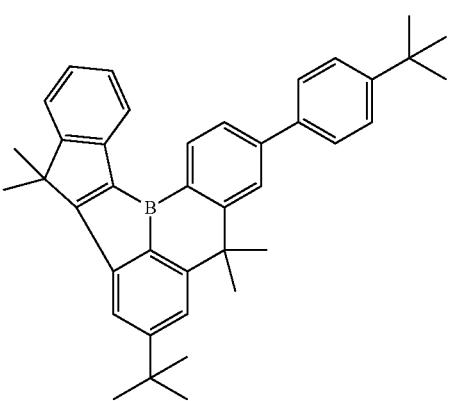
128
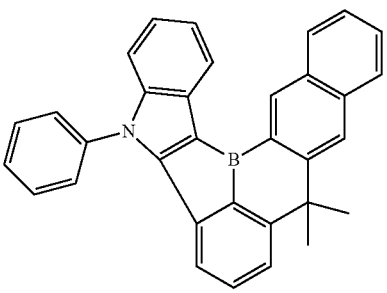
129
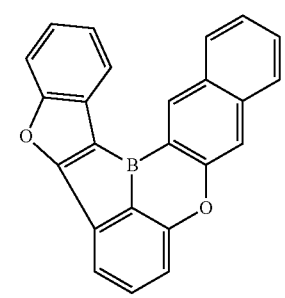

130
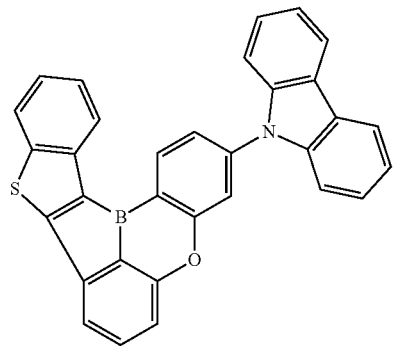
131
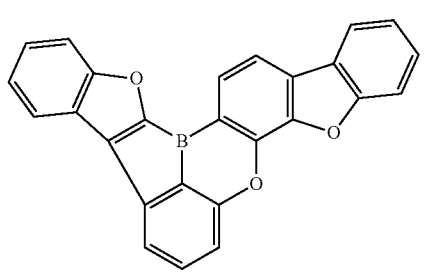
132
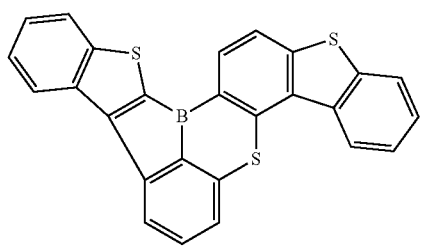
133
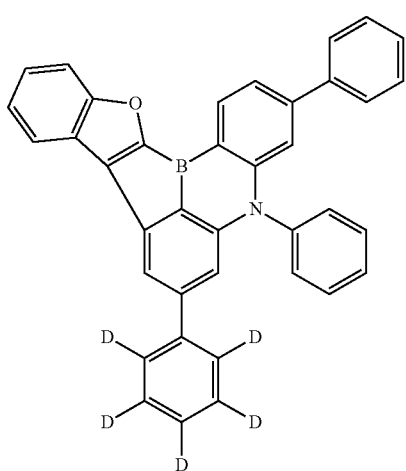
134
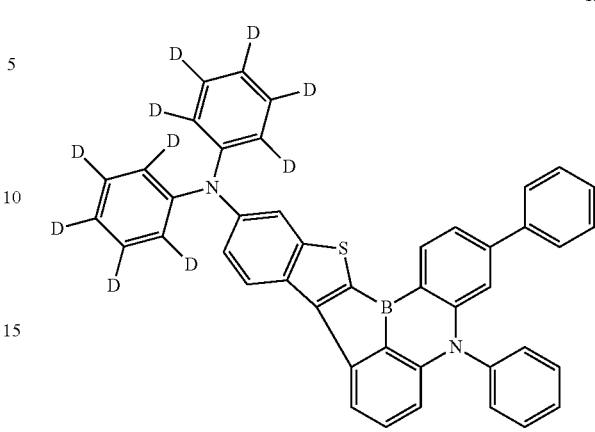
135
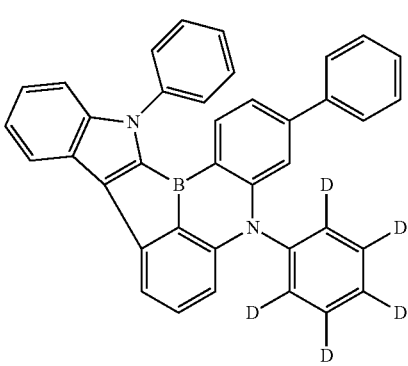
136
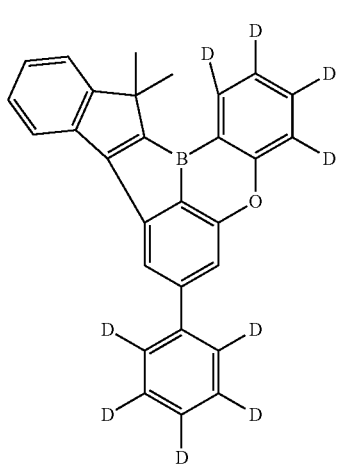

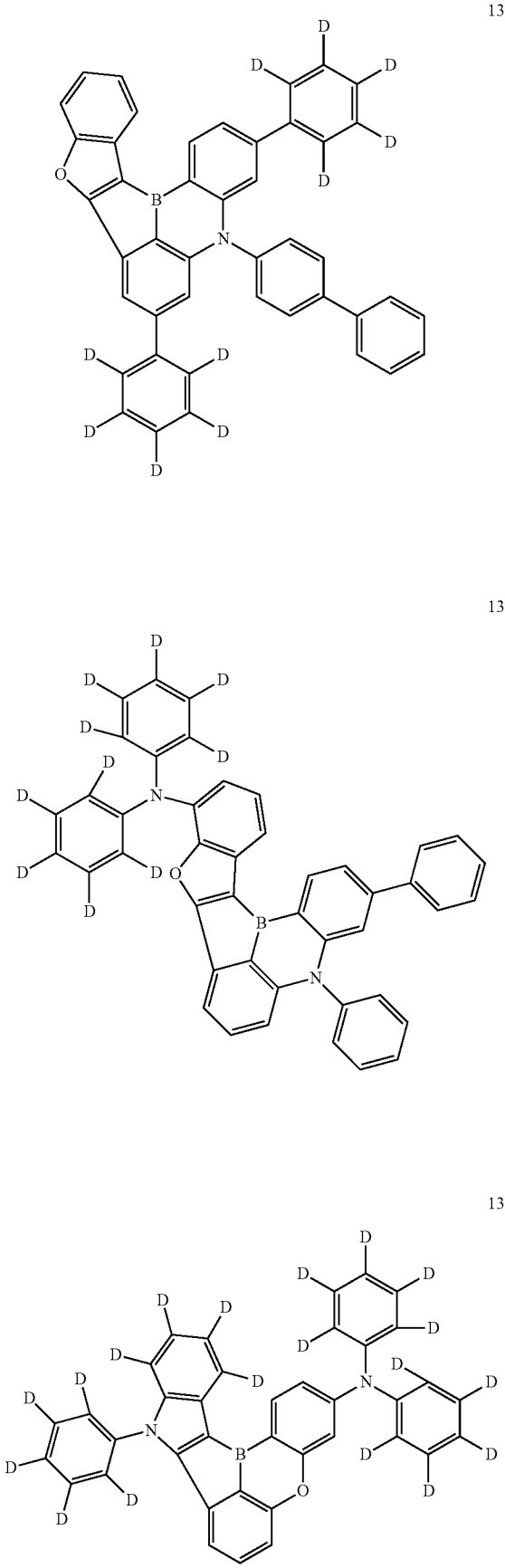
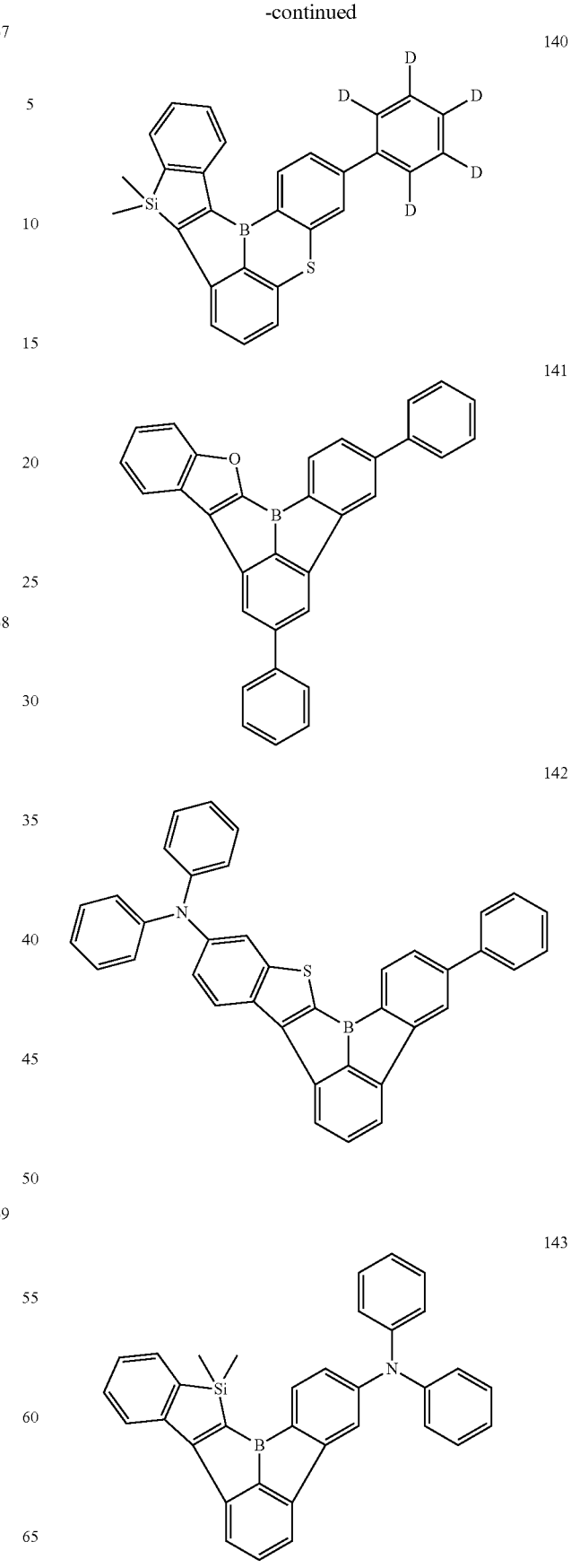

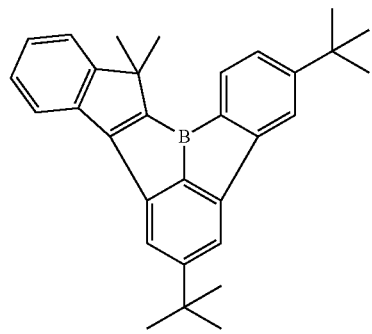
144
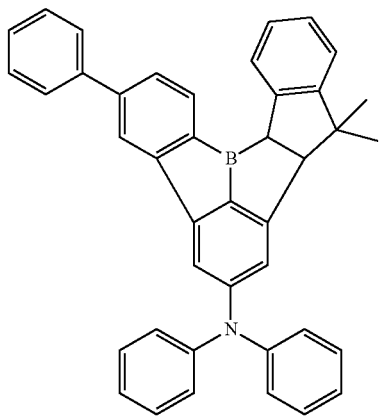
148
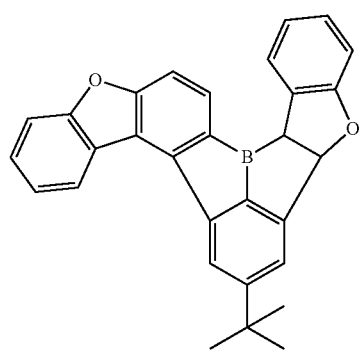
145
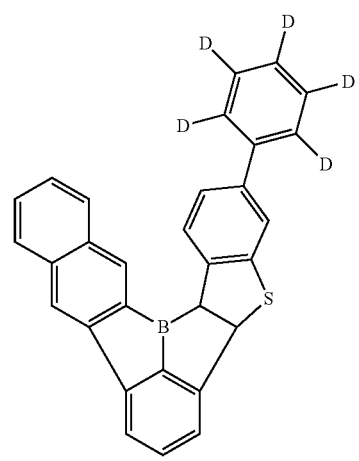
146
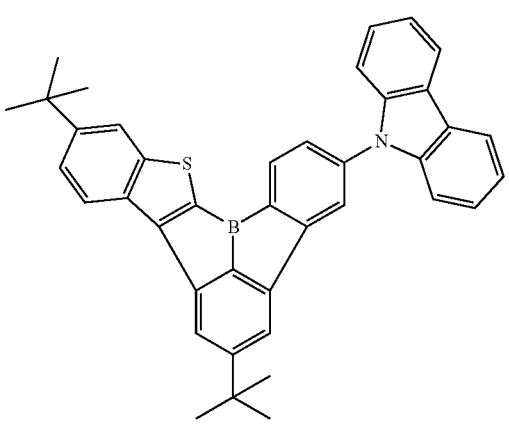
149
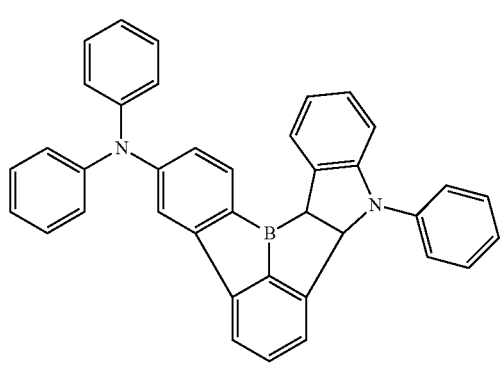
147
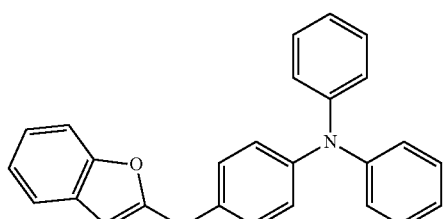
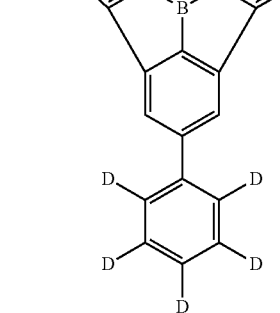
150

151

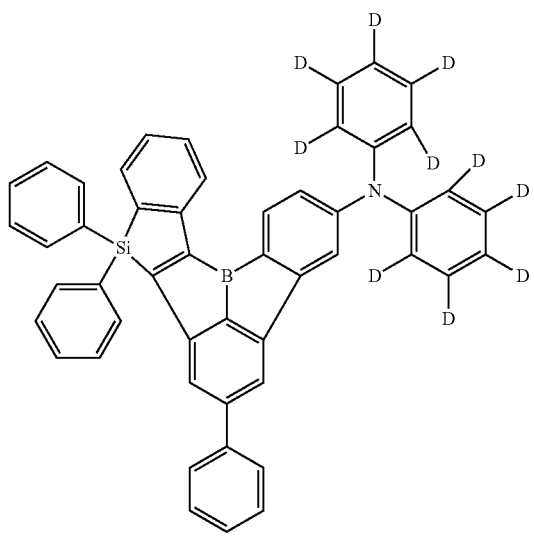

152

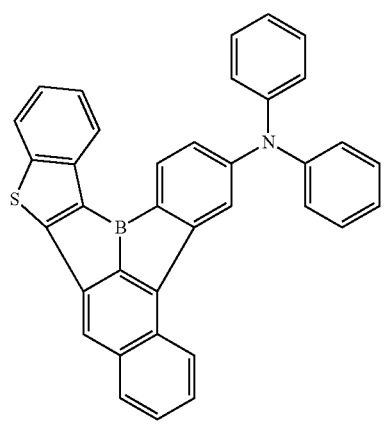

The present invention is also directed to an organic electroluminescent device including a first electrode, a second electrode, and one or more organic layers interposed between the first and second electrodes wherein one of the organic layers is a light emitting layer employing the compound represented by Formula A or B as a dopant.

The light emitting layer of the organic electroluminescent device employs a combination of the compound represented by Formula A or B as a dopant and an anthracene derivative represented by Formula H1:

[Formula H1]

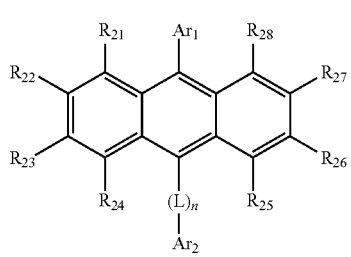

wherein $R_{21}$ to $R_{28}$ are identical to or different from each other and are each independently selected from the group consisting of hydrogen, deuterium, substituted or unsubstituted $C_1$-$C_{30}$ alkyl, substituted or unsubstituted $C_2$-$C_{30}$ alkenyl, substituted or unsubstituted $C_3$-$C_{30}$ cycloalkyl, substituted or unsubstituted $C_5$-$C_{30}$ cycloalkenyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_6$-$C_{50}$ aryl, substituted or unsubstituted $C_2$-$C_{50}$ heteroaryl, substituted or unsubstituted silicon, substituted or unsubstituted boron, substituted or unsubstituted silane, carbonyl, phosphoryl, amino, nitrile, hydroxyl, nitro, halogen, amide, and ester, with the proviso that $R_{21}$ to $R_{28}$ are optionally bonded to each other to form a fused aliphatic, aromatic, heteroaliphatic or heteroaromatic ring or each of $R_{21}$ to $R_{28}$ is optionally linked to an adjacent substituent to form a fused aliphatic, aromatic, heteroaliphatic or heteroaromatic ring, $Ar_1$ and $Ar_2$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{39}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{39}$ arylamine, substituted or unsubstituted $C_1$-$C_{30}$ alkylsilyl, and substituted or unsubstituted $C_6$-$C_{30}$ arylsilyl, L is a single bond or is substituted or unsubstituted $C_6$-$C_{29}$ arylene or substituted or unsubstituted $C_2$-$C_{20}$ heteroarylene, and n is an integer from 0 to 3, or Formula H2:

[Formula H2]

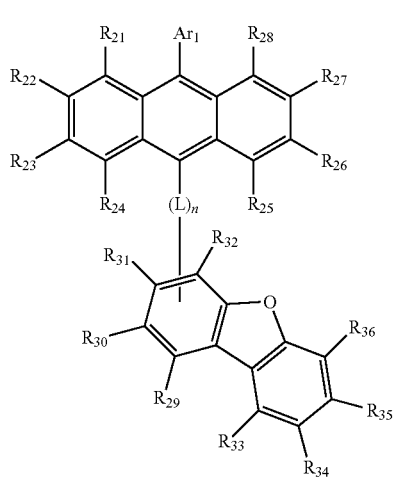

wherein $R_{21}$ to $R_{36}$ are identical to or different from each other and are each independently selected from the group consisting of hydrogen, deuterium, substituted or unsubstituted $C_1$-$C_{30}$ alkyl, substituted or unsubstituted $C_2$-$C_{39}$ alkenyl, substituted or unsubstituted $C_3$-$C_{39}$ cycloalkyl, substituted or unsubstituted $C_5$-$C_{39}$ cycloalkenyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_6$-$C_{50}$ aryl, substituted or unsubstituted $C_2$-$C_{59}$ heteroaryl, substituted or unsubstituted silicon, substituted or unsubstituted boron, substituted or unsubstituted silane, carbonyl, phosphoryl, amino, nitrile, hydroxyl, nitro, halogen, amide, and ester, with the proviso that one of $R_{29}$ to $R_{32}$ is bonded to L and that $R_{21}$ to $R_{36}$ are optionally bonded to each other to form a fused aliphatic, aromatic, heteroaliphatic or heteroaromatic ring or each of $R_{21}$ to $R_{36}$ is optionally linked to an adjacent substituent to form a fused aliphatic, aromatic, heteroaliphatic or heteroaromatic ring, $Ar_1$ is selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, L is a single bond or is substituted or unsubstituted $C_6$-$C_{20}$ arylene or substituted or unsubstituted $C_2$-$C_{20}$ heteroarylene, and n is an integer from 0 to 3.

The anthracene derivative represented by Formula H1 or H2 is employed as a host in the light emitting layer.

According to one embodiment of the present invention, the anthracene derivative of Formula H1 may be selected from the following compounds H101 to H166:

H101

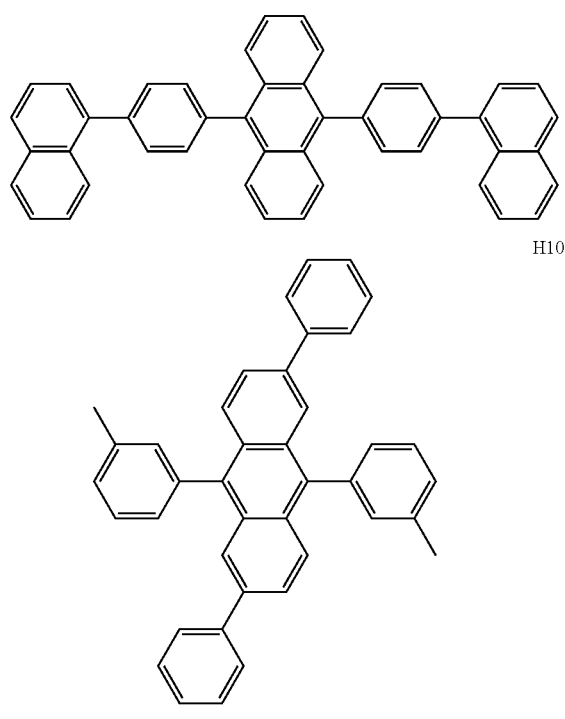

H102

H103

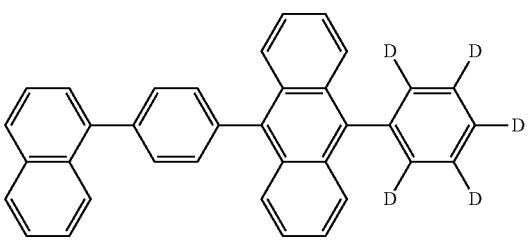

H104

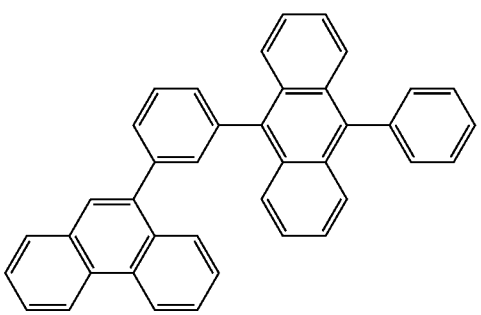

H105

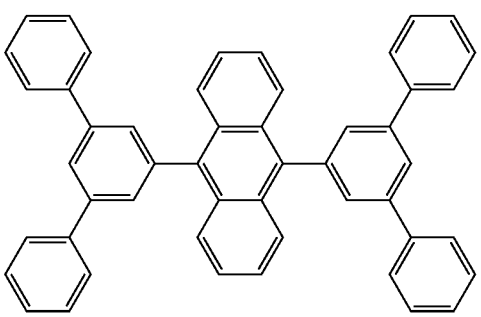

H106

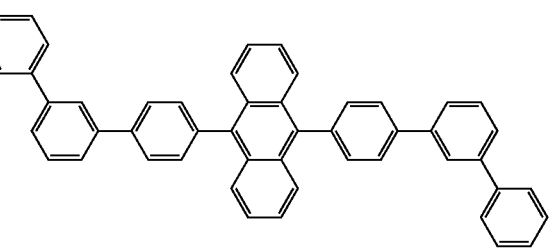

H107

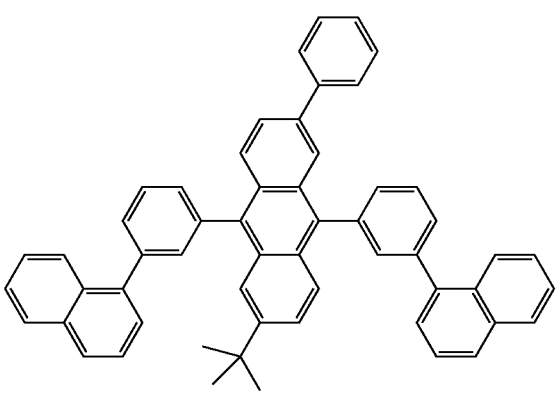

H108
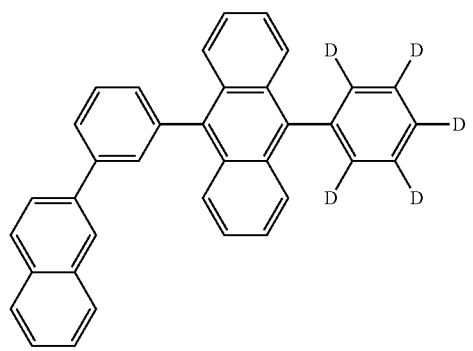
H109
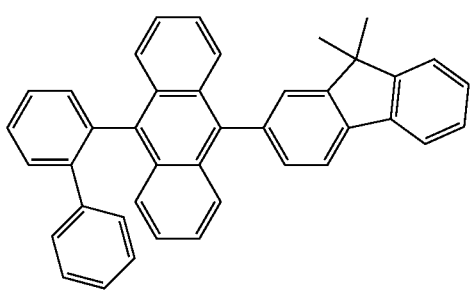
H110
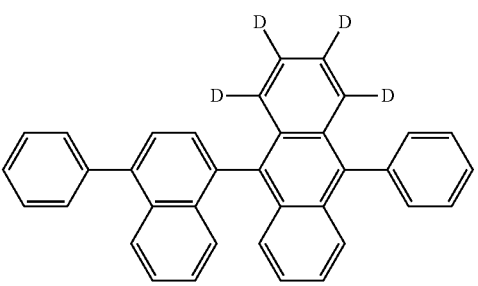
H111
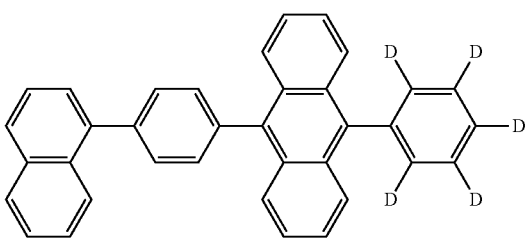
H112
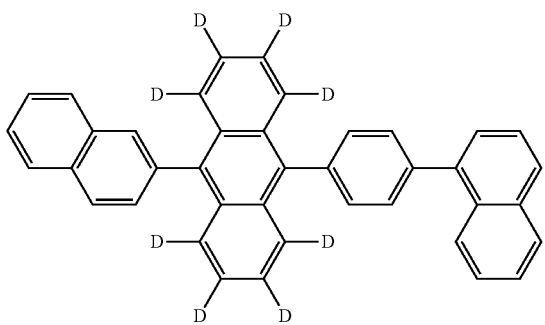
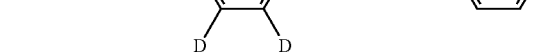
H113
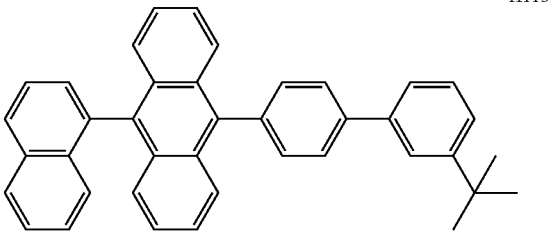
H114
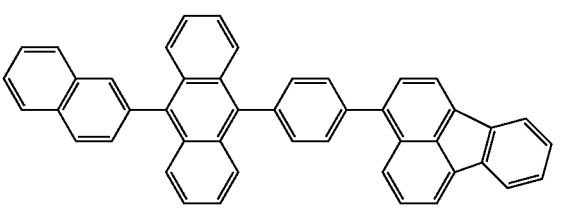
H115
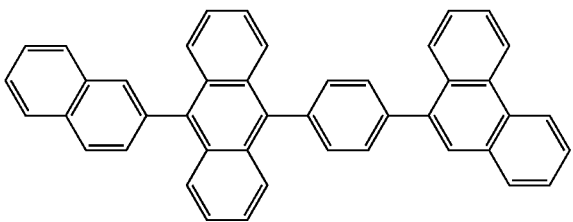
H116
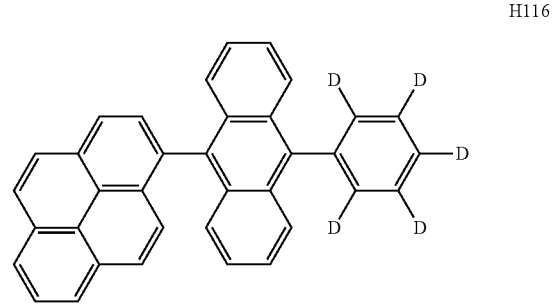
H117
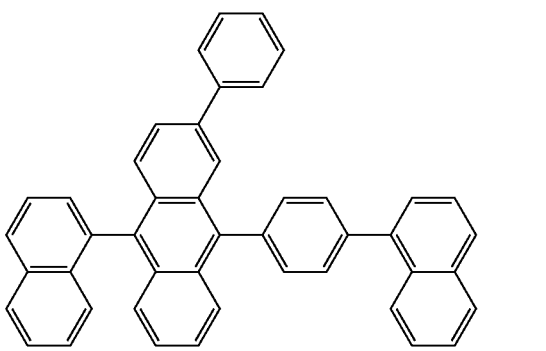
H118
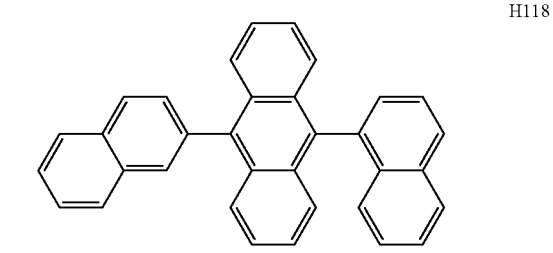

H119
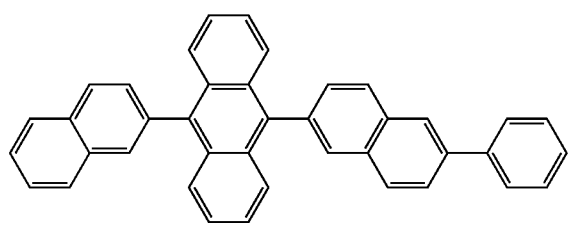
H120
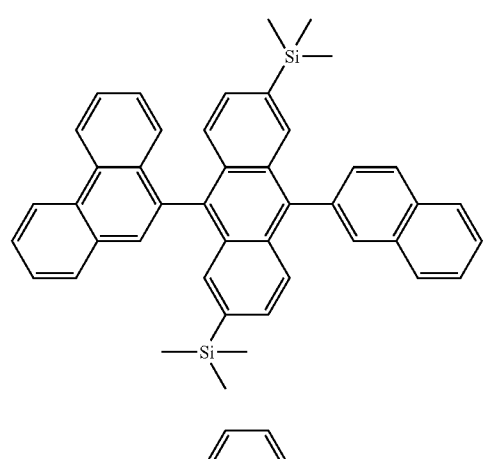
H121
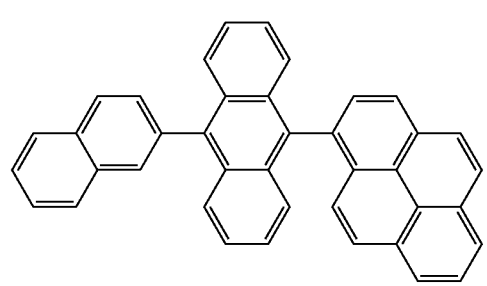
H122
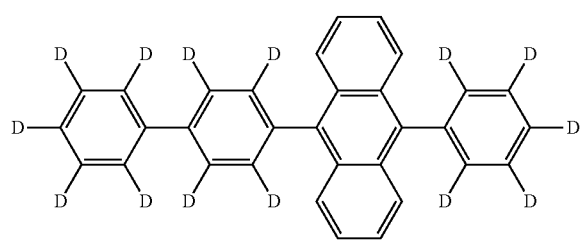
H123
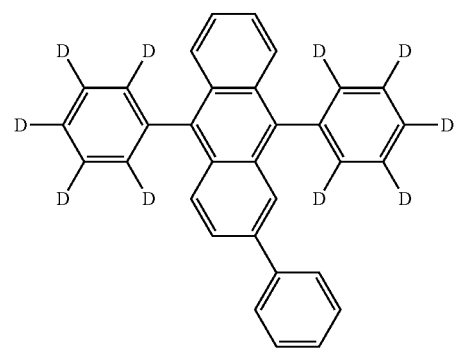
H124
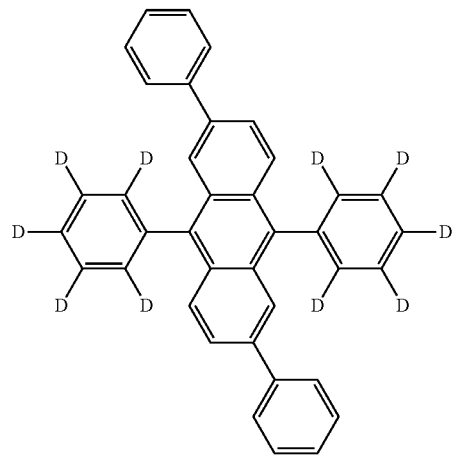
H125
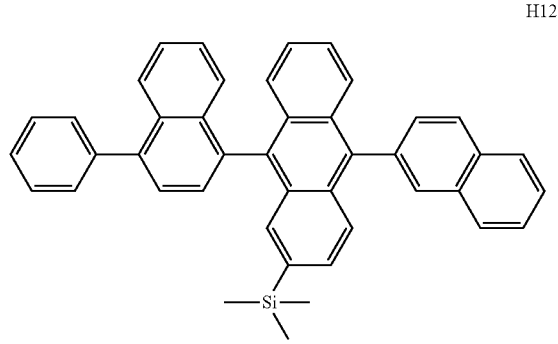
H126
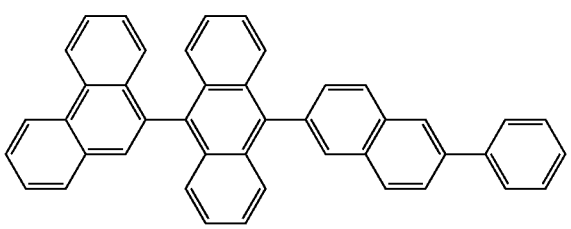
H127
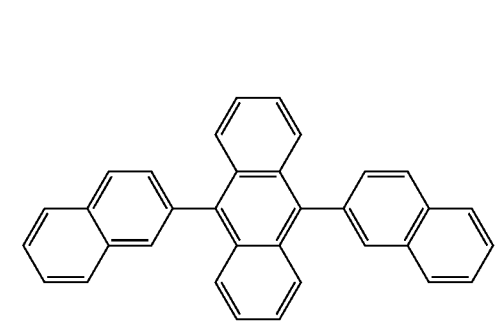

H128
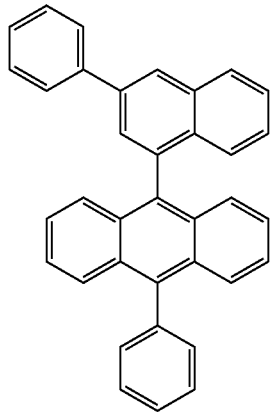
H129
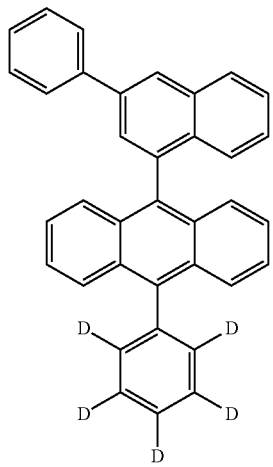
H130
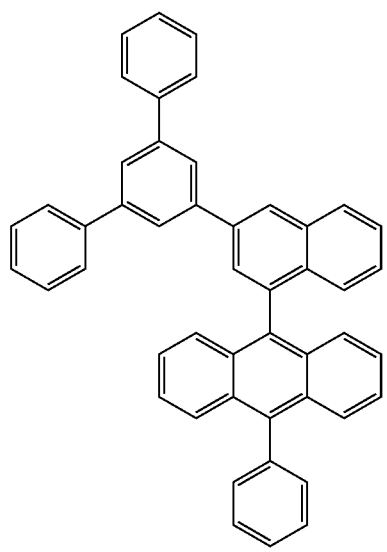
H131
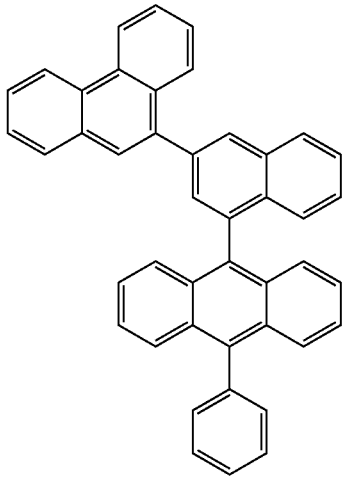
H132
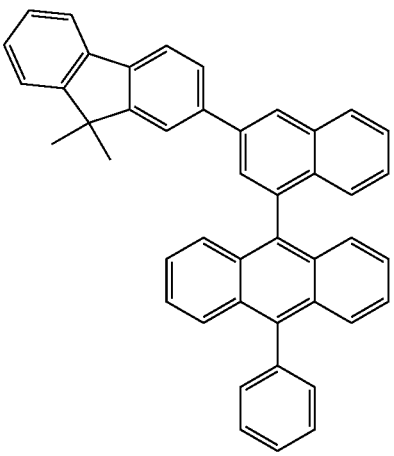
H133

H134
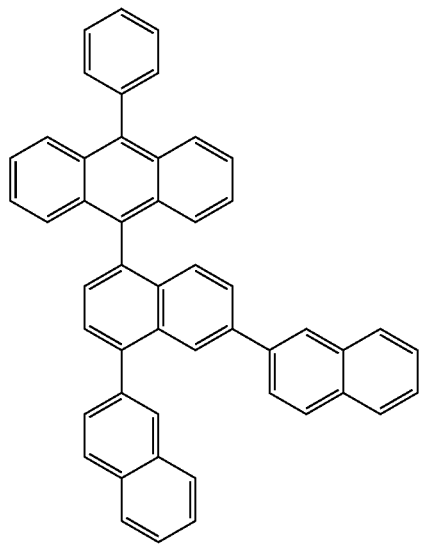
H135
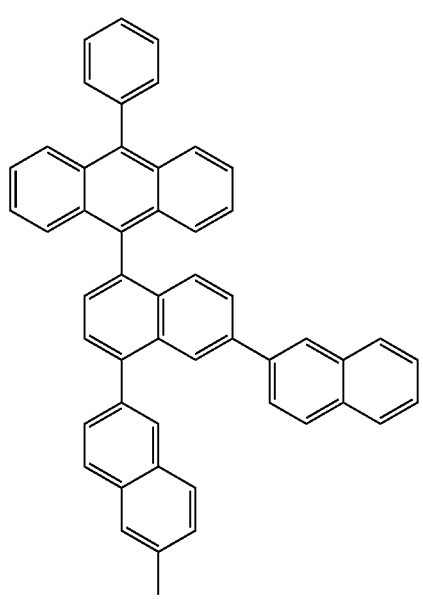
H136
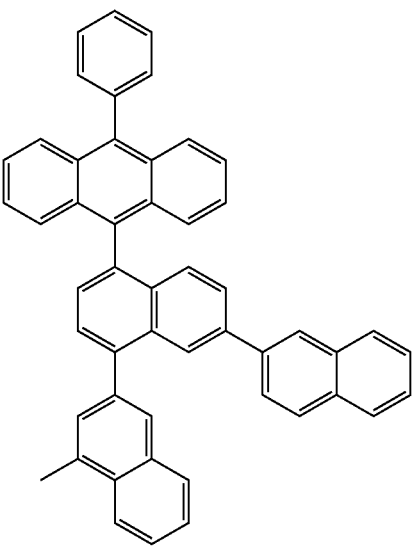
H137
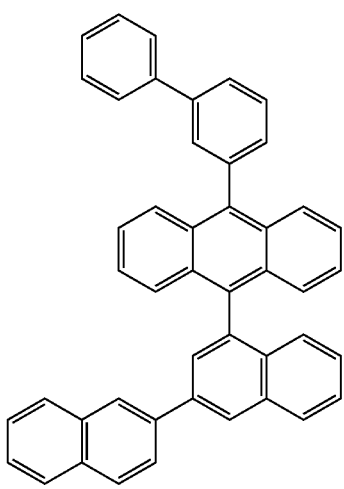
H138
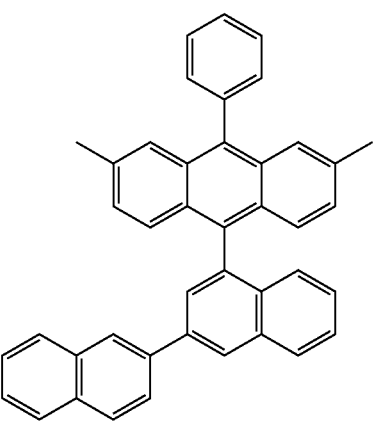

H139
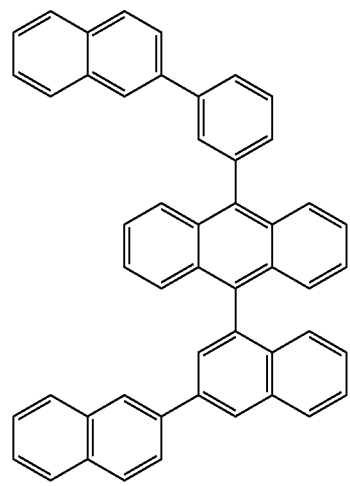
H140
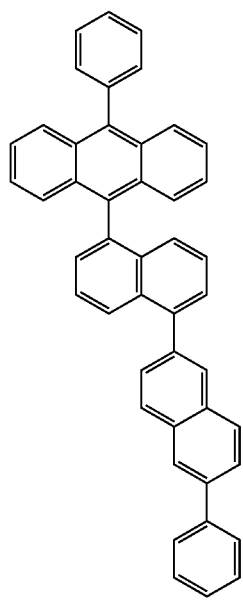 (note: H140 is the lower-left structure)
H141
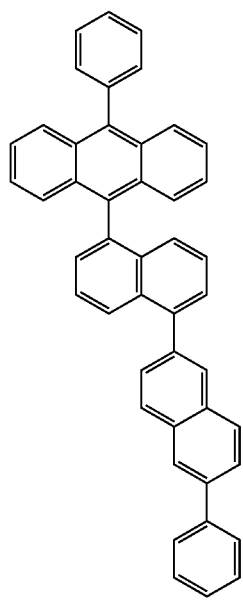
H142
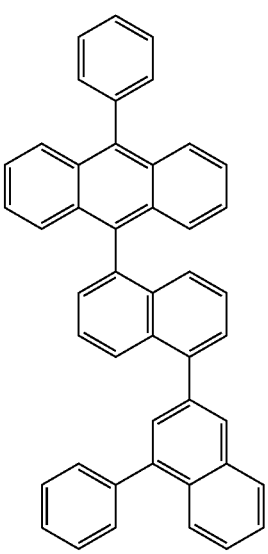

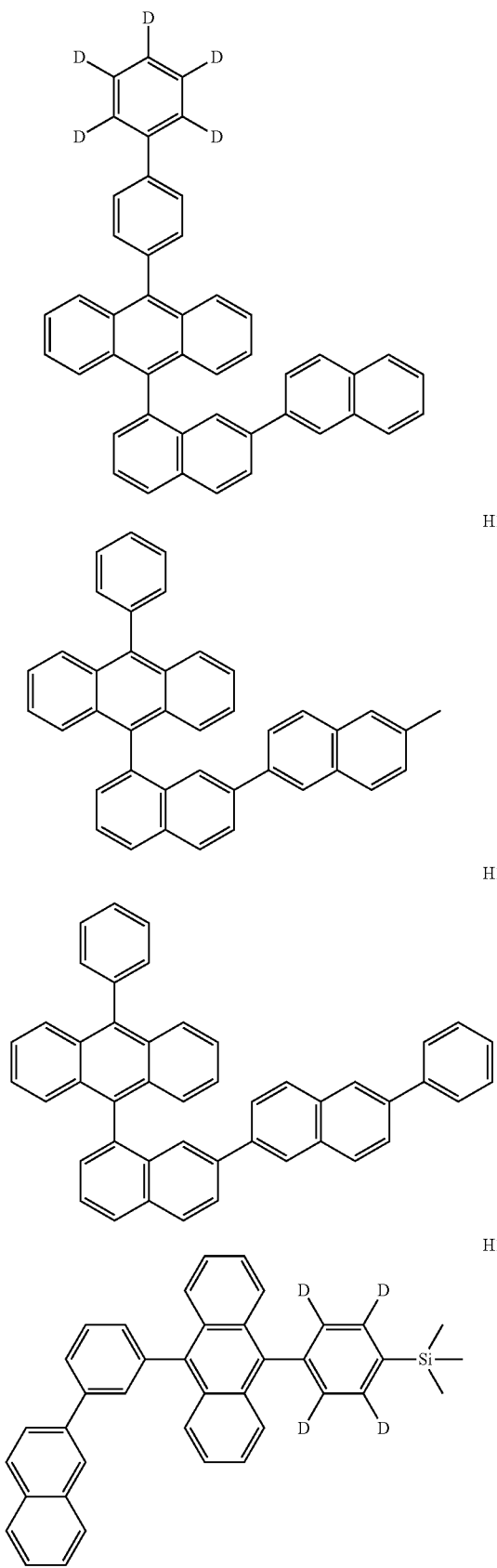
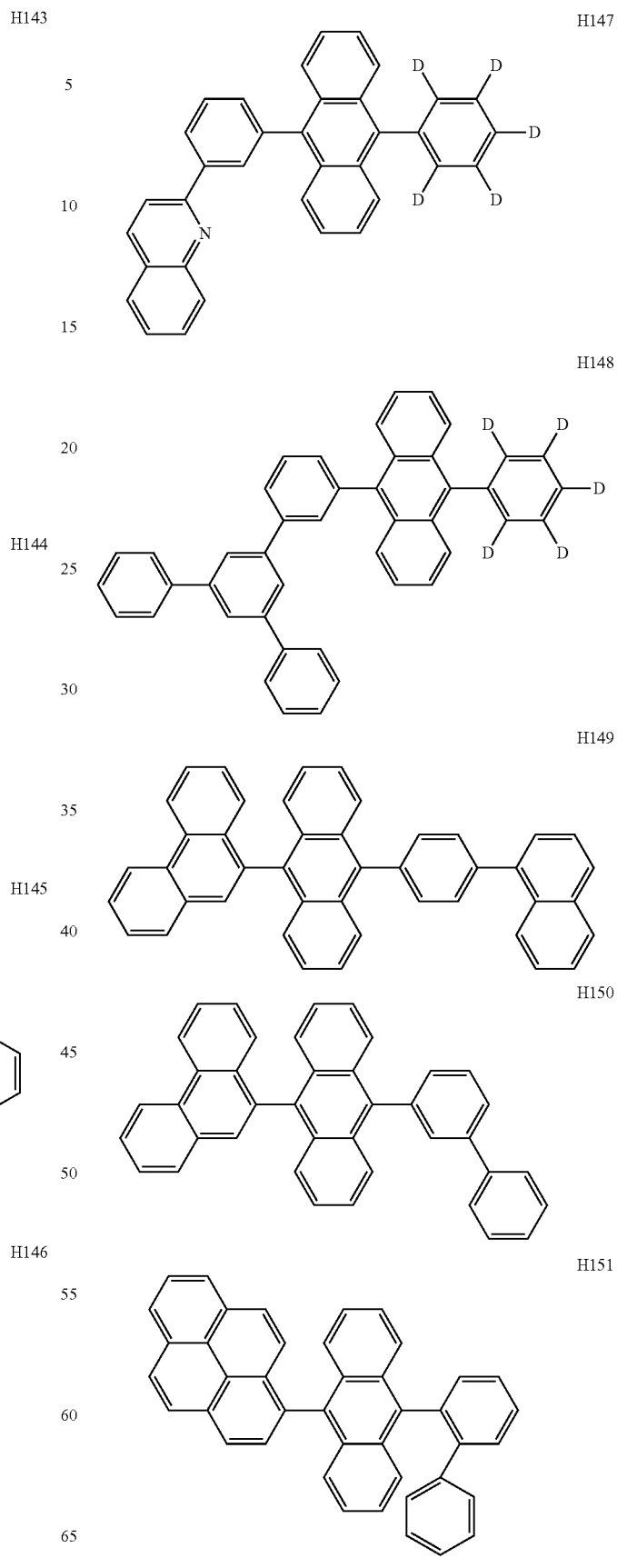

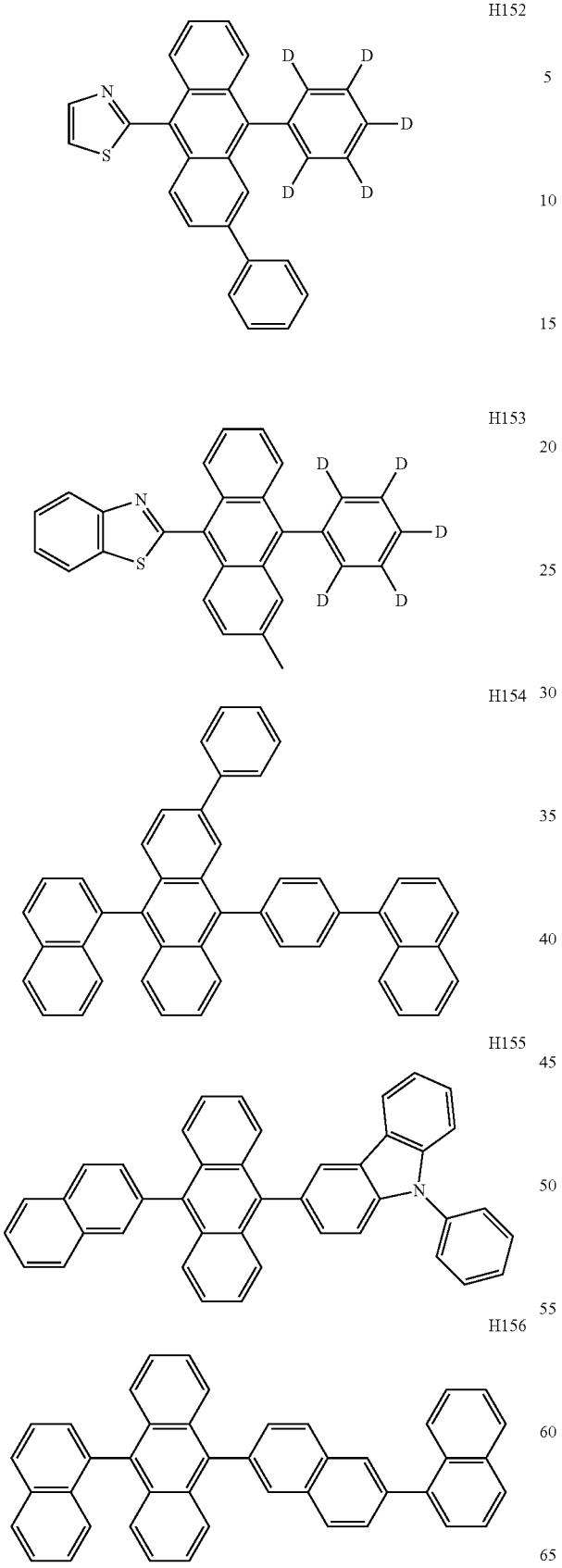
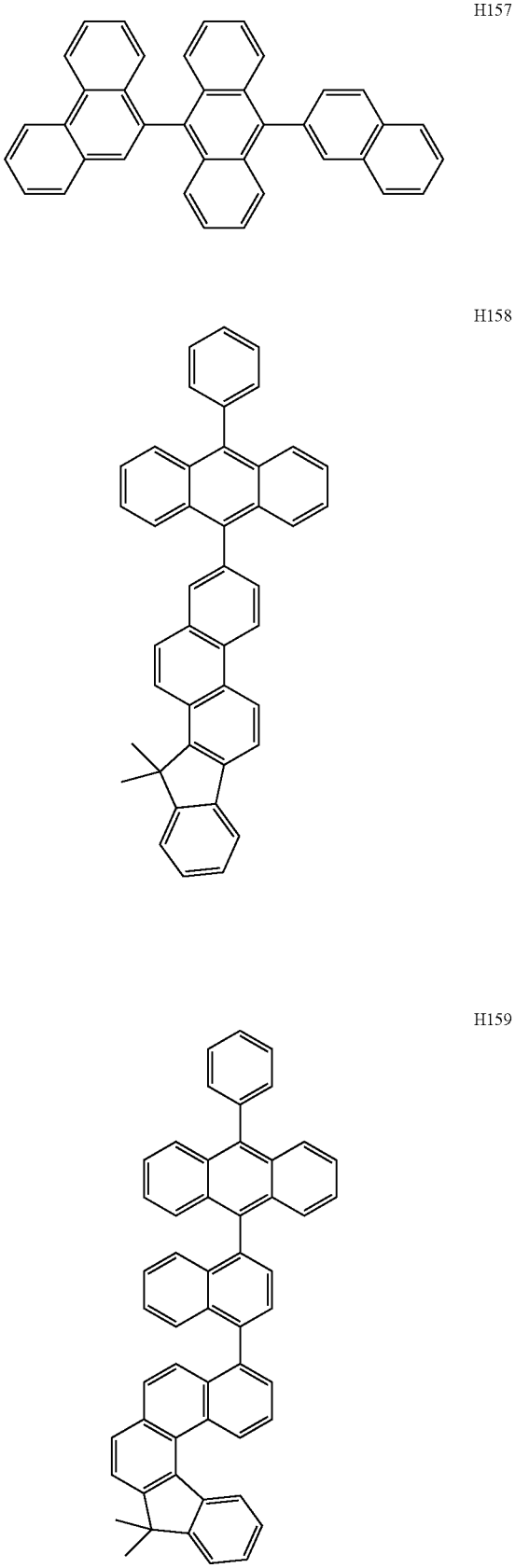

H160
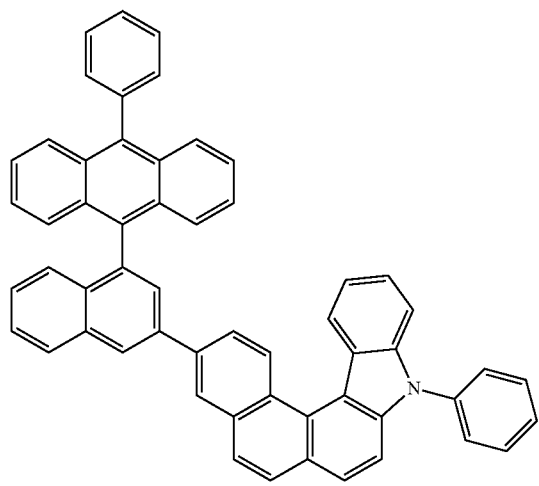
H163
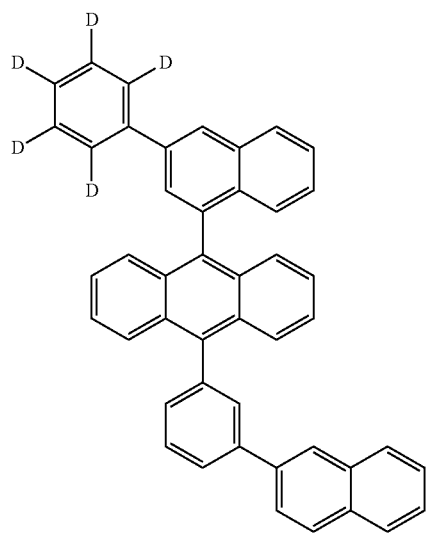
H161
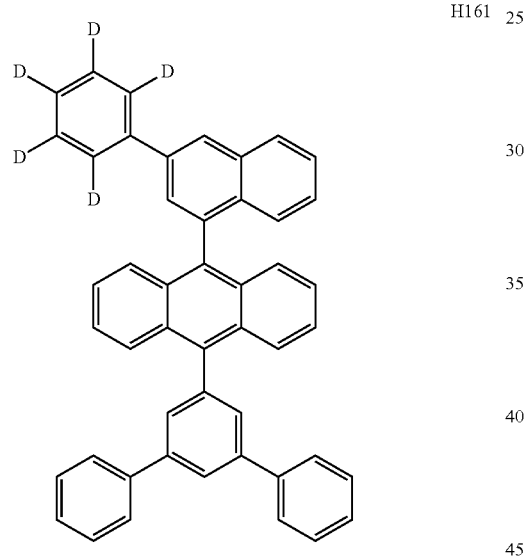
H164
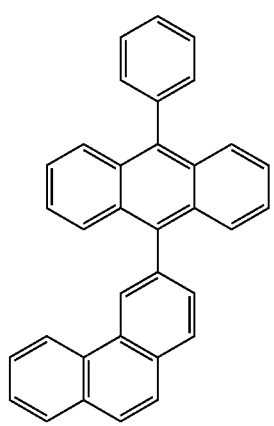
H162
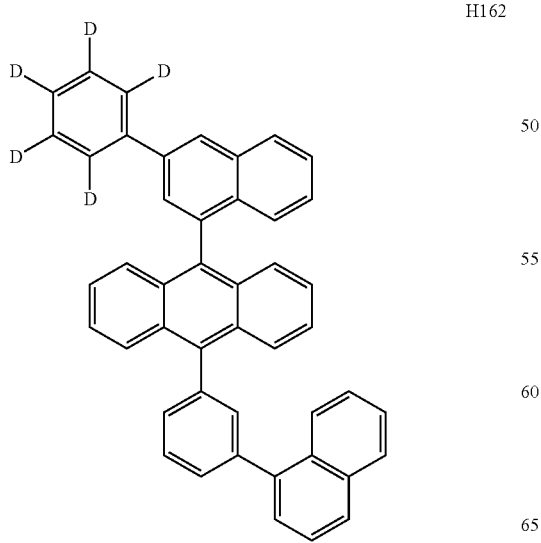
H165
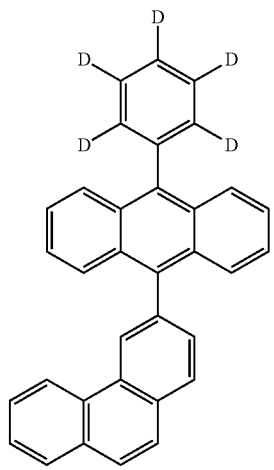

H166
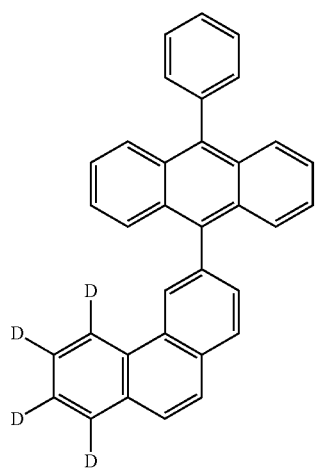
According to one embodiment of the present invention, the anthracene derivative of Formula H2 may be selected from the following compounds H201 to H281:
H201
H202
H203
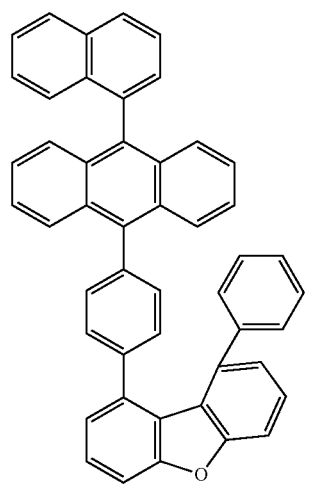
H204
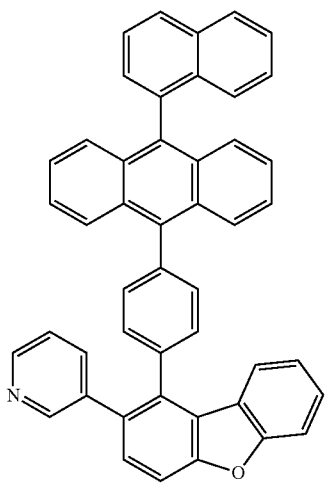
H205
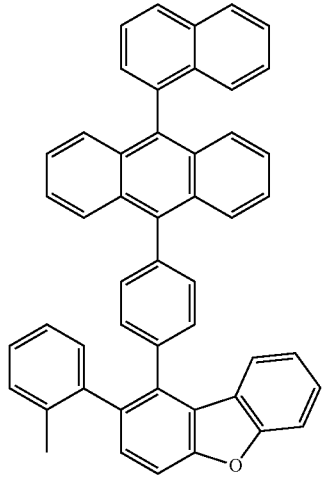

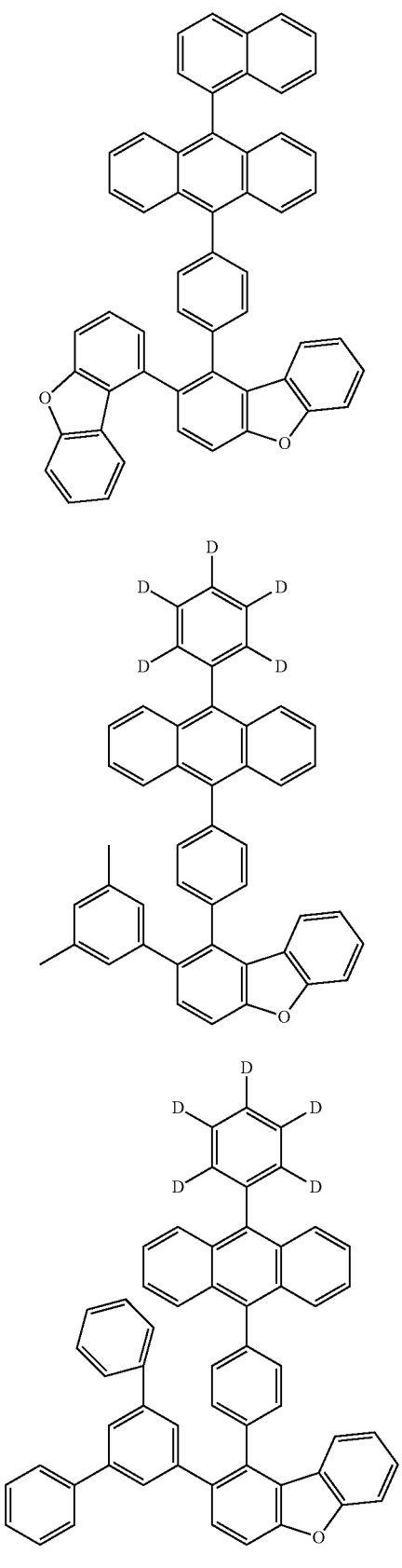
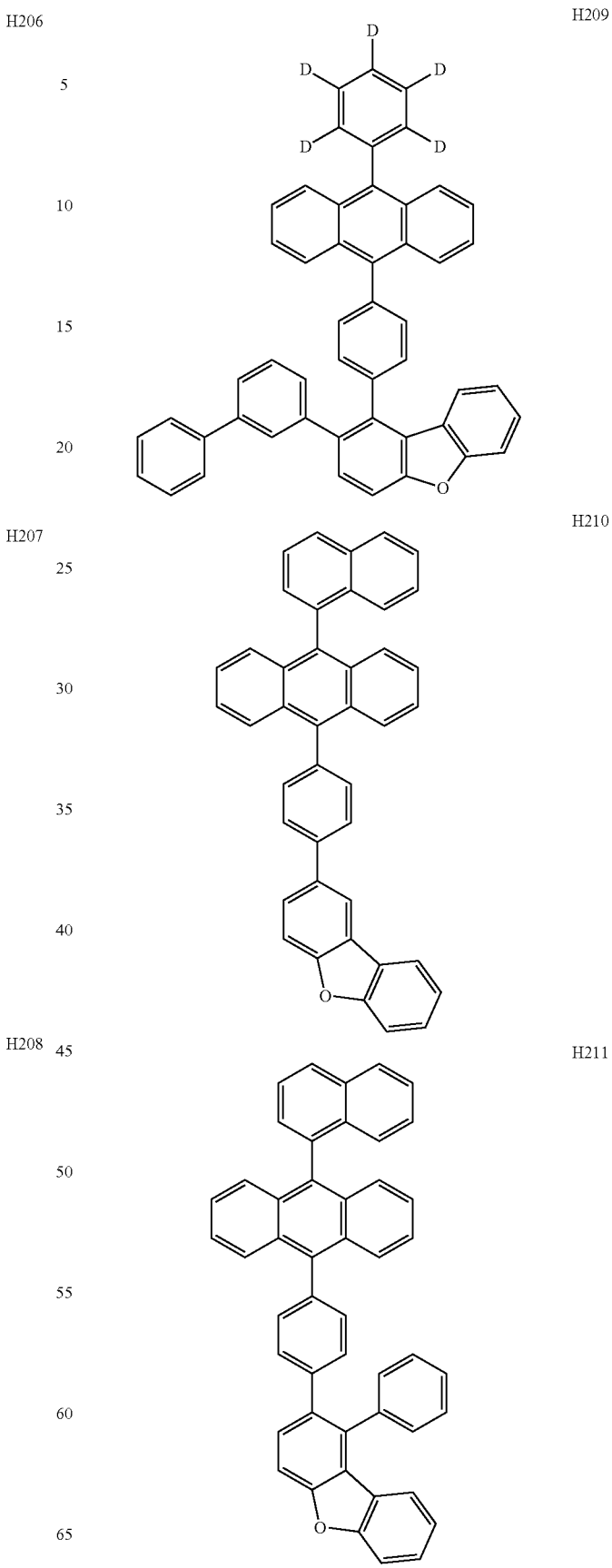

H212
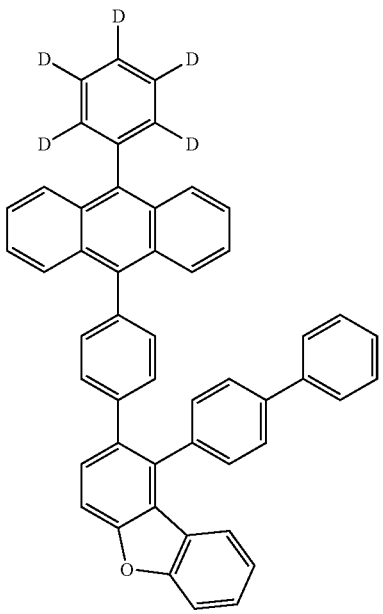
H214
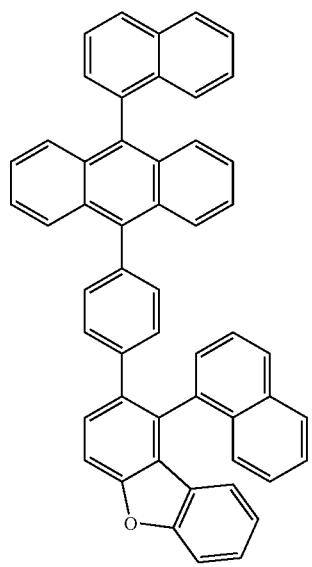
H213
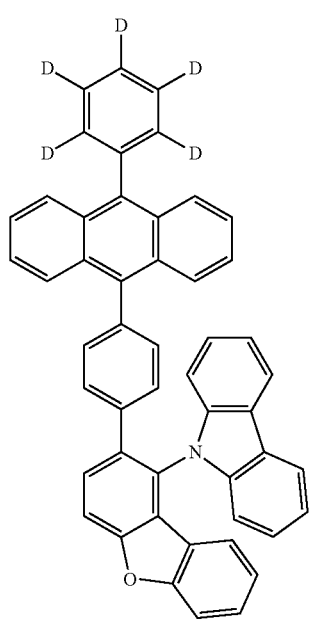
H215
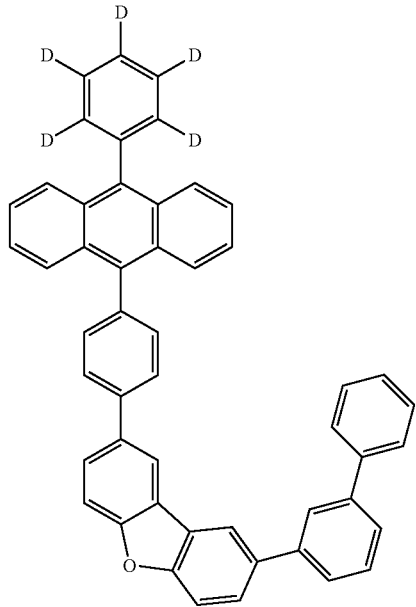

71
-continued
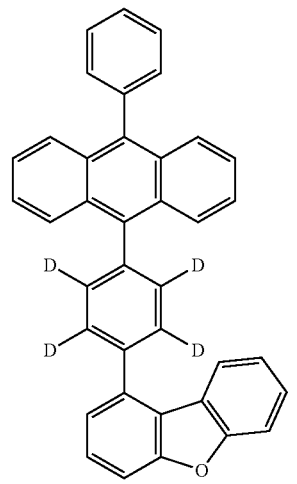
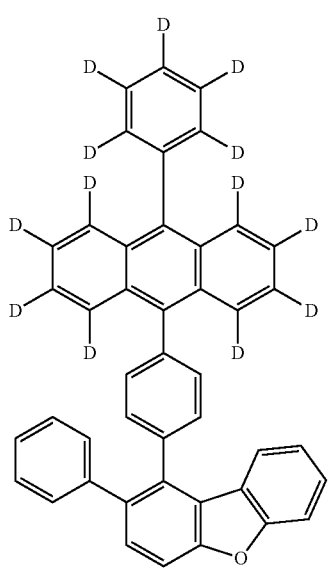
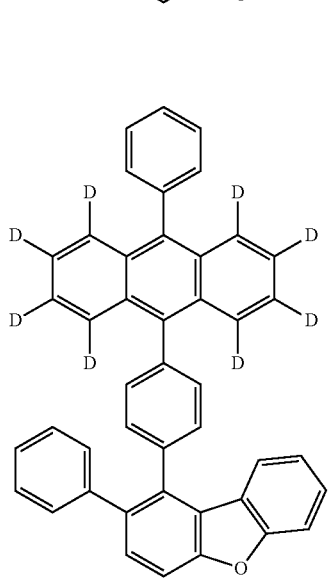
72
-continued
H216
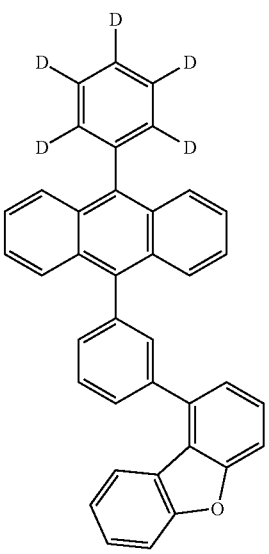
H217
H219
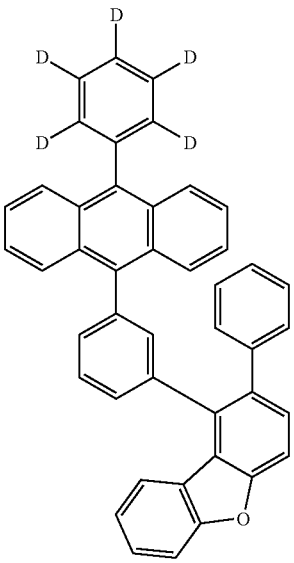
H220
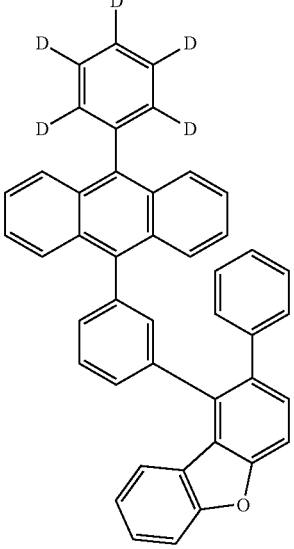
H218
H221
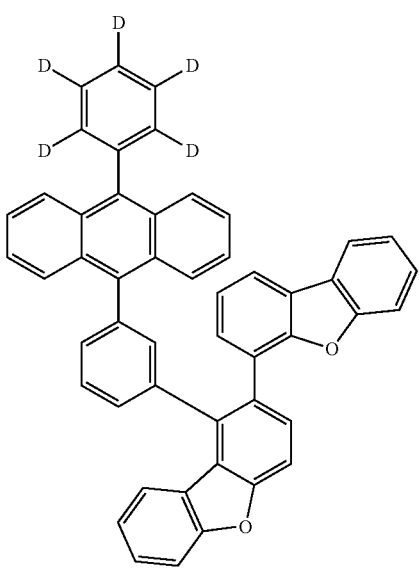

H222
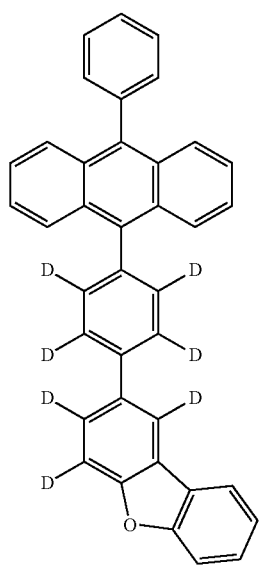
H224
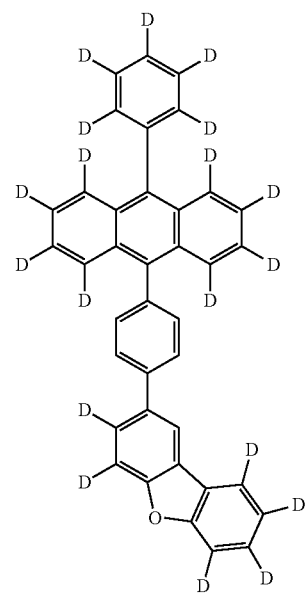
H225
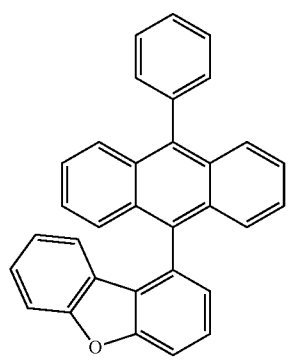
H223
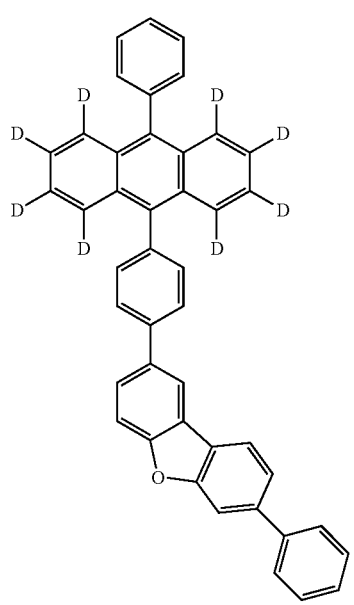
H226
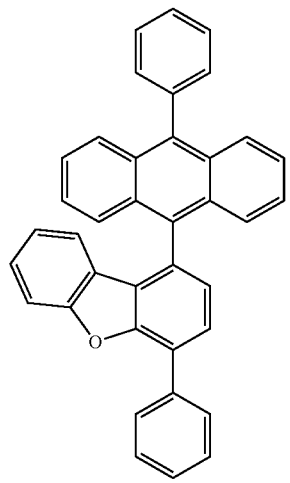

H227
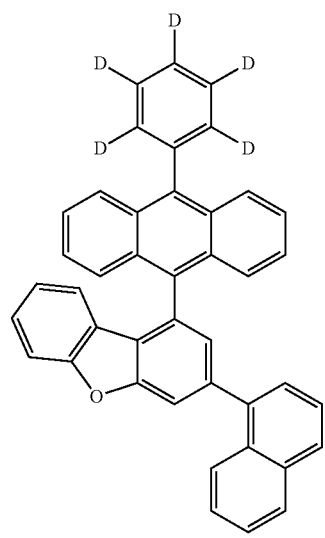
H228
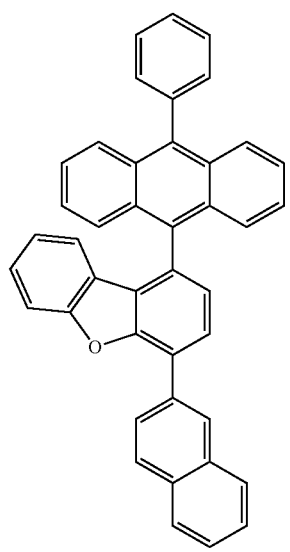
H229
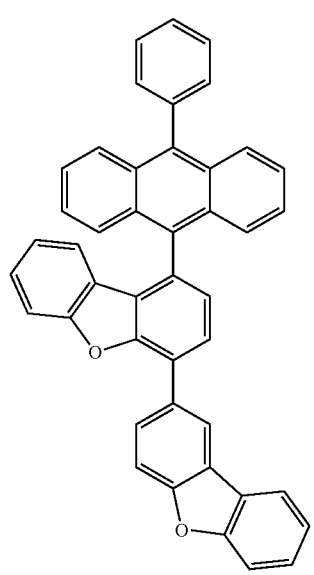
H230
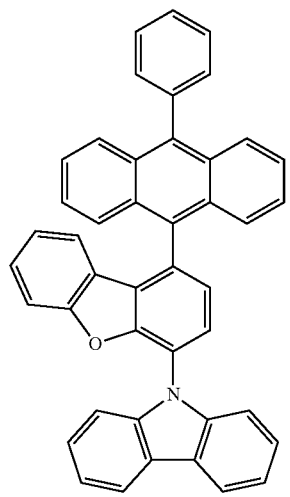
H231
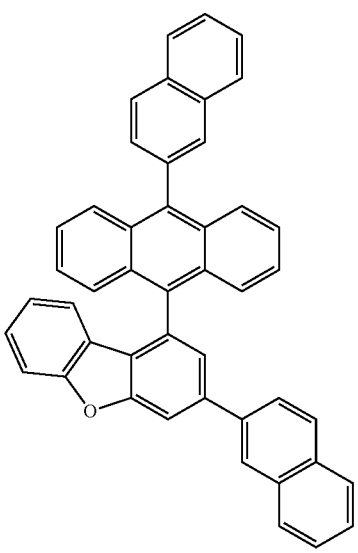
H232
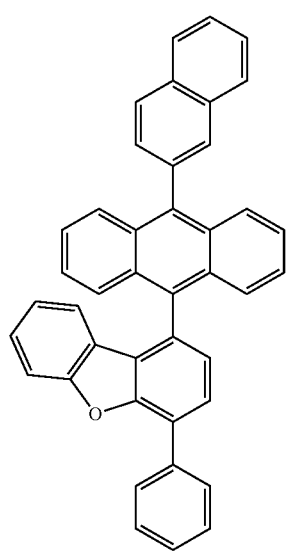

H233 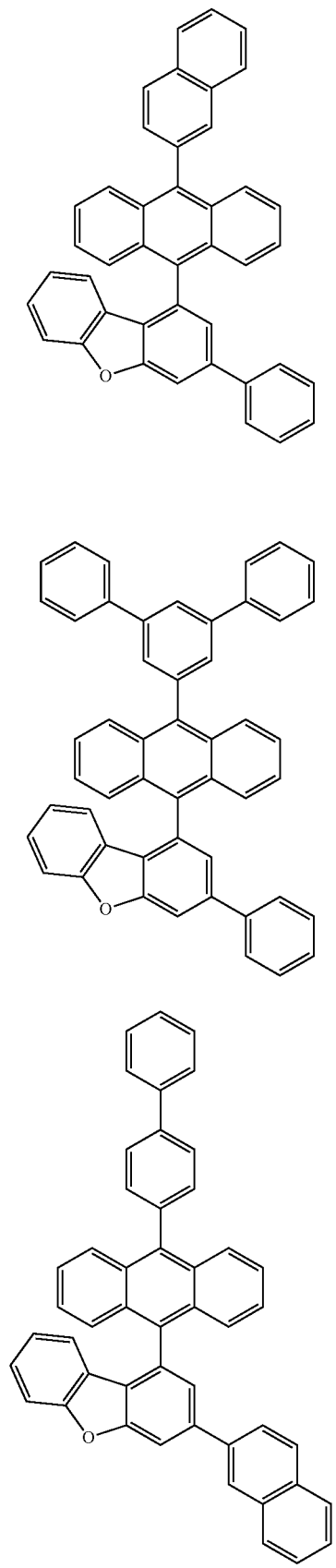
H234
H235
H236 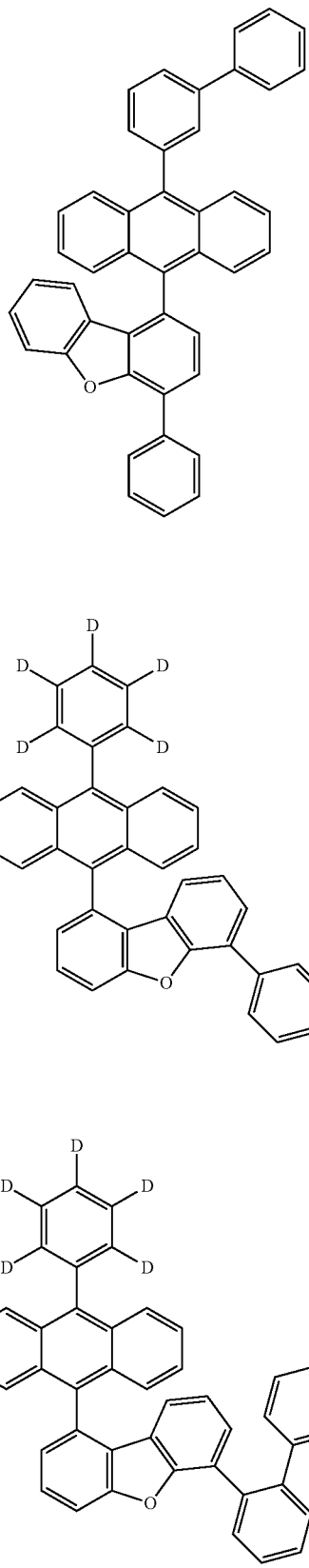
H237
H238

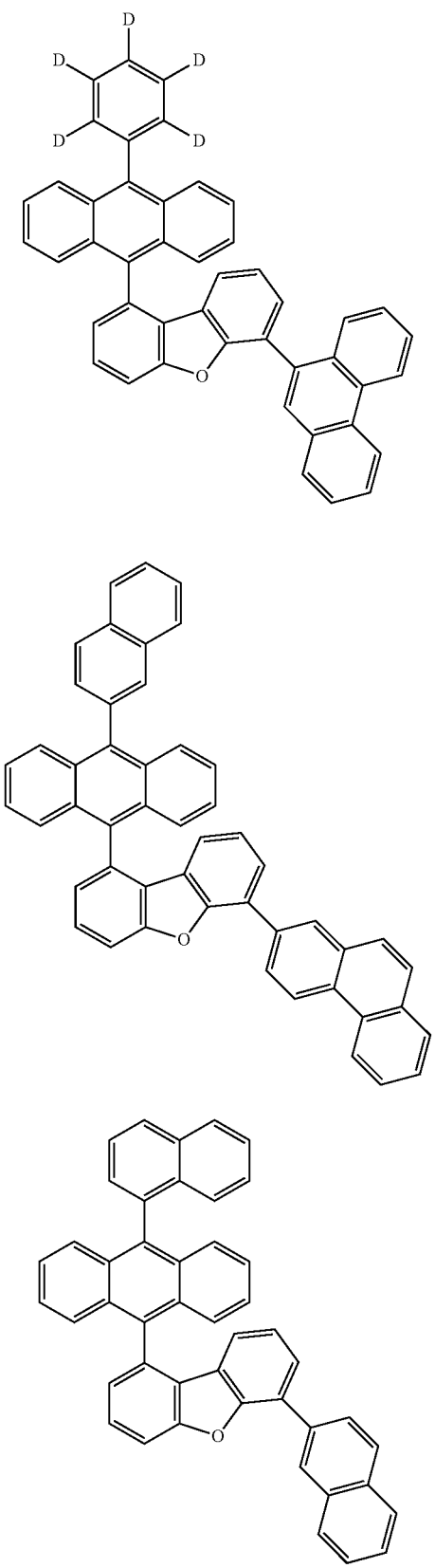
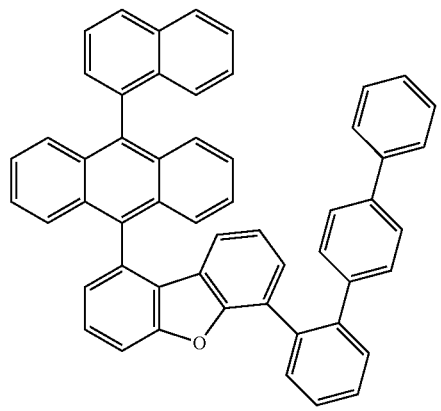
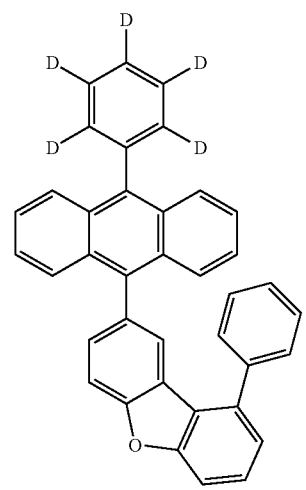
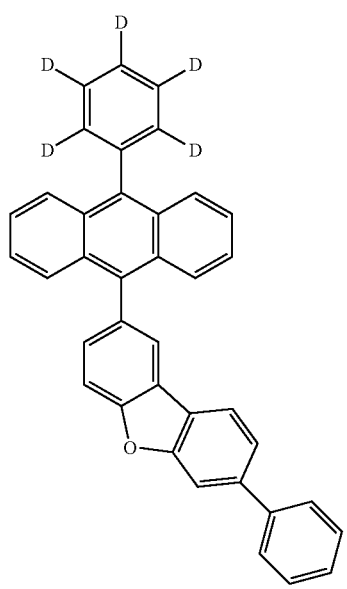

H245
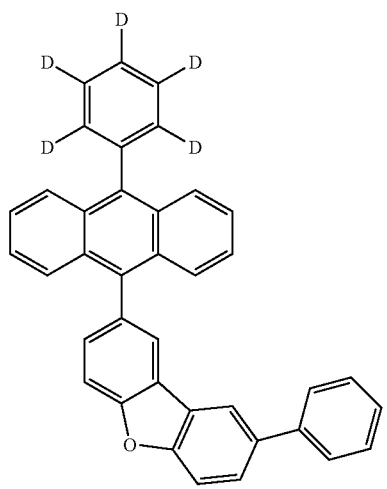
H246
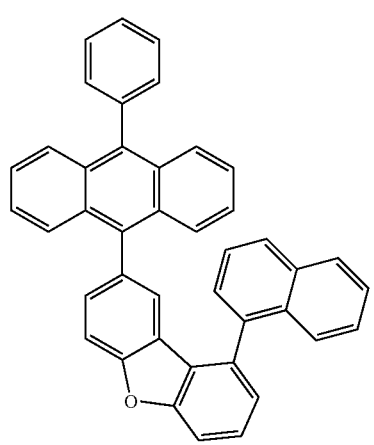
H247
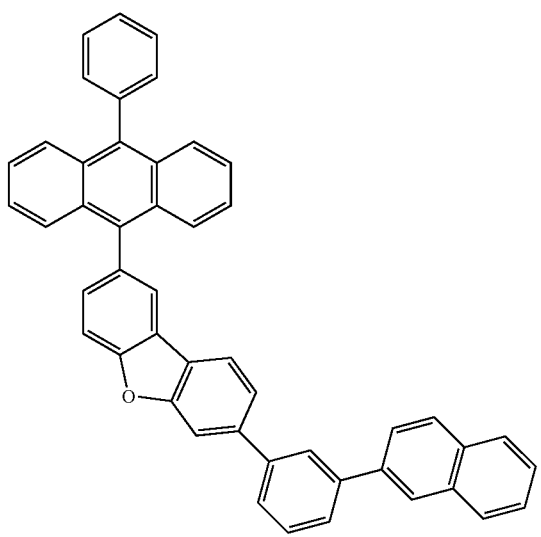
H248
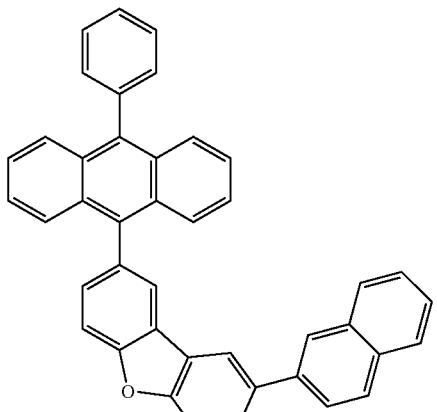
H249
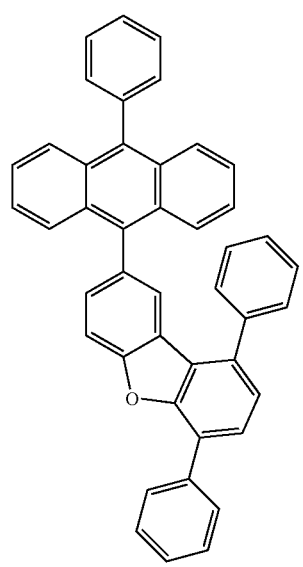
H250
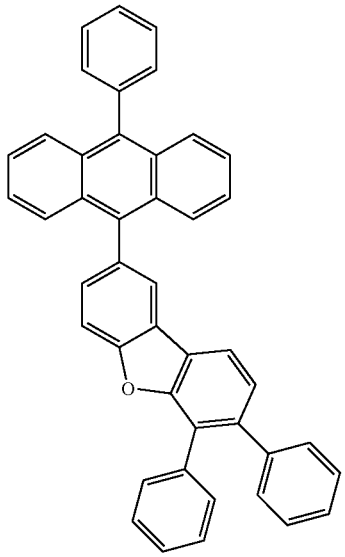

H251
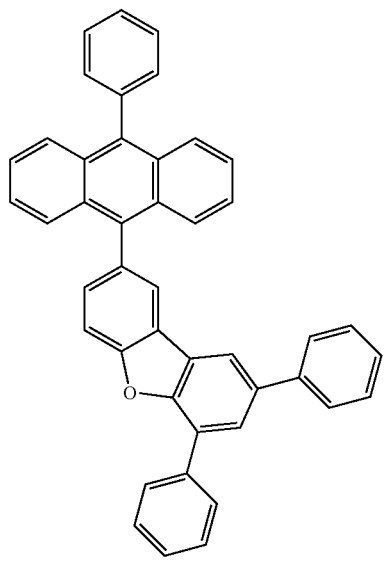
H252
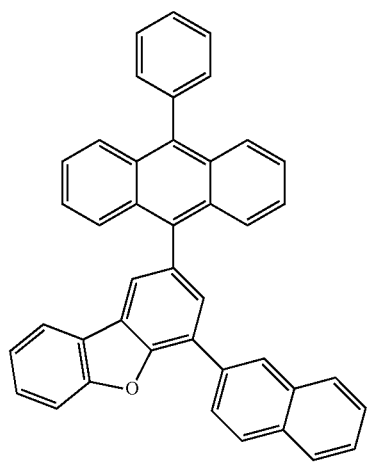
H253
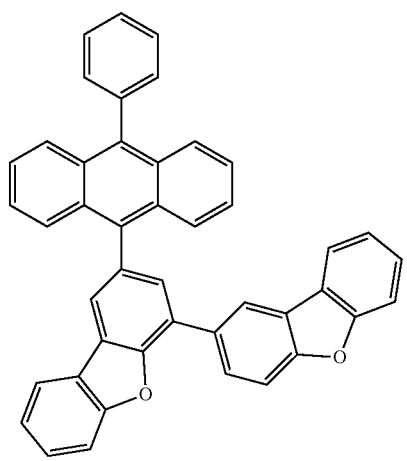
H254
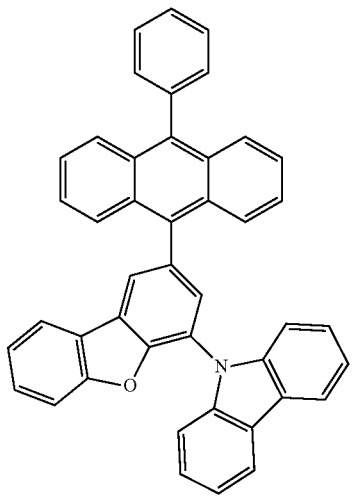
H255
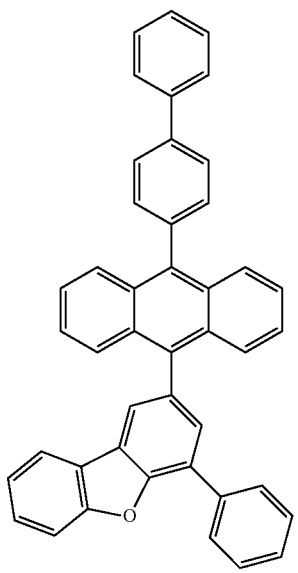
H256
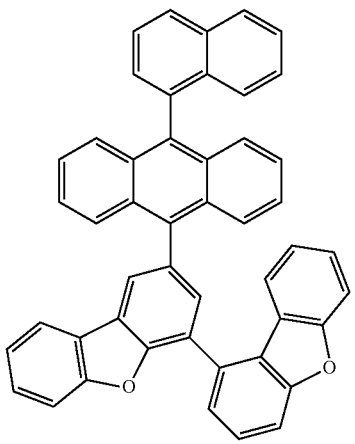

-continued
H257
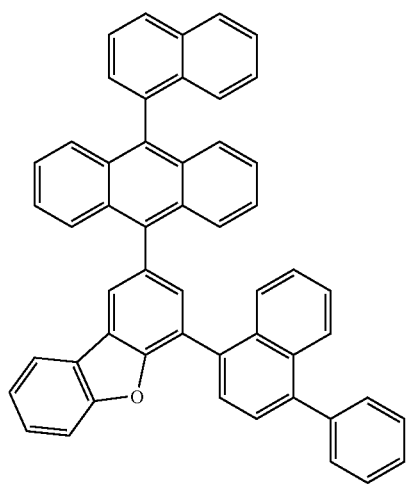
H258
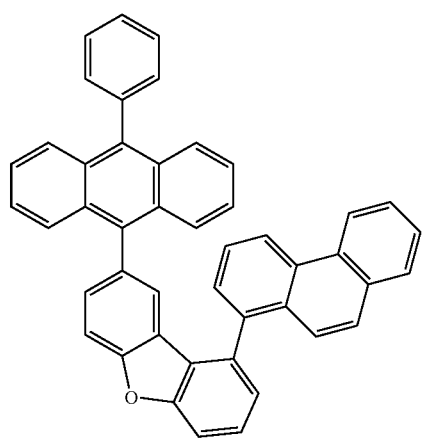
H259
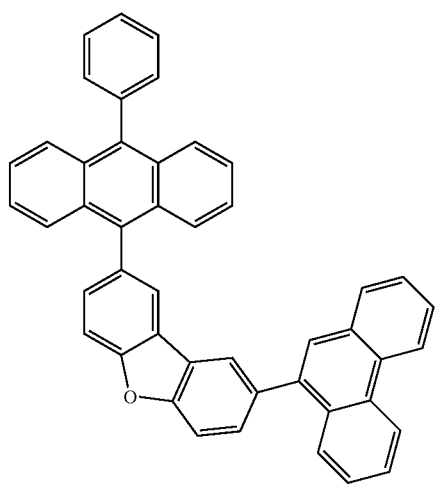
-continued
H260
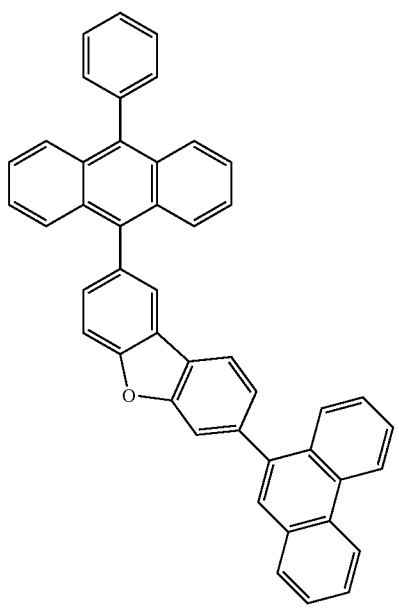
H261
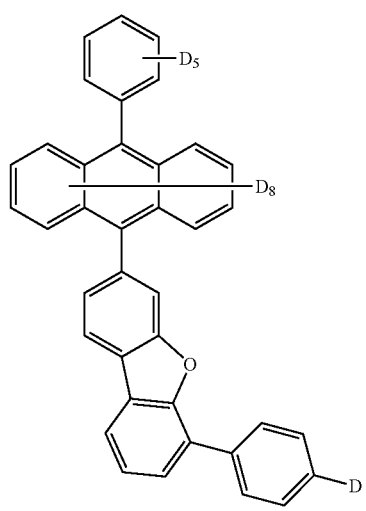
H262
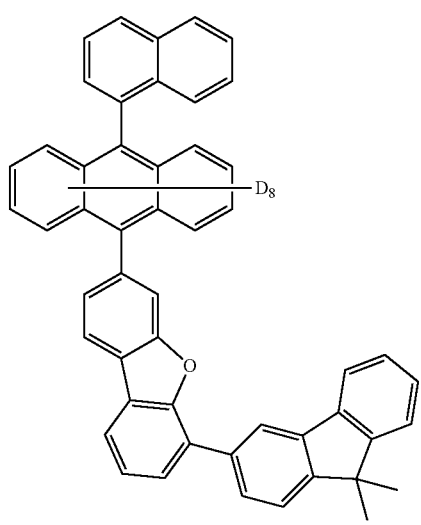

H263
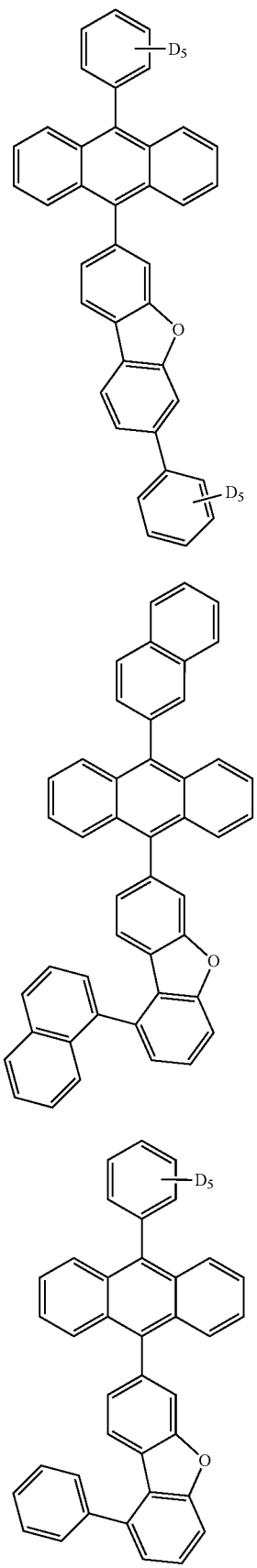
H264
H265
H266
H267

H268
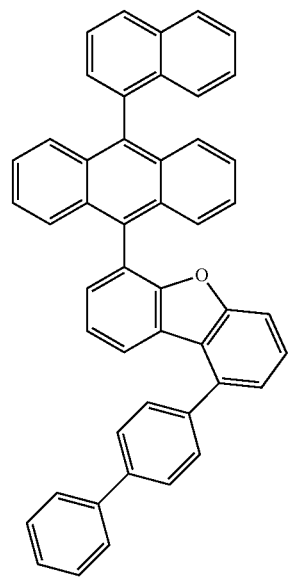
H269
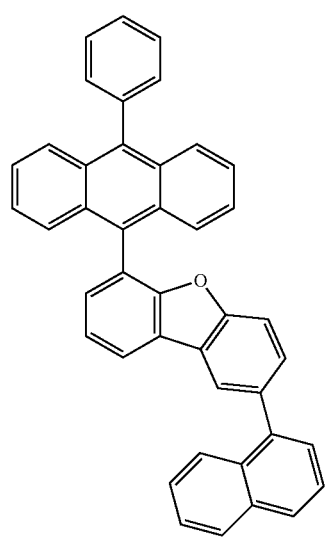
H270
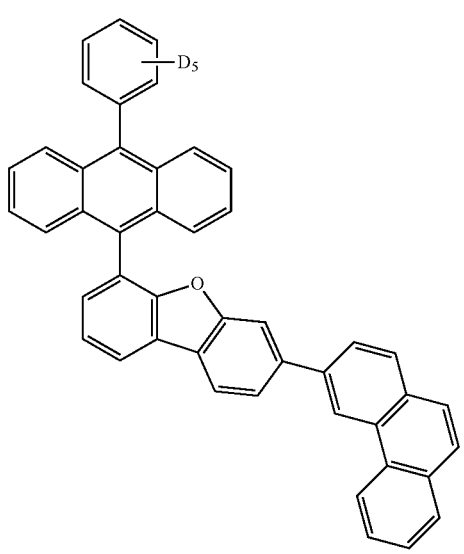
H271
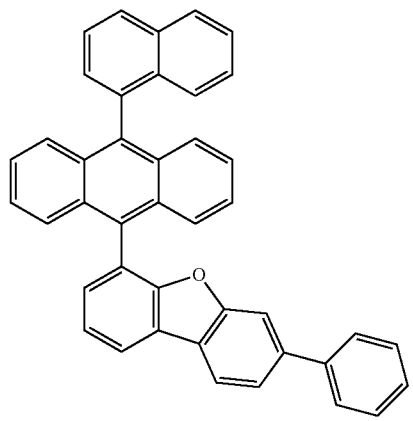
H272
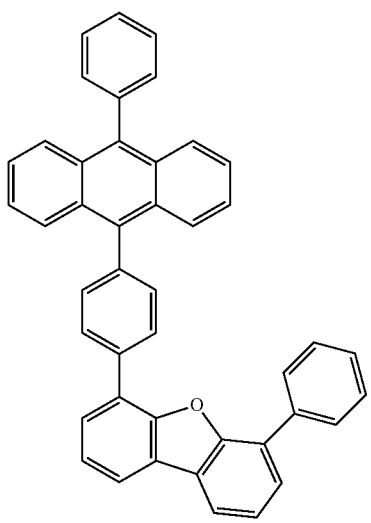
H273
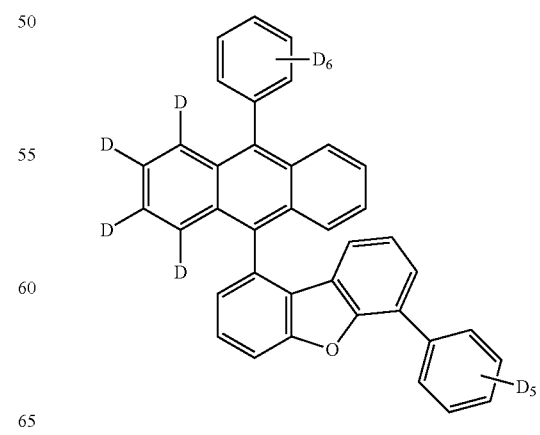

H274
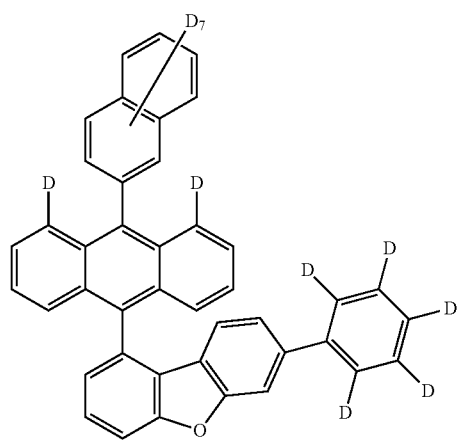
H275
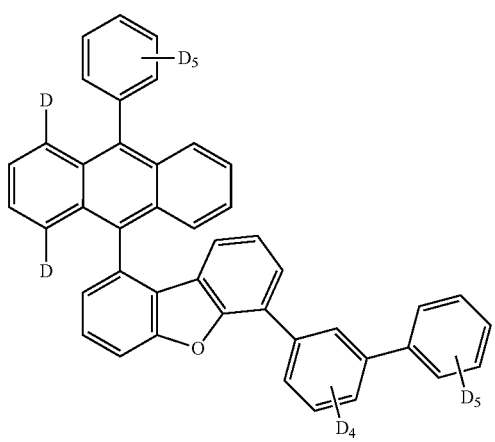
H276
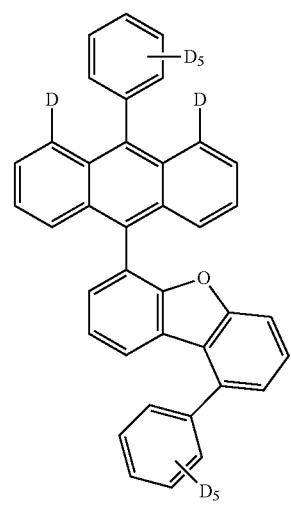
H277
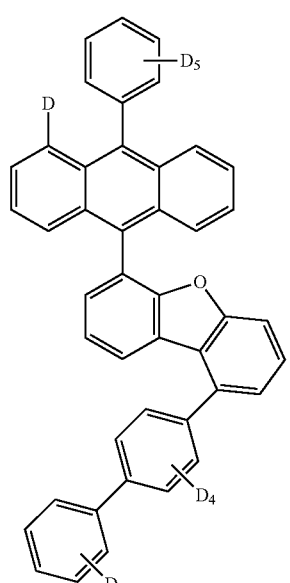
H278
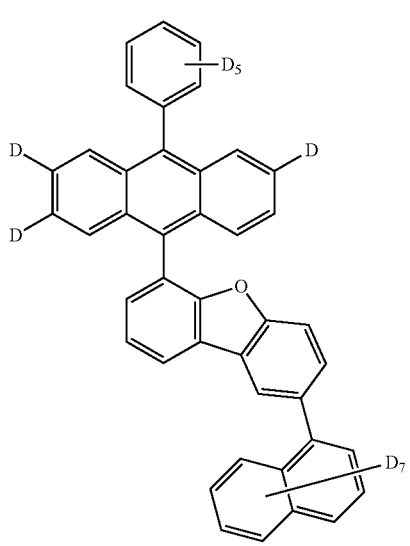
H279
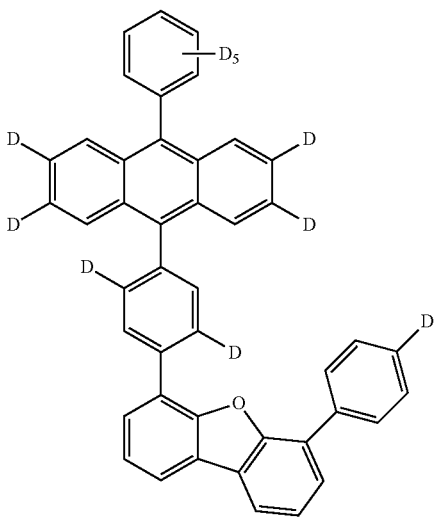

-continued

H280
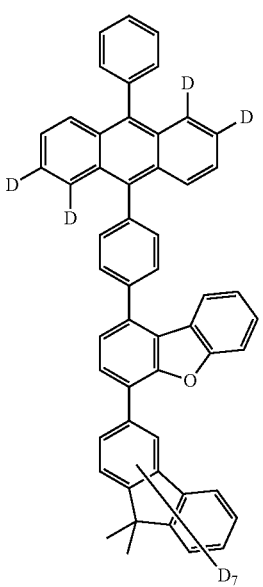

H281
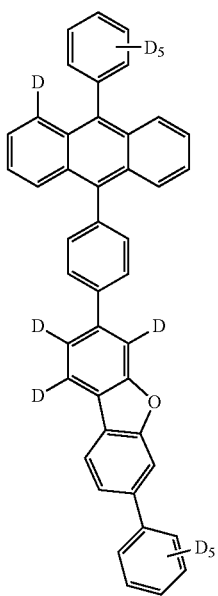

The organic layers of the organic electroluminescent device according to the present invention may form a monolayer structure. Alternatively, the organic layers may have a multilayer stack structure. For example, the organic layers may have a structure including a hole injecting layer, a hole transport layer, a hole blocking layer, a light emitting layer, an electron blocking layer, an electron transport layer, and an electron injecting layer but is not limited to this structure. The number of the organic layers is not limited and may be increased or decreased. Preferred structures of the organic layers of the organic electroluminescent device according to the present invention will be explained in more detail in the Examples section that follows.

According to one embodiment of the present invention, the organic electroluminescent device may include a substrate, a first electrode (anode), one or more organic layers, a second electrode (cathode), and a capping layer formed on the second electrode (top emission type).

When the organic electroluminescent device is of a top emission type, light from the light emitting layer is emitted to the cathode and passes through the capping layer (CPL) formed using the compound of the present invention having a relatively high refractive index. The wavelength of the light is amplified in the capping layer, resulting in an increase in luminous efficiency. A more detailed description will be given concerning exemplary embodiments of the organic electroluminescent device according to the present invention.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer. The organic electroluminescent device of the present invention may further include one or more organic layers such as a capping layer that have various functions depending on the desired characteristics of the device.

A specific structure of the organic electroluminescent device according to one embodiment of the present invention, a method for fabricating the device, and materials for the organic layers are as follows.

First, an anode material is coated on a substrate to form an anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide such as indium tin oxide (ITO), indium zinc oxide (IZO), tin oxide ($SnO_2$) or zinc oxide (ZnO) is used as the anode material.

A hole injecting material is coated on the anode by vacuum thermal evaporation or spin coating to form a hole injecting layer. Then, a hole transport material is coated on the hole injecting layer by vacuum thermal evaporation or spin coating to form a hole transport layer.

The hole injecting material is not specially limited so long as it is usually used in the art. Specific examples of such materials include 4,4',4''-tris(2-naphthylphenyl-phenylamino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), N,N'-diphenyl-N,N'-bis(4-(phenyl-m-tolylamino)phenyl) biphenyl-4,4'-diamine (DNTPD), and 1,4,5,8,9,11-hexaazatriphenylenehexacarbonitrile (HAT-CN).

The hole transport material is not specially limited so long as it is commonly used in the art. Examples of such materials include N,N'-bis(3-methylphenyl)-N,N'-diphenyl-(1,1-biphenyl)-4,4'-diamine (TPD) and N,N'-di(naphthalen-1-yl)-N,N'-diphenylbenzidine (α-NPD).

Subsequently, a hole auxiliary layer and a light emitting layer are sequentially laminated on the hole transport layer. A hole blocking layer may be optionally formed on the light emitting layer by vacuum thermal evaporation or spin coating. The hole blocking layer is formed as a thin film and blocks holes from entering a cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited so long as it can transport electrons and has a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, BeBq$_2$, OXD-7 and Liq.

An electron transport layer is deposited on the hole blocking layer by vacuum thermal evaporation or spin coating, and an electron injecting layer is formed thereon. A cathode metal is deposited on the electron injecting layer by vacuum thermal evaporation to form a cathode, completing the fabrication of the organic electroluminescent device.

For example, lithium (Li), magnesium (Mg), aluminum (Al), aluminum-lithium (Al—Li), calcium (Ca), magnesium-indium (Mg—In) or magnesium-silver (Mg—Ag) may be used as the metal for the formation of the cathode. The organic electroluminescent device may be of top emission type. In this case, a transmissive material such as ITO or IZO may be used to form the cathode.

A material for the electron transport layer functions to stably transport electrons injected from the cathode. The electron transport material may be any of those known in the art and examples thereof include, but are not limited to, quinoline derivatives, particularly tris(8-quinolinolate)aluminum (Alq3), TAZ, BAlq, beryllium bis(benzoquinolin-10-olate (Bebq2), and oxadiazole derivatives such as PBD, BMD, and BND.

The light emitting layer of the organic electroluminescent device according to the present invention may further include various host materials and various dopant materials in addition to the dopant compound represented by Formula A or B.

Each of the organic layers can be formed by a monomolecular deposition or solution process. According to the monomolecular deposition process, the material for each layer is evaporated into a thin film under heat and vacuum or reduced pressure.

According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

MODE FOR CARRYING OUT THE INVENTION

The present invention will be explained more specifically with reference to the following examples. However, it will be obvious to those skilled in the art that these examples are in no way intended to limit the scope of the invention.

Synthesis Example 1: Synthesis of Compound 1

Synthesis Example 1-(1): Synthesis of Intermediate 1-a

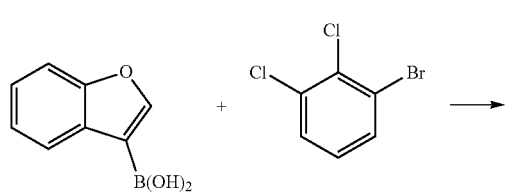

-continued

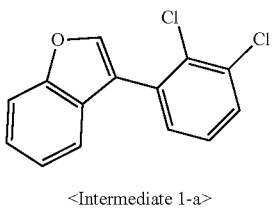

<Intermediate 1-a>

22.6 g (100 mmol) of 1-bromo-2,3-dichlorobenzene, 16.2 g (100 mmol) of benzofuran-3-ylboronic acid, 4 g (3 mmol) of tetrakis(triphenylphosphine)palladium, 41.5 g (300 mmol) of potassium carbonate, 250 mL of tetrahydrofuran, and 90 mL of distilled water were placed in a reactor. The mixture was stirred under reflux for 24 h. After completion of the reaction, the organic layer was concentrated under reduced pressure and purified by column chromatography to afford 32.9 g of Intermediate 1-a (yield 80%).

Synthesis Example 1-(2): Synthesis of Intermediate 1-b

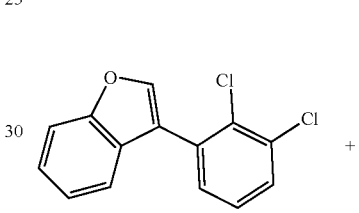

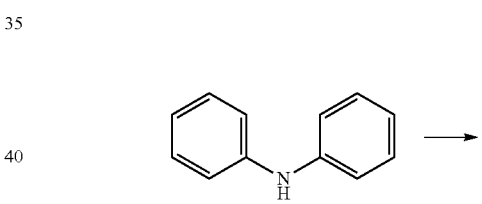

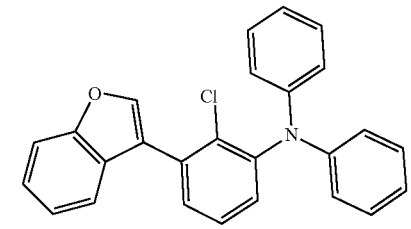

<Intermediate 1-b>

21.8 g (83 mmol) of Intermediate 1-a, 15.6 g (92 mmol) of diphenylamine, 1.6 g (2 mmol) of tris(dibenzylideneacetone)palladium, 16 g (166 mmol) of sodium tert-butoxide, 0.7 g (3 mmol) of tri-tert-butylphosphine, and 300 mL of toluene were placed in a reactor. The mixture was stirred under reflux for 24 h. After completion of the reaction, the reaction mixture was filtered. The filtrate was concentrated and purified by column chromatography to afford 24.0 g of Intermediate 1-b (yield 73%).

Synthesis Example 1-3: Synthesis of Compound 1

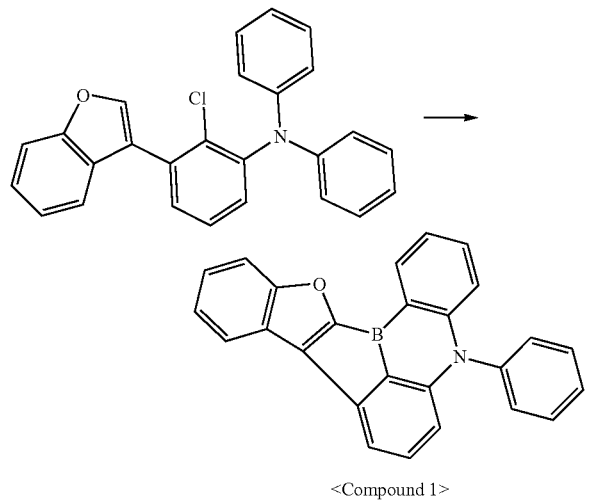

<Compound 1>

14.6 g (37 mmol) of Intermediate 1-b and 150 mL of tert-butylbenzene were placed in a reactor and 42.4 mL (74 mmol) of tert-butyllithium was added dropwise thereto at −78° C. The mixture was stirred at 60° C. for 3 h. Nitrogen was blown into the mixture at the same temperature to remove heptane. After cooling to −78° C., 7.1 g (74 mmol) of boron tribromide was added dropwise. The resulting mixture was stirred at room temperature for 1 h. After dropwise addition of 9.6 g (74 mmol) of N,N-diisopropylethylamine at 0° C., stirring was continued at 120° C. for ~2 h. An aqueous sodium acetate solution was added at room temperature, followed by stirring. After completion of the reaction, the reaction mixture was filtered. The filtrate was concentrated and purified by column chromatography to give 3.4 g of Compound 1 (yield 25%).

MS (MALDI-TOF): m/z 369.13 [M+]

Synthesis Example 2: Synthesis of Compound 8

Synthesis Example 2-(1): Synthesis of Intermediate 2-a

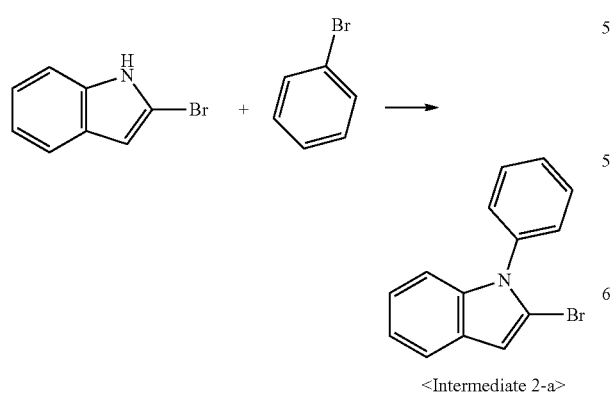

<Intermediate 2-a>

Intermediate 2-a (yield 75%) was synthesized in the same manner as in Synthesis Example 1-(2), except that bromobenzene and 2-bromoindole were used instead of Intermediate 1-a and diphenylamine, respectively.

Synthesis Example 2-(2): Synthesis of Intermediate 2-b

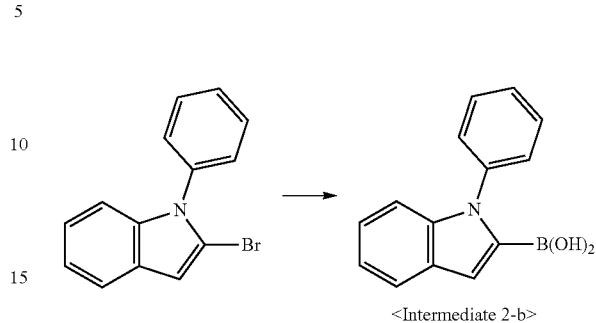

<Intermediate 2-b>

31.3 g (115 mmol) of Intermediate 2-a was dissolved in 300 mL of tetrahydrofuran in a reactor under a nitrogen atmosphere. After cooling to −78° C., 83.5 mL (140 mmol) of n-butyllithium was added dropwise, followed by stirring at the same temperature for 2 h. To the mixture was added 18 mL (160 mmol) of trimethyl borate. Stirring was continued at room temperature overnight. After completion of the reaction, the reaction mixture was acidified by slow dropwise addition of 2 N hydrochloric acid and extracted with water and ethyl acetate. The organic layer was dried over magnesium sulfate, concentrated under reduced pressure, and recrystallized from heptane and toluene to afford 19.1 g of Intermediate 2-b (yield 70%).

Synthesis Example 2-(3): Synthesis of Compound 8

Compound 8 was synthesized in the same manner as in Synthesis Examples 1-(1) to 1-(3), except that Intermediate 2-b was used instead of benzofuran-3-ylboronic acid in Synthesis Example 1-(1) (yield 24%).

MS (MALDI-TOF): m/z 444.18 [M+]

Synthesis Example 3: Synthesis of Compound 12

Synthesis Example 3-(1): Synthesis of Intermediate 3-a

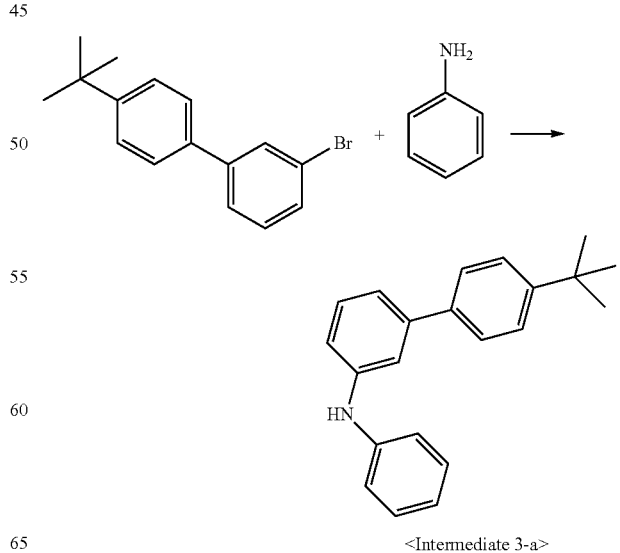

<Intermediate 3-a>

4.6 g (16 mmol) of 3-bromo-4'-(tert-butyl)biphenyl, 1.5 g (16 mmol) of aniline, 0.1 g (1 mmol) of palladium acetate, 3 g (32 mmol) of sodium tert-butoxide, 0.2 g (1 mmol) of bis(diphenylphosphino)-1,1'-binaphthyl, and 50 mL of toluene were placed in a reactor. The mixture was stirred under reflux for 24 h. After completion of the reaction, the reaction mixture was filtered. The filtrate was concentrated and purified by column chromatography to afford 3.8 g of Intermediate 3-a (yield 80%).

Synthesis Example 3-(2): Synthesis of Compound 12

Compound 12 (yield 27%) was synthesized in the same manner as in Synthesis Examples 1-(1) to 1-(3), except that 1,3-dibromo-5-tert-butyl-2-chlorobenzene and (5-ethyl-1-benzothiophen-3-yl)boronic acid were used instead of 1-bromo-2,3-dichlorobenzene and benzofuran-3-ylboronic acid, respectively, in Synthesis Example 1-(1) and Intermediate 3-a was used instead of diphenylamine in Synthesis Example 1-(2).

MS (MALDI-TOF): m/z 525.27 [M$^+$]

Synthesis Example 4: Synthesis of Compound 71

Synthesis Example 4-(1): Synthesis of Intermediate 4-a

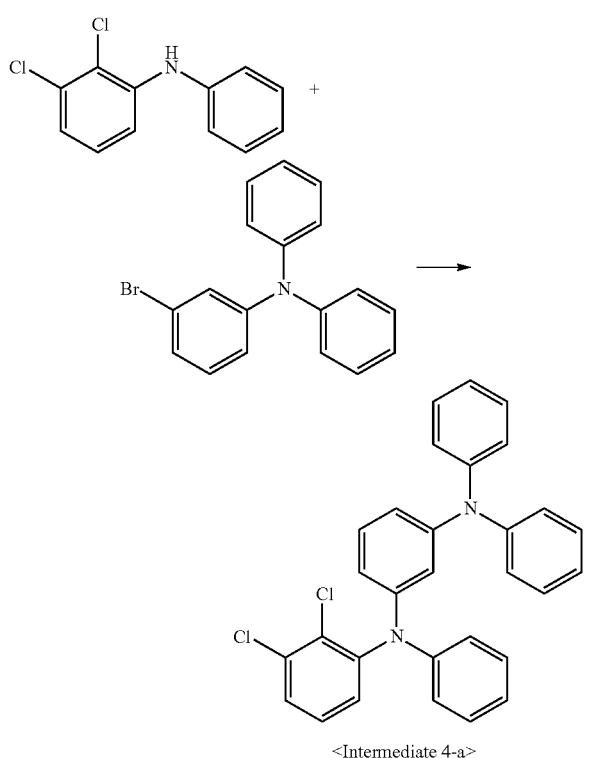

<Intermediate 4-a>

Intermediate 4-a (yield 77%) was synthesized in the same manner as in Synthesis Example 1-(2), except that 3-bromotriphenylamine and 2,3-dichloro-N-phenylaniline were used instead of Intermediate 1-a and diphenylamine, respectively.

Synthesis Example 4-(2): Synthesis of Compound 71

Compound 71 (yield 24%) was synthesized in the same manner as in Synthesis Examples 1-(1) and 1-(3), except that Intermediate 4-a and 2-(1,1-dimethyl-1H-inden-2-yl)-4,4,5,5-tetramethyl-1,3,2-dioxaborolane were used instead of 1-bromo-2,3-dichlorobenzene and benzofuran-3-ylboronic acid, respectively, in Synthesis Example 1-(1).

MS (MALDI-TOF): m/z 564.27 [M$^+$]

Synthesis Example 5: Synthesis of Compound 101

Synthesis Example 5-(1): Synthesis of Intermediate 5-a

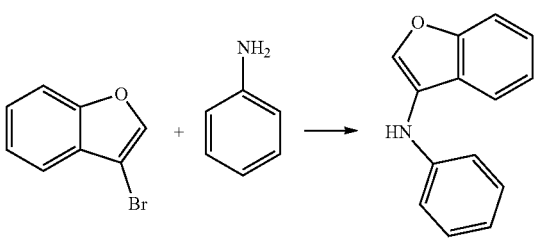

<Intermediate 5-a>

3.1 g (16 mmol) of 3-bromobenzofuran, 1.5 g (16 mmol) of aniline, 0.1 g (1 mmol) of palladium acetate, 3 g (32 mmol) of sodium tert-butoxide, 0.2 g (1 mmol) of bis(diphenylphosphino)-1,1'-binaphthyl, and 50 mL of toluene were placed in a reactor. The mixture was stirred under reflux for 24 h. After completion of the reaction, the reaction mixture was filtered. The filtrate was concentrated and purified by column chromatography to afford 2.6 g of Intermediate 5-a (yield 77%).

Synthesis Example 5-(2): Synthesis of Compound 101

Compound 101 (yield 25%) was synthesized in the same manner as in Synthesis Examples 1-(1) to 1-(3), except that benzofuran-2-boronic acid was used instead of benzofuran-3-ylboronic acid in Synthesis Example 1-(1) and Intermediate 5-a was used instead of diphenylamine in Synthesis Example 1-(2).

MS (MALDI-TOF): m/z 409.13 [M$^+$]

Synthesis Example 6: Synthesis of Compound 40

Synthesis Example 6-(1): Synthesis of Intermediate 6-a

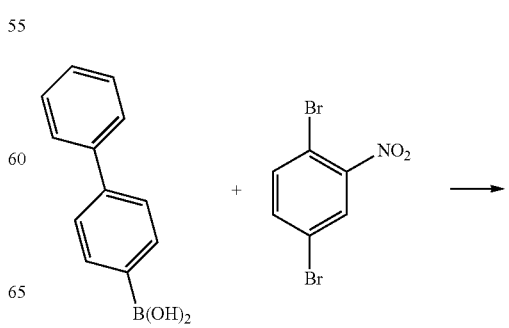

-continued

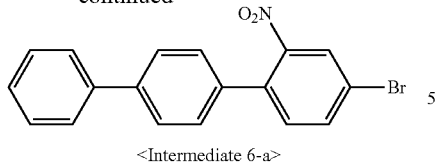

<Intermediate 6-a>

Intermediate 6-a (yield 62%) was synthesized in the same manner as in Synthesis Example 1-(1), except that 2,5-dibromonitrobenzene and 4-biphenylboronic acid were used instead of 1-bromo-2,3-dichlorobenzene and benzofuran-3-ylboronic acid, respectively.

Synthesis Example 6-(2): Synthesis of Intermediate 6-b

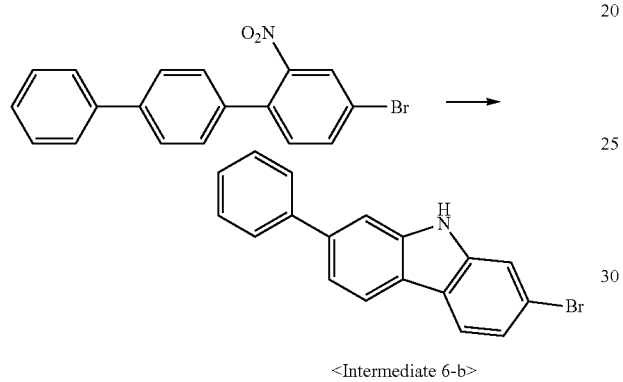

<Intermediate 6-b>

27.6 g (78 mmol) of Intermediate 6-a and 51.1 g (195 mmol) of triphenylphosphine were placed in a reactor and added with and dissolved in 500 ml of 1,2-dichlorobenzene. Thereafter, the solution was stirred under reflux for 24 h. After completion of the reaction, the organic layer was concentrated under reduced pressure and purified by column chromatography to afford 17.8 g of Intermediate 6-b (yield 71%).

Synthesis Example 6-(3): Synthesis of Intermediate 6-c

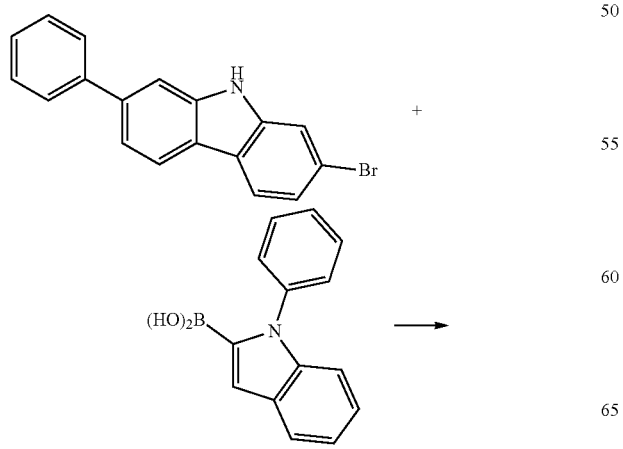

-continued

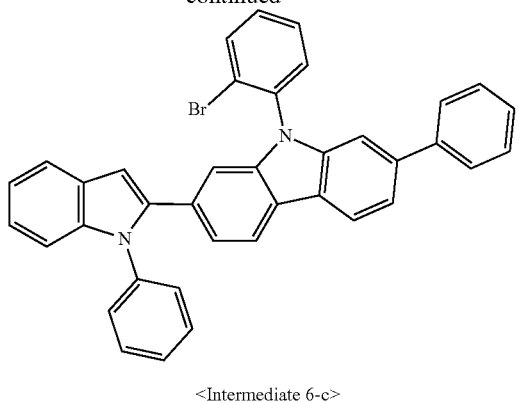

<Intermediate 6-c>

Intermediate 6-c (yield 65%) was synthesized in the same manner as in Synthesis Example 1-(1), except that Intermediate 6-a and Intermediate 2-b were used instead of 1-bromo-2,3-dichlorobenzene and benzofuran-3-ylboronic acid, respectively.

Synthesis Example 6-(4): Synthesis of Intermediate 6-d

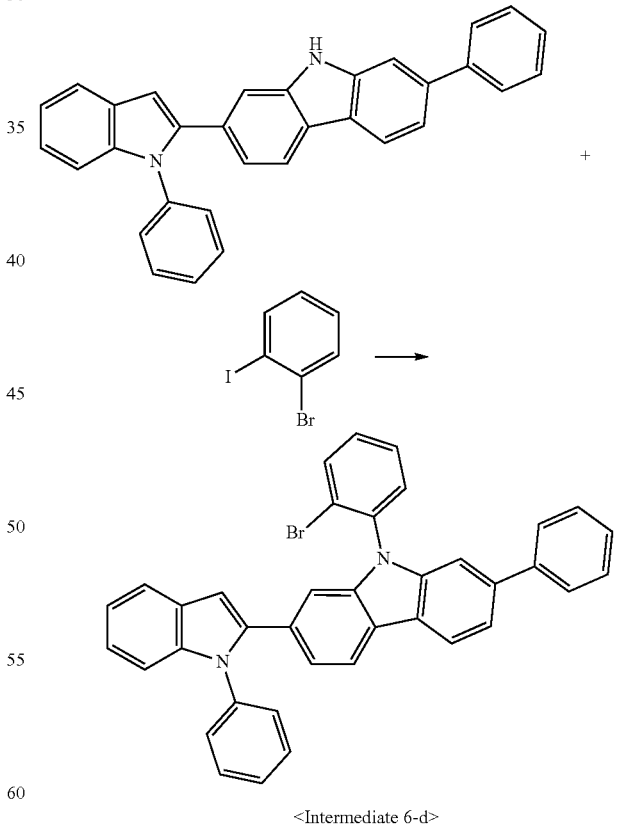

<Intermediate 6-d>

Intermediate 6-d (yield 70%) was synthesized in the same manner as in Synthesis Example 1-(2), except that 1-bromo-2-iodobenzene and Intermediate 6-c were used instead of Intermediate 1-a and diphenylamine, respectively.

Synthesis Example 6-(5): Synthesis of Compound 40

Compound 40 (yield 25%) was synthesized in the same manner as in Synthesis Example 1-(3), except that Intermediate 6-d was used instead of Intermediate 1-b.

MS (MALDI-TOF): m/z 518.20 [M$^+$]

Synthesis Example 7: Synthesis of Compound 63

Synthesis Example 7-(1): Synthesis of Intermediate 7-a

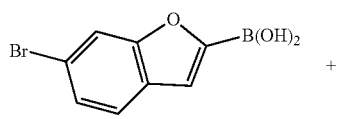

+

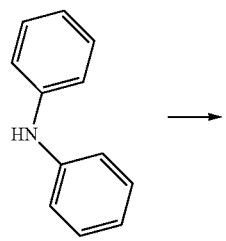

→

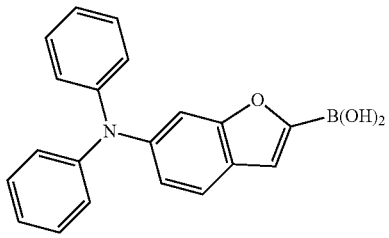

<Intermediate 7-a>

Intermediate 7-a (yield 78%) was synthesized in the same manner as in Synthesis Example 1-(2), except that 6-bromobenzofuran-2-ylboronic acid was used instead of Intermediate 1-a.

Synthesis Example 7-(2): Synthesis of Compound 63

Compound 63 (yield 24%) was synthesized in the same manner as in Synthesis Examples 1-(1) to 1-(3), except that Intermediate 7-a (5-ethyl-1-benzothiophen-3-yl)boronic acid) was used instead of benzofuran-3-ylboronic acid in Synthesis Example 1-(1) and N-phenyl-3-biphenylamine was used instead of diphenylamine in Synthesis Example 1-(2).

MS (MALDI-TOF): m/z 612.24 [M$^+$]

Synthesis Example 8: Synthesis of Compound 111

Synthesis Example 8-(1): Synthesis of Intermediate 8-a

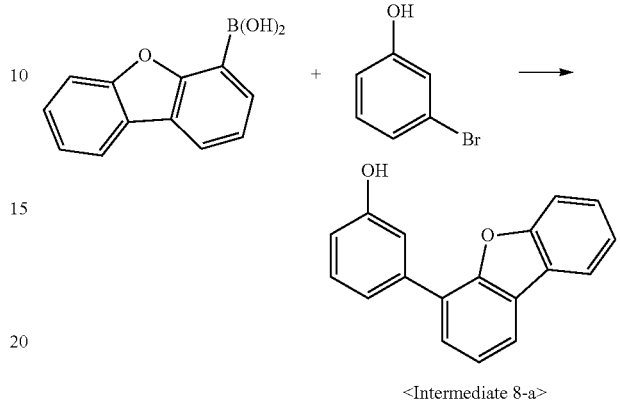

<Intermediate 8-a>

Intermediate 8-a (yield 85%) was synthesized in the same manner as in Synthesis Example 1-(1), except that 3-bromophenol and dibenzofuran-4-boronic acid were used instead of 1-bromo-2,3-dichlorobenzene and benzofuran-3-ylboronic acid, respectively.

Synthesis Example 8-(2): Synthesis of Intermediate 8-b

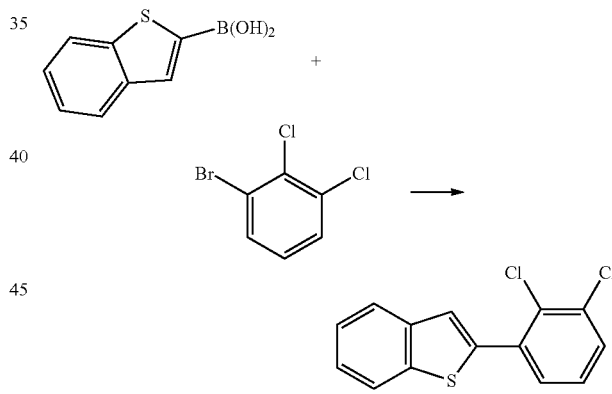

<Intermediate 8-b>

Intermediate 8-b (yield 82%) was synthesized in the same manner as in Synthesis Example 1-(1), except that benzothiophen-2-ylboronic acid was used instead of benzofuran-3-ylboronic acid.

Synthesis Example 8-(3): Synthesis of Intermediate 8-c

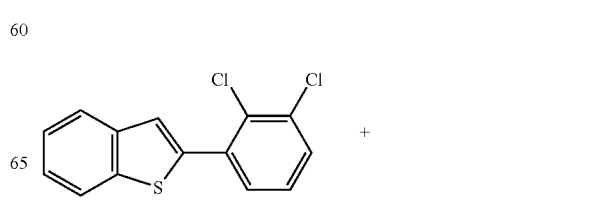

+

-continued

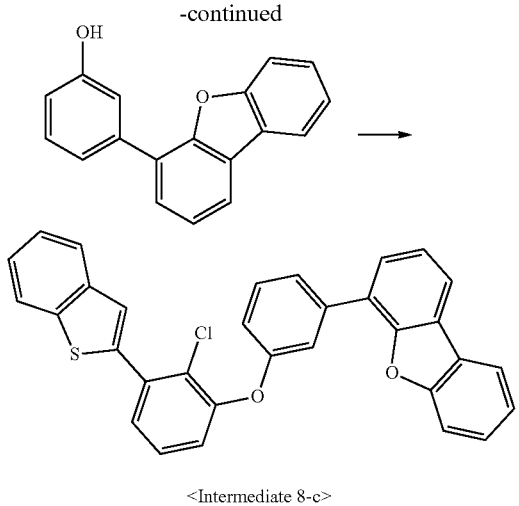

<Intermediate 8-c>

41.9 g (150 mmol) of Intermediate 8-b, 41.6 g (160 mmol) of Intermediate 8-a, 45.7 g (300 mmol) of potassium carbonate, and 250 mL of NMP were placed in a reactor. The mixture was stirred under reflux at 160° C. for 12 h. After completion of the reaction, the temperature was lowered to room temperature. NMP was distilled off under reduced pressure, followed by extraction. The extract was concentrated under reduced pressure and purified by column chromatography to afford 46.8 g of Intermediate 8-c (yield 62%).

Synthesis Example 8-(4): Synthesis of Compound 111

Compound 111 (yield 25%) was synthesized in the same manner as in Synthesis Example 1-(3), except that Intermediate 8-c was used instead of Intermediate 1-b.

MS (MALDI-TOF): m/z 476.10 [M$^+$]

Synthesis Example 9: Synthesis of Compound 123

Synthesis Example 9-(1): Synthesis of Intermediate 9-a

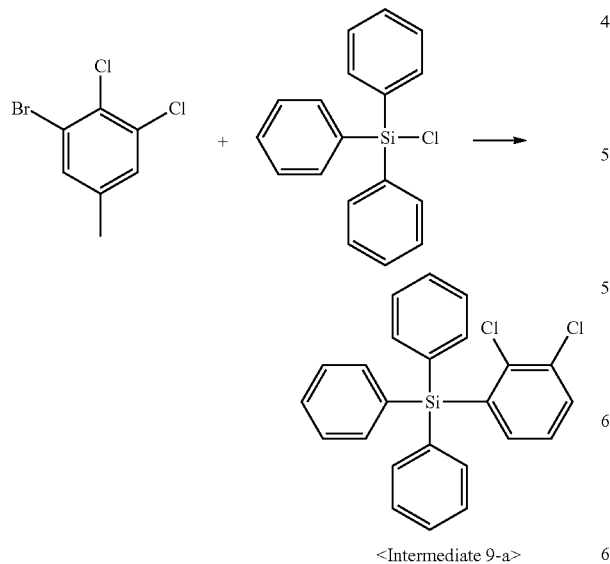

<Intermediate 9-a>

53 g (221 mmol) of 3-bromo-4,5-dichlorotoluene and 500 mL of tetrahydrofuran were placed in a reactor under a nitrogen atmosphere. After cooling to −78° C., 152 mL (243 mmol) of 1.6 M n-butyllithium was slowly added dropwise, followed by stirring for 1 h. To the mixture was slowly added dropwise 65.2 g (221 mmol) of triphenylsilyl chloride at the same temperature. The temperature was raised to room temperature. The resulting mixture was stirred for 2 h. After completion of the reaction, the organic layer was concentrated under reduced pressure and purified by column chromatography to afford 26.9 g of Intermediate 9-a (yield 30%).

Synthesis Example 9-(2): Synthesis of Compound 123

Compound 123 (yield 24%) was synthesized in the same manner as in Synthesis Examples 1-(1) and 1-(3), except that Intermediate 9-a and (5-tert-butyl-1-benzothiophen-2-yl)boronic acid were used instead of 1-bromo-2,3-dichlorobenzene and benzofuran-3-ylboronic acid, respectively, in Synthesis Example 1-(1).

MS (MALDI-TOF): m/z 546.20 [M$^+$]

Synthesis Example 10: Synthesis of Compound 89

Synthesis Example 10-(1): Synthesis of Intermediate 10-a

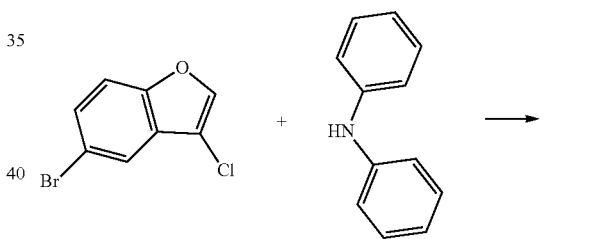

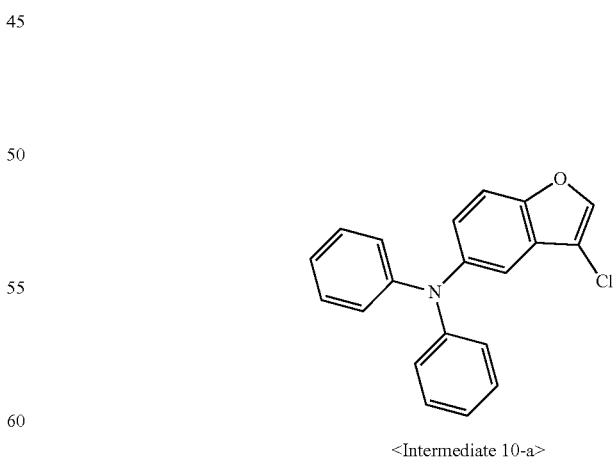

<Intermediate 10-a>

Intermediate 10-a (yield 80%) was synthesized in the same manner as in Synthesis Example 1-(2), except that 5-bromo-3-chloro-1-benzofuran was used instead of Intermediate 1-a.

Synthesis Example 10-(2): Synthesis of Intermediate 10-b

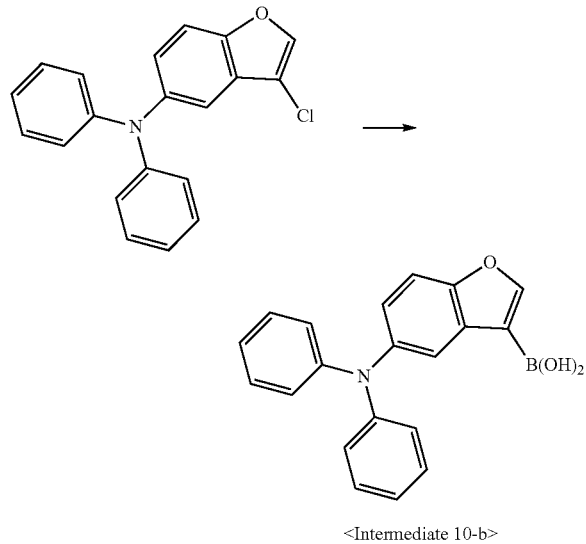

<Intermediate 10-b>

Intermediate 10-b (yield 82%) was synthesized in the same manner as in Synthesis Example 2-(2), except that Intermediate 10-a was used instead of Intermediate 2-a.

Synthesis Example 10-(3): Synthesis of Compound 89

Compound 89 (yield 23%) was synthesized in the same manner as in Synthesis Examples 1-(1) to 1-(3), except that Intermediate 10-b was used instead of benzofuran-3-ylboronic acid in Synthesis Example 1-(1) and 2,3-dimethylindole was used instead of diphenylamine in Synthesis Example 1-(2).

MS (MALDI-TOF): m/z 512.21 [M$^+$]

Synthesis Example 11: Synthesis of Compound 133

Synthesis Example 11-(1): Synthesis of Compound 133

Compound 133 (yield 25%) was synthesized in the same manner as in Synthesis Examples 1-(1) to 1-(3), except that 3,4,5-trichlorobiphenyl-2',3',4',5',6'-d5 was used instead of 1-bromo-2,3-dichlorobenzene in Synthesis Example 1-(1) and N-phenyl-3-biphenylamine was used instead of diphenylamine in Synthesis Example 1-(2).

MS (MALDI-TOF): m/z 526.23 [M$^+$]

Synthesis Example 12: Synthesis of Compound 93

Synthesis Example 12-(1): Synthesis of Intermediate 12-a

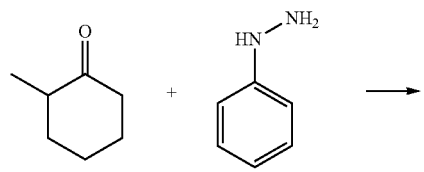

-continued

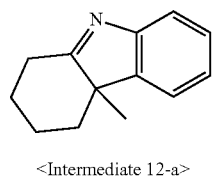

<Intermediate 12-a>

100 g (0.924 mol) of phenylhydrazine and 500 mL of acetic acid were stirred in a reactor. The mixture was heated to 60° C. To the mixture was slowly added dropwise 103.6 g (0.924 mol) of 2-methylcyclohexanone. The resulting mixture was refluxed for 8 h. After completion of the reaction, the reaction mixture was extracted with water and ethyl acetate, concentrated, and purified by column chromatography to afford 130 g of Intermediate 12-a (yield 76%).

Synthesis Example 12-(2): Synthesis of Intermediate 12-b

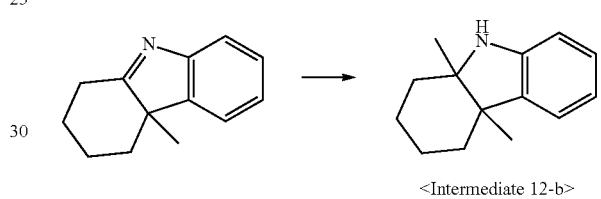

<Intermediate 12-b>

75 g (405 mmol) of Intermediate 12-a was added to 750 mL of toluene in a reactor under a nitrogen atmosphere. After cooling to −10° C., 380 mL (608 mmol) of 1.6 M methyllithium was slowly added dropwise. The mixture was stirred at −10° C. for ~3 h. After completion of the reaction, the reaction mixture was extracted with water and ethyl acetate, concentrated, and purified by column chromatography to afford 50.5 g of Intermediate 12-b (yield 62%).

Synthesis Example 12-(3): Synthesis of Intermediate 12-c

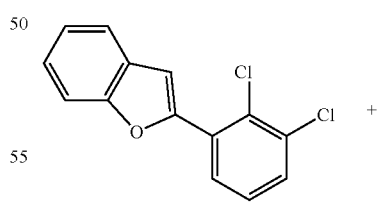

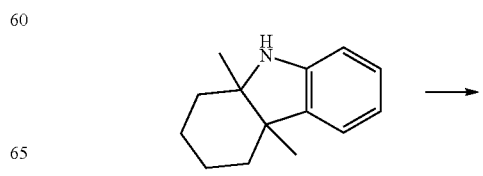

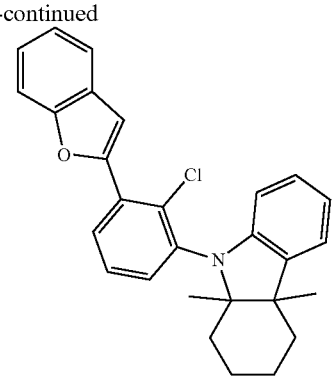

<Intermediate 12-c>

Intermediate 12-c (yield 70%) was synthesized in the same manner as in Synthesis Examples 1-(1) and 1-(2), except that benzofuran-2-ylboronic acid was used instead of benzofuran-3-ylboronic acid in Synthesis Example 1-(1) and Intermediate 12-b was used instead of diphenylamine in Synthesis Example 1-(2).

Synthesis Example 12-(4): Synthesis of Compound 93

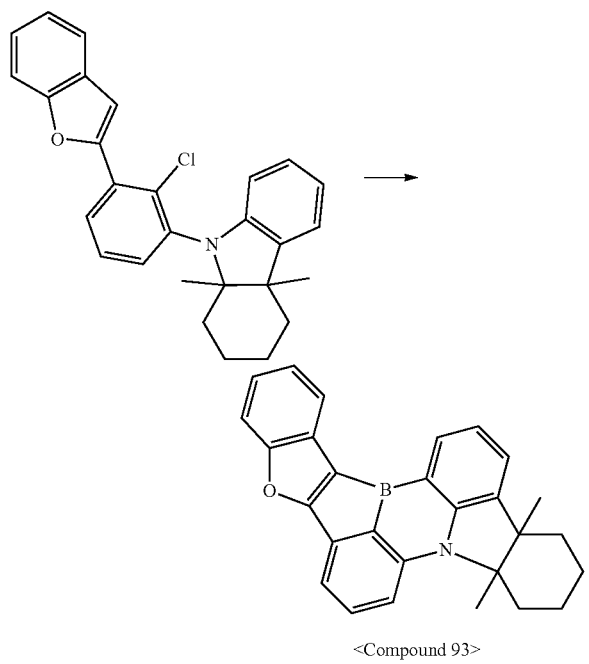

<Compound 93>

Compound 93 (yield 24%) was synthesized in the same manner as in Synthesis Example 1-(3), except that Intermediate 12-c was used instead of Intermediate 1-b.
MS (MALDI-TOF): m/z 401.20 [M$^+$]

Examples 1 to 24: Fabrication of Organic Electroluminescent Devices

ITO glass was patterned to have a light emitting area of 2 mm×2 mm, followed by cleaning. After the cleaned ITO glass was mounted in a vacuum chamber, DNTPD (700 Å) and α-NPD (300 Å) were deposited in this order on the ITO glass. The host compound and the dopant compound shown in Table 1 were mixed in a weight ratio of 97:3. The mixture was used to form a 250 Å thick light emitting layer. Thereafter, the compound of Formula E-1 was used to form a 300 Å thick electron transport layer on the light emitting layer. Liq was used to form a 10 Å thick electron injecting layer on the electron transport layer. Al was deposited on the electron injecting layer to form a 1000 Å thick cathode, completing the fabrication of an organic electroluminescent device. The luminescent properties of the organic electroluminescent device were measured at 10 mA/cm$^2$.

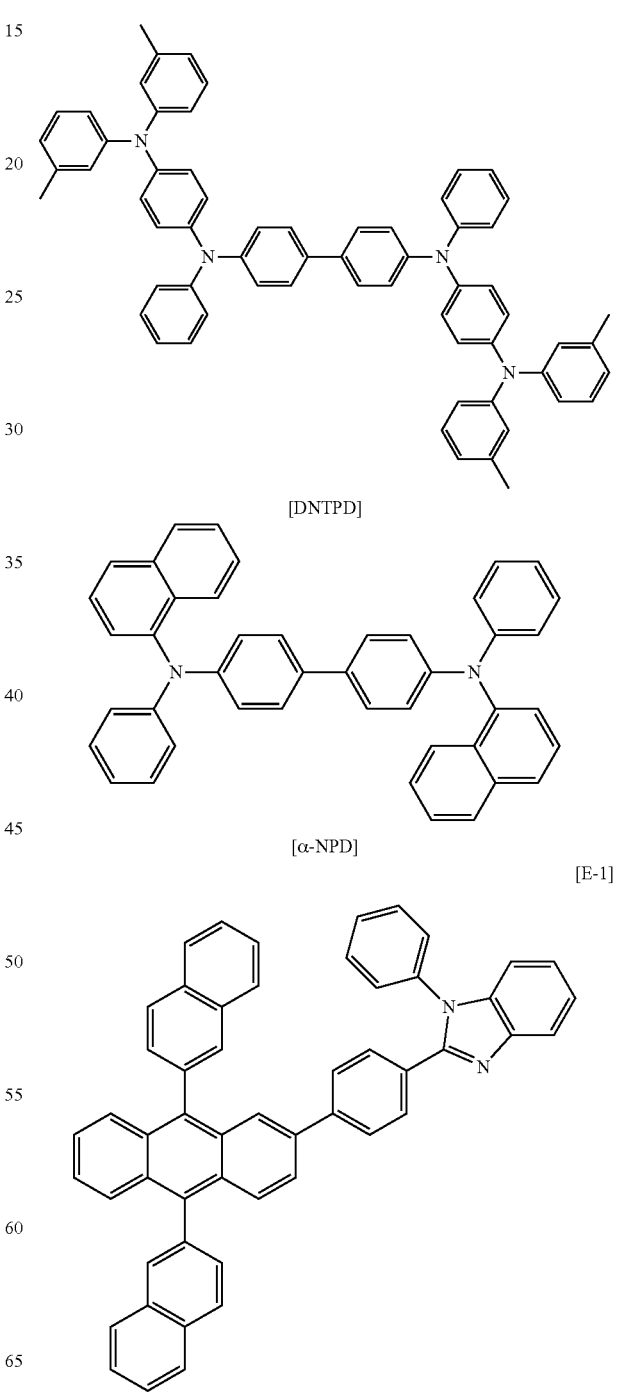

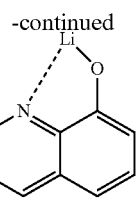

Comparative Examples 1 to 4

Organic electroluminescent devices were fabricated in the same manner as in Examples 1-24, except that BD1 or BD2 was used instead of the dopant compound. The luminescent properties of the organic electroluminescent devices were measured at 10 mA/cm$^2$. The structures of BD1 and BD2 are as follow:

[BD1]

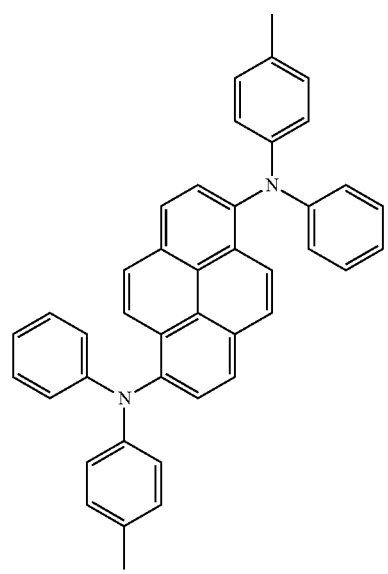

[BD2]

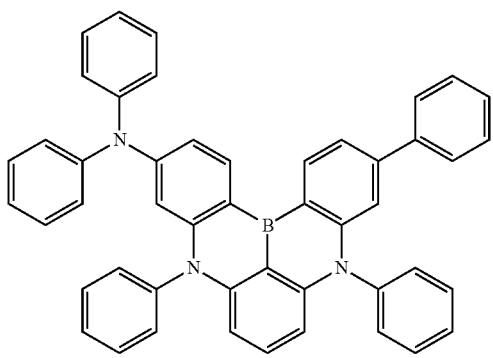

TABLE 1

| Example No. | Host | Dopant | EQE | T97 (h) |
|---|---|---|---|---|
| Example 1 | H128 | 1 | 9.1 | 164 |
| Example 2 | H244 | 1 | 9.4 | 172 |
| Example 3 | H128 | 8 | 9.0 | 168 |
| Example 4 | H244 | 8 | 9.3 | 170 |
| Example 5 | H128 | 12 | 9.1 | 150 |
| Example 6 | H244 | 12 | 9.3 | 165 |
| Example 7 | H128 | 40 | 9.1 | 155 |
| Example 8 | H244 | 40 | 9.4 | 170 |
| Example 9 | H128 | 63 | 8.8 | 142 |
| Example 10 | H244 | 63 | 9.0 | 151 |
| Example 11 | H128 | 71 | 8.9 | 140 |
| Example 12 | H244 | 71 | 9.1 | 149 |
| Example 13 | H128 | 89 | 9.1 | 134 |
| Example 14 | H244 | 89 | 9.4 | 156 |
| Example 15 | H128 | 101 | 9.0 | 177 |
| Example 16 | H244 | 101 | 9.3 | 192 |
| Example 17 | H128 | 111 | 9.1 | 148 |
| Example 18 | H244 | 111 | 9.4 | 166 |
| Example 19 | H128 | 123 | 9.2 | 170 |
| Example 20 | H244 | 123 | 9.5 | 183 |
| Example 21 | H128 | 133 | 9.3 | 181 |
| Example 22 | H244 | 133 | 9.7 | 190 |
| Example 23 | H128 | 93 | 8.8 | 144 |
| Example 24 | H244 | 93 | 9.0 | 152 |
| Comparative Example 1 | H128 | BD1 | 5.7 | 80 |
| Comparative Example 2 | H244 | BD1 | 6.0 | 87 |
| Comparative Example 3 | H128 | BD2 | 7.4 | 90 |
| Comparative Example 4 | H244 | BD2 | 7.5 | 94 |

As can be seen from the results in Table 1, the devices of Examples 1-24, each of which employed the inventive compound for the light emitting layer, showed high external quantum efficiency and significantly improved life characteristics compared to the devices of Comparative Examples 1-4.

INDUSTRIAL APPLICABILITY

The organic electroluminescent device of the present invention can find useful applications in a variety of displays due to its high color purity, high luminous efficiency, and significantly improved lifetime.

The invention claimed is:
1. An organic electroluminescent compound represented by Formula A:

[Formula A]

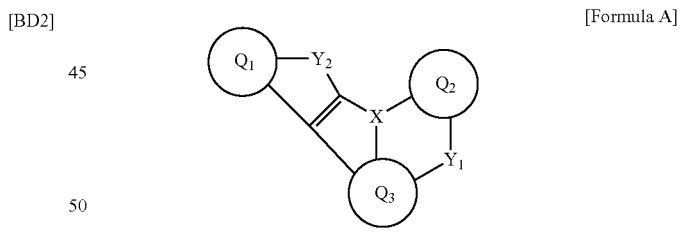

wherein $Q_1$ to $Q_3$ are identical to or different from each other and are each independently a substituted or unsubstituted $C_6$-$C_{50}$ aromatic hydrocarbon ring or a substituted or unsubstituted $C_2$-$C_{50}$ aromatic heterocyclic ring, X is B, $Y_1$ is a single bond or is selected from the group consisting of $NR_1$, $CR_2R_3$, O, S, and $SiR_4R_5$, $Y_2$ is selected from the group consisting of $NR_6$, $CR_7R_8$, O, S, and $SiR_9R_{10}$, and $R_1$ to $R_{10}$ are identical to or different from each other and are each independently selected from the group consisting of hydrogen, deuterium, substituted or unsubstituted $C_1$-$C_{30}$ alkyl, substituted or unsubstituted $C_2$-$C_{30}$ alkenyl, substituted or unsubstituted $C_2$-$C_{39}$ alkynyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that $R_1$ to $R_{10}$ are optionally bonded to each other or each of $R_1$ to $R_{10}$ is optionally bonded to one or more of the rings $Q_1$ to $Q_3$ to form an alicyclic or aromatic monocyclic or polycyclic ring, $R_2$ and $R_3$ are optionally linked together to form an alicyclic or aromatic monocyclic or polycyclic ring, $R_4$ and $R_5$ are optionally linked together to form an alicyclic or aromatic monocyclic or polycyclic ring, $R_7$ and $R_8$ are optionally linked together to form an alicyclic or aromatic monocyclic or polycyclic ring, and $R_9$ and $R_{10}$ are optionally linked together to form an alicyclic or aromatic monocyclic or polycyclic ring, or Formula B:

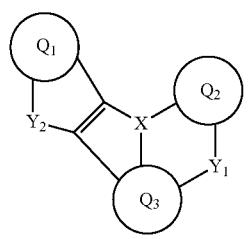

[Formula B]

wherein $Q_1$ to $Q_3$, X, $Y_1$, and $Y_2$ are as defined in Formula A.

2. The organic electroluminescent compound according to claim 1, wherein the organic electroluminescent compound of Formula A or B is represented by Formula A-1:

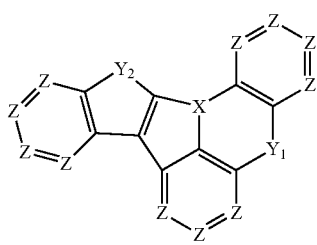

[Formula A-1]

wherein each Z is independently CR or N, each R is independently selected from the group consisting of hydrogen, deuterium, substituted or unsubstituted $C_1$-$C_{30}$ alkyl, substituted or unsubstituted $C_2$-$C_{30}$ alkenyl, substituted or unsubstituted $C_2$-$C_{30}$ alkynyl, substituted or unsubstituted $C_6$—$O_{50}$ aryl, substituted or unsubstituted $C_3$-$C_{30}$ cycloalkyl, substituted or unsubstituted $C_2$—$O_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_4$-$C_{30}$ arylheteroarylamine, substituted or unsubstituted $C_1$-$C_{30}$ alkylsilyl, substituted or unsubstituted $C_5$-$C_{30}$ arylsilyl, nitro, cyano, and halogen, with the proviso that the groups R are optionally bonded to each other to form an alicyclic or aromatic monocyclic or polycyclic ring or each of the groups R is optionally linked to an adjacent substituent to form an alicyclic or aromatic monocyclic or polycyclic ring and that the alicyclic or aromatic monocyclic or polycyclic ring is optionally interrupted by one or more heteroatoms selected from the group consisting of N, S, and O, and X, $Y_1$, and $Y_2$ are as defined in claim 1, or Formula B-1:

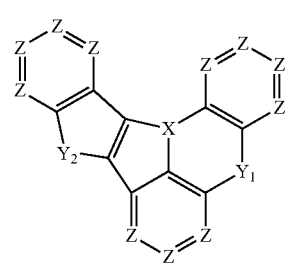

[Formula B-1]

wherein X, $Y_1$, $Y_2$, and Z are as defined in claim 1.

3. An organic electroluminescent device comprising a first electrode, a second electrode opposite to the first electrode, and one or more organic layers interposed between the first and second electrodes wherein at least one of the one or more organic layers comprises the organic electroluminescent compound represented by Formula A or B according to claim 1.

4. The organic electroluminescent device according to claim 3, wherein the one or more organic layers comprise at least one layer selected from the group consisting of a hole injecting layer, a hole transport layer, a hole blocking layer, a light emitting layer, an electron blocking layer, an electron transport layer, and an electron injecting layer.

5. The organic electroluminescent device according to claim 4, wherein the light emitting layer comprises a host and the compound represented by Formula A or B as a dopant.

6. The organic electroluminescent device according to claim 4, wherein each of the one or more organic layers is formed by a deposition or solution process.

7. The organic electroluminescent device according to claim 3, wherein the organic electroluminescent device is used in a display or lighting system selected from the group consisting of flat panel displays, flexible displays, monochromatic flat panel lighting systems, white flat panel lighting systems, flexible monochromatic lighting systems, and flexible white lighting systems.

8. An organic electroluminescent compound selected from the group consisting of the following compounds 1 to 152:

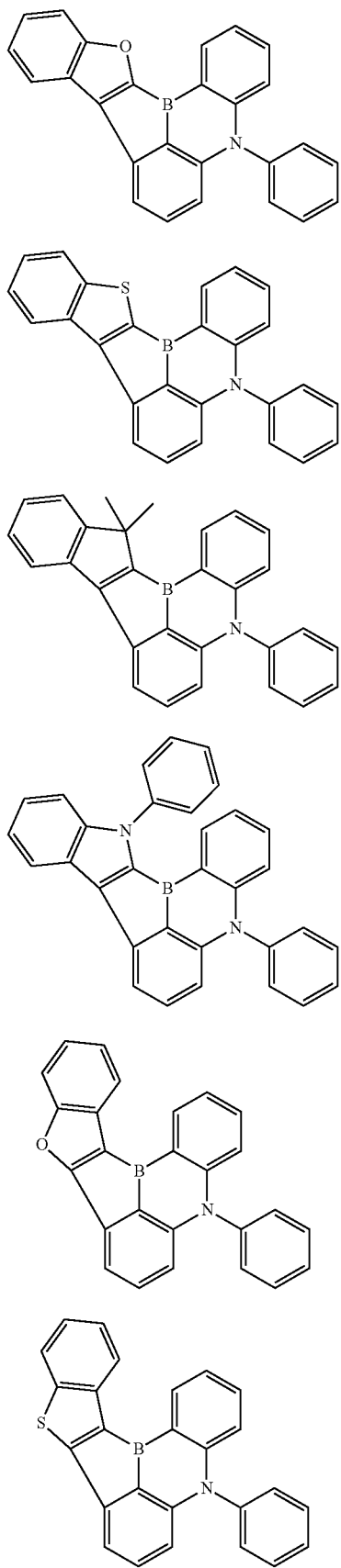
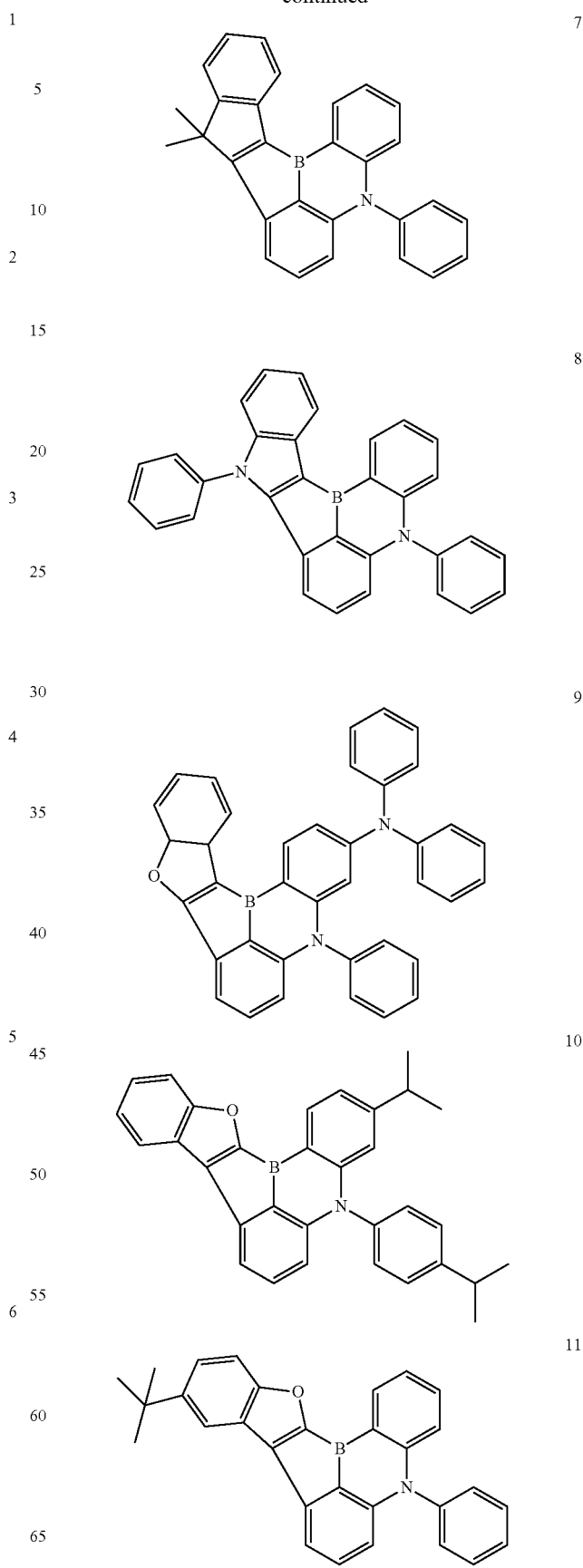

12
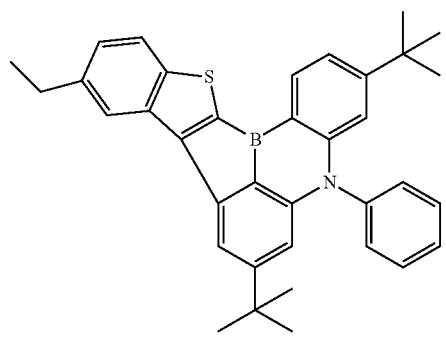
13
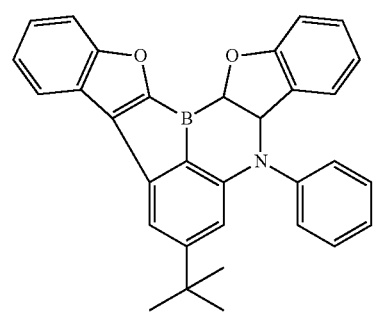
14
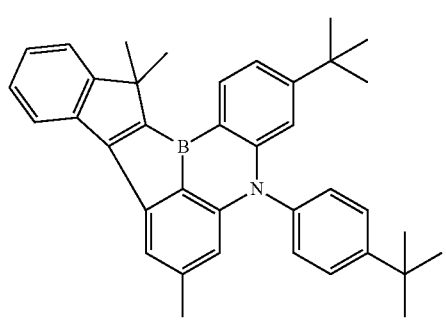
15
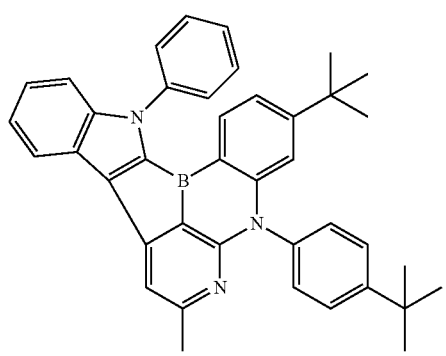
16
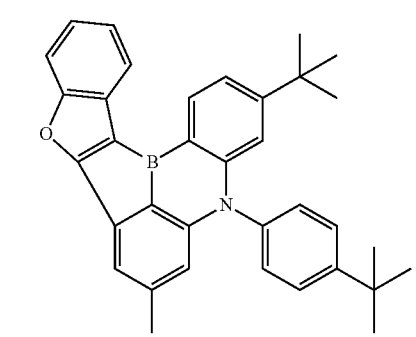
17
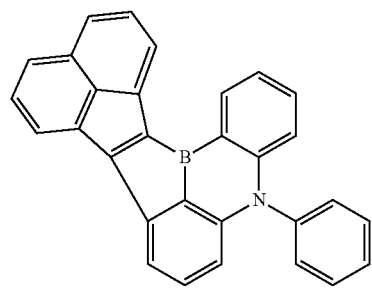
18
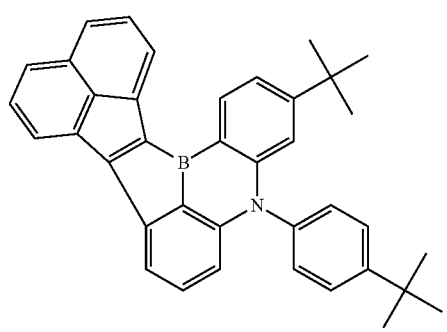
19
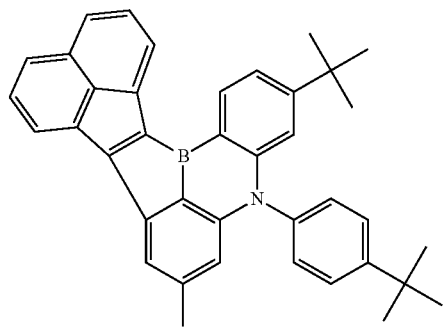
20
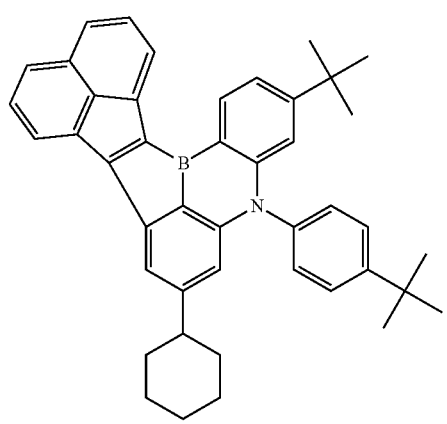

21
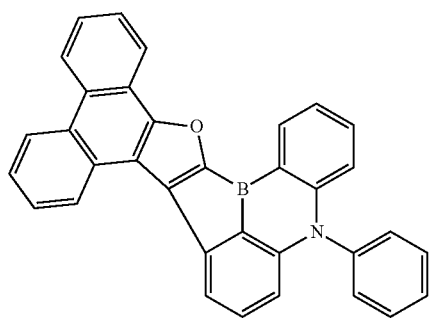
22
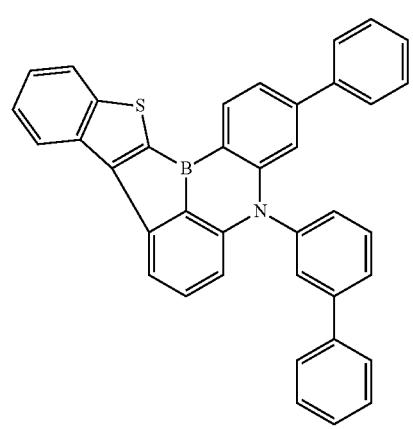
23
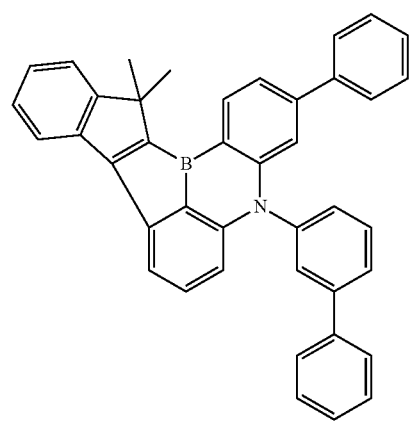
24
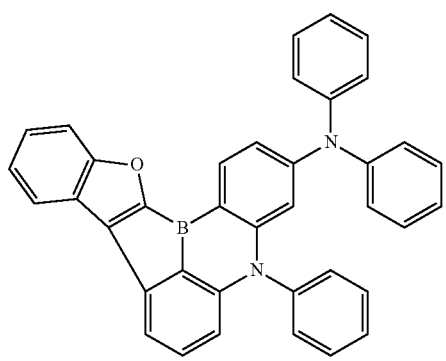
25
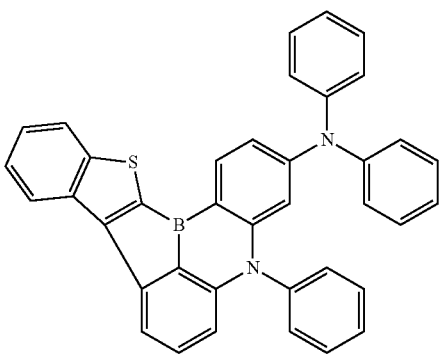
26
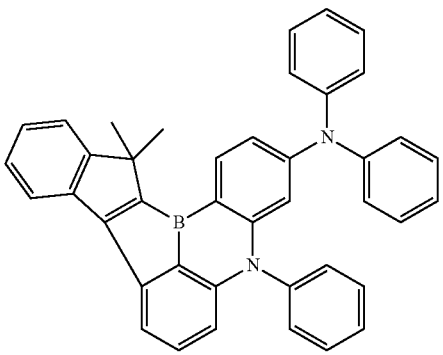
27
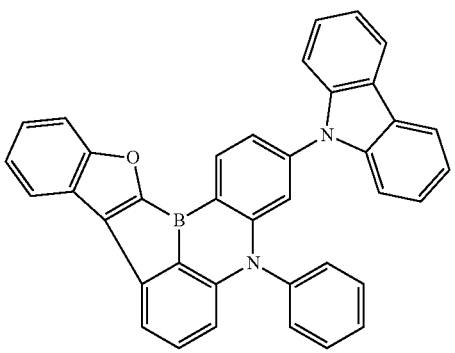
28
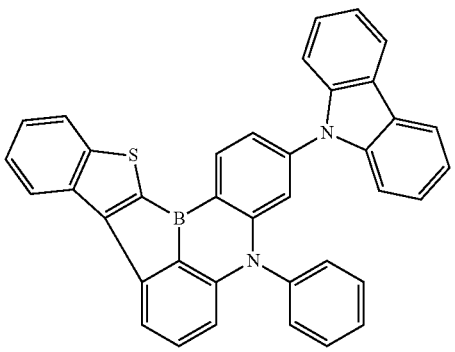

121
-continued
29
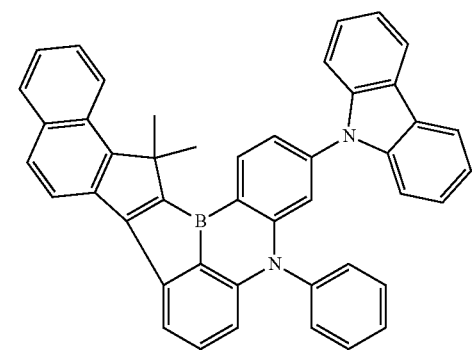
30
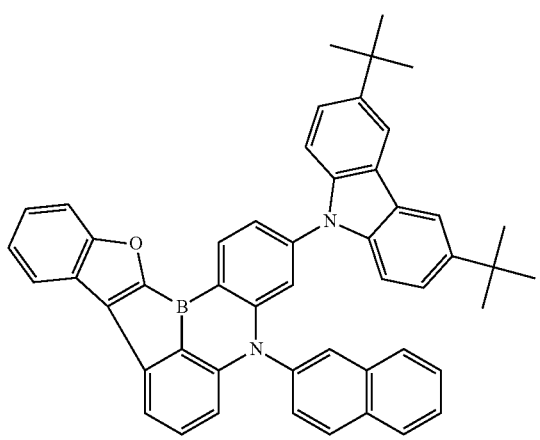
31
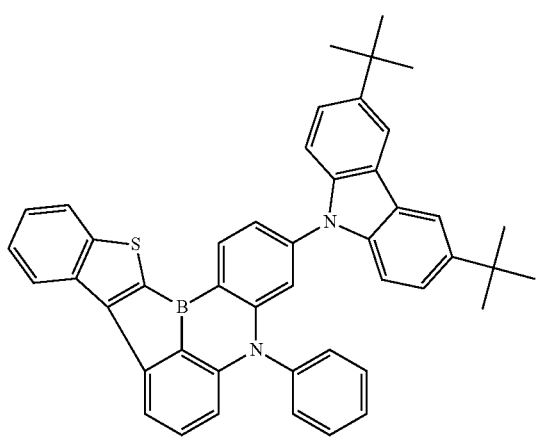
122
-continued
32
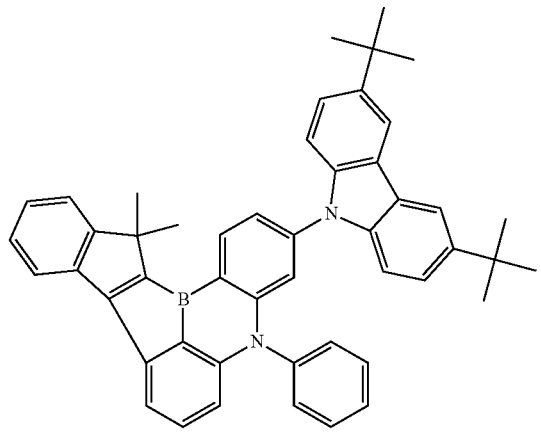
33
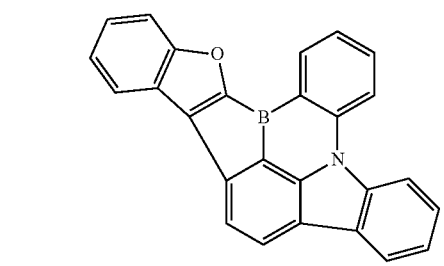
34
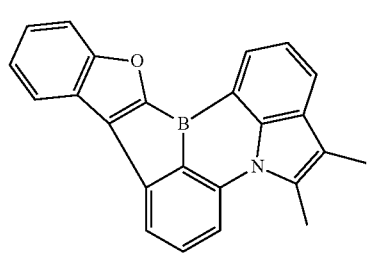
35
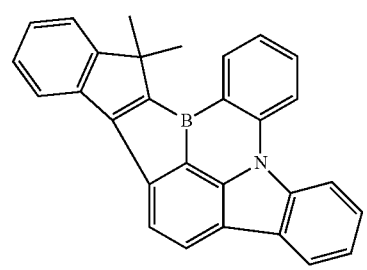
36
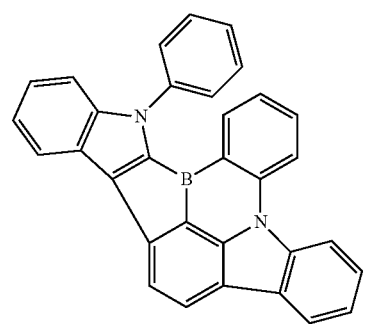

-continued
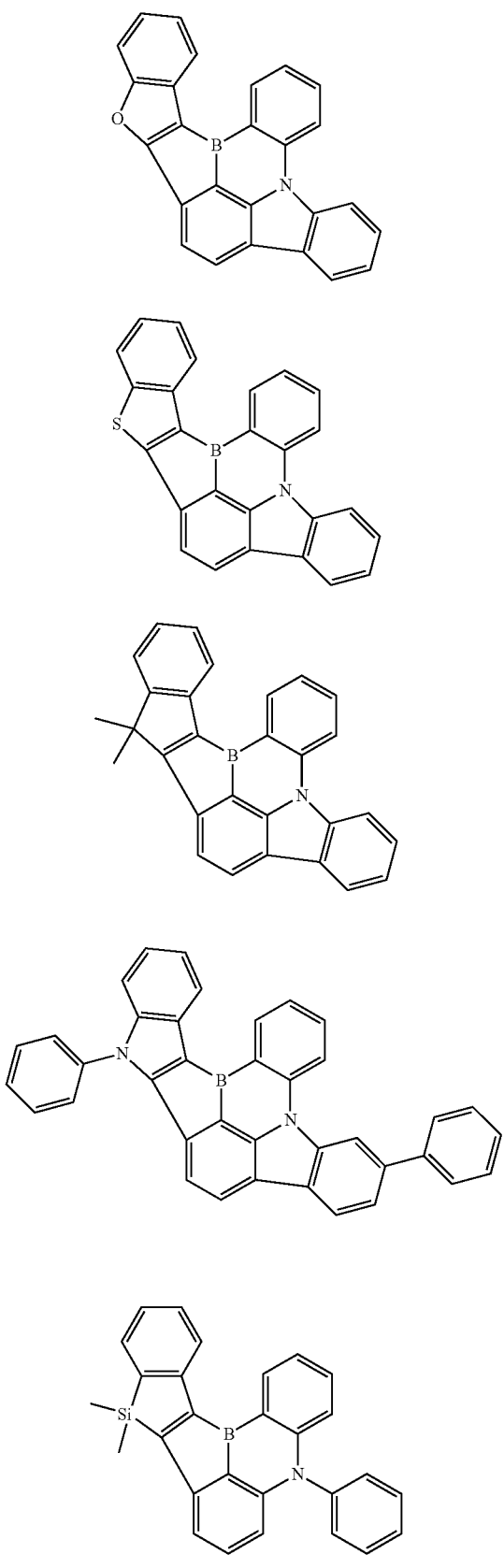
-continued
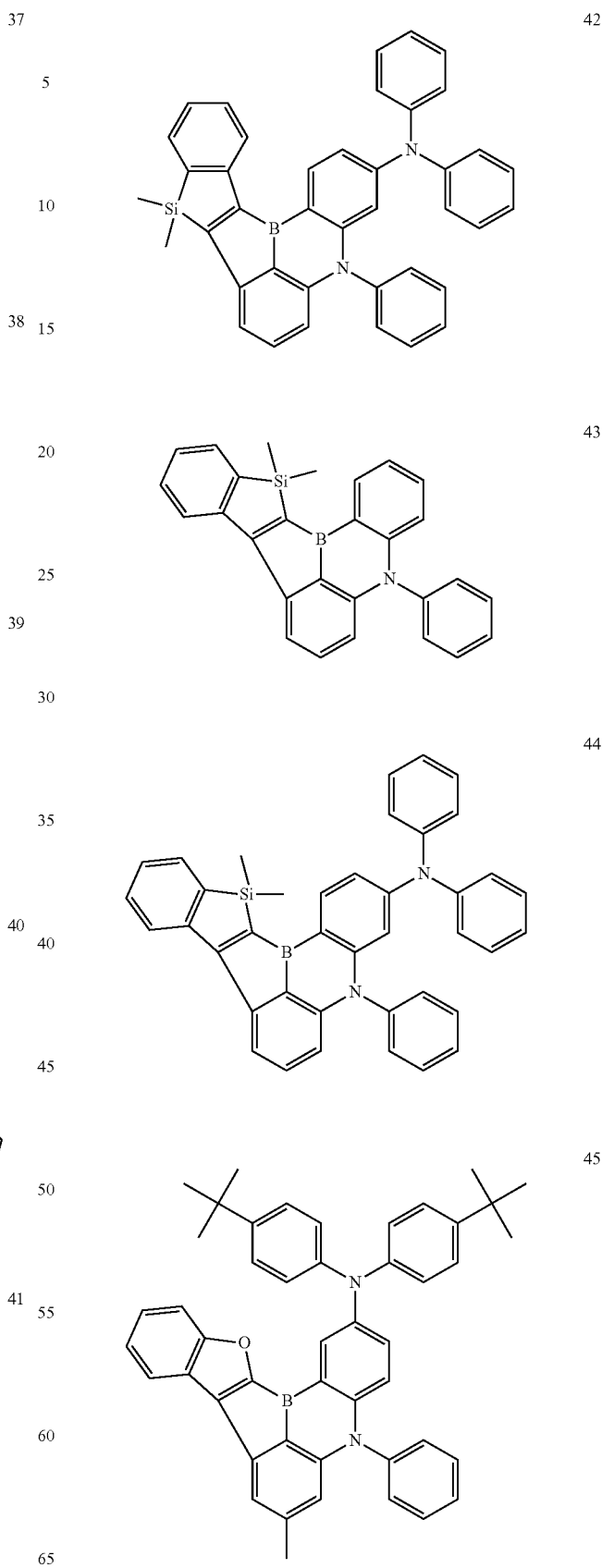

125
-continued
46
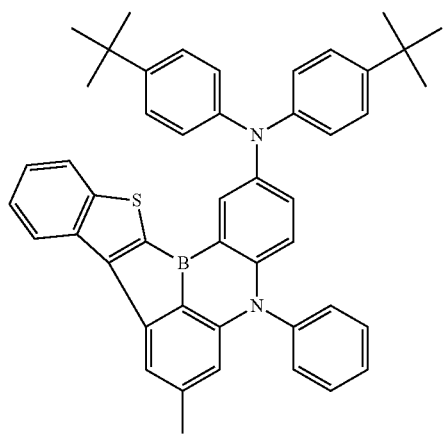
47
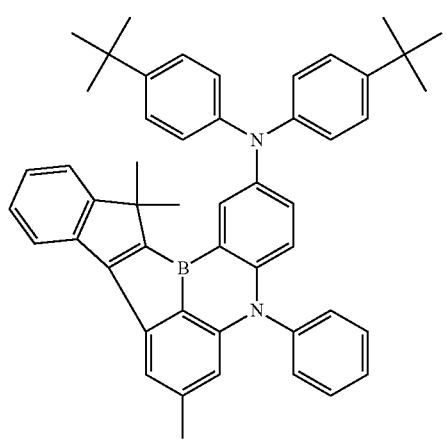
48
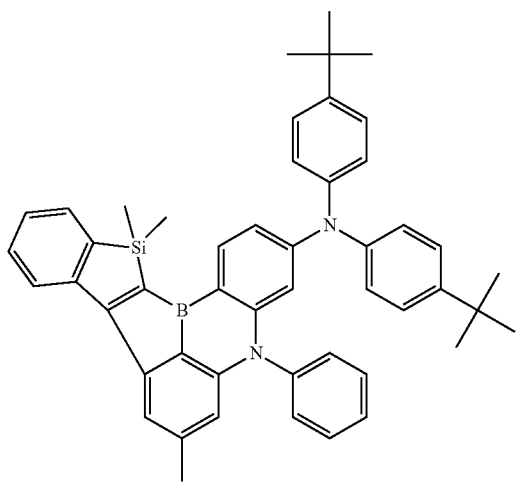
126
-continued
49
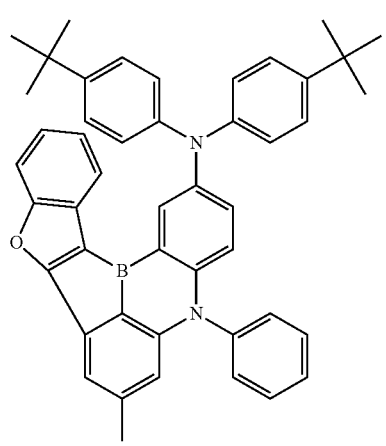
50
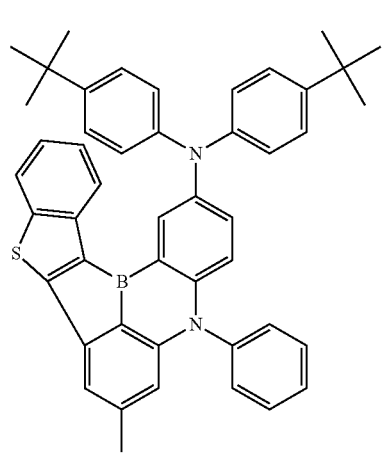
51
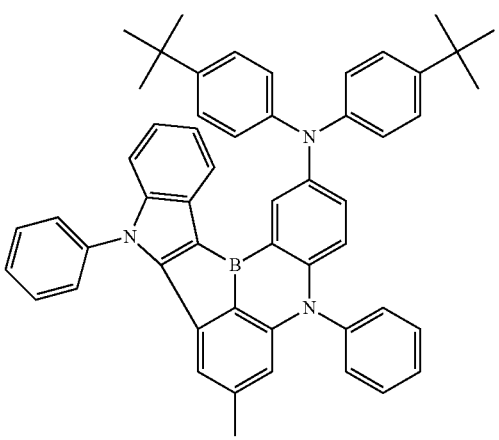

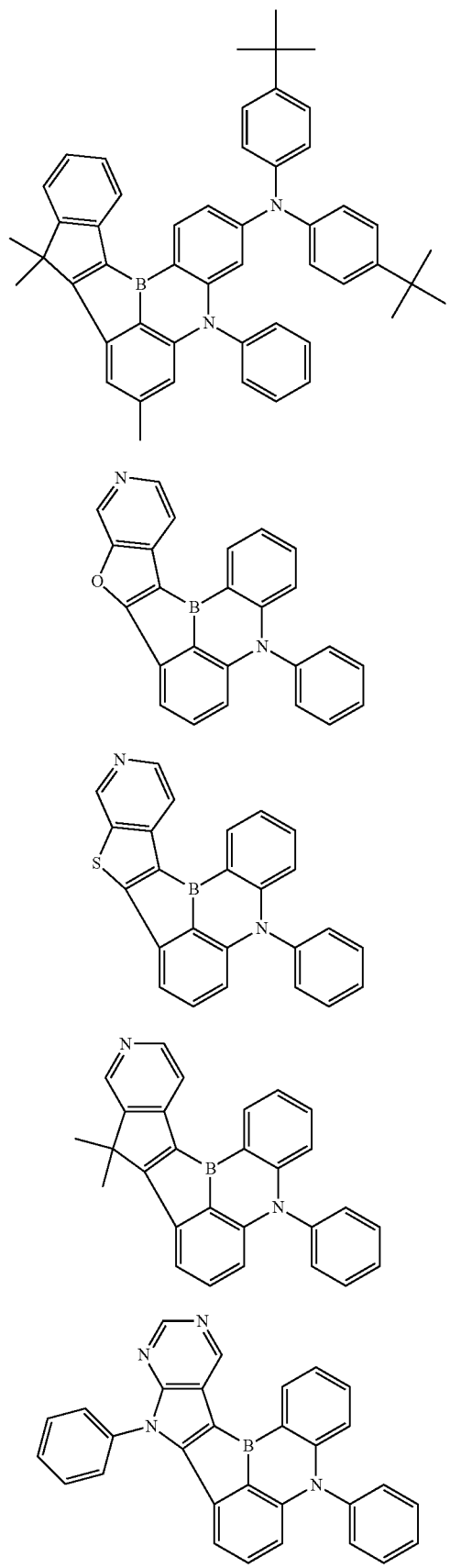
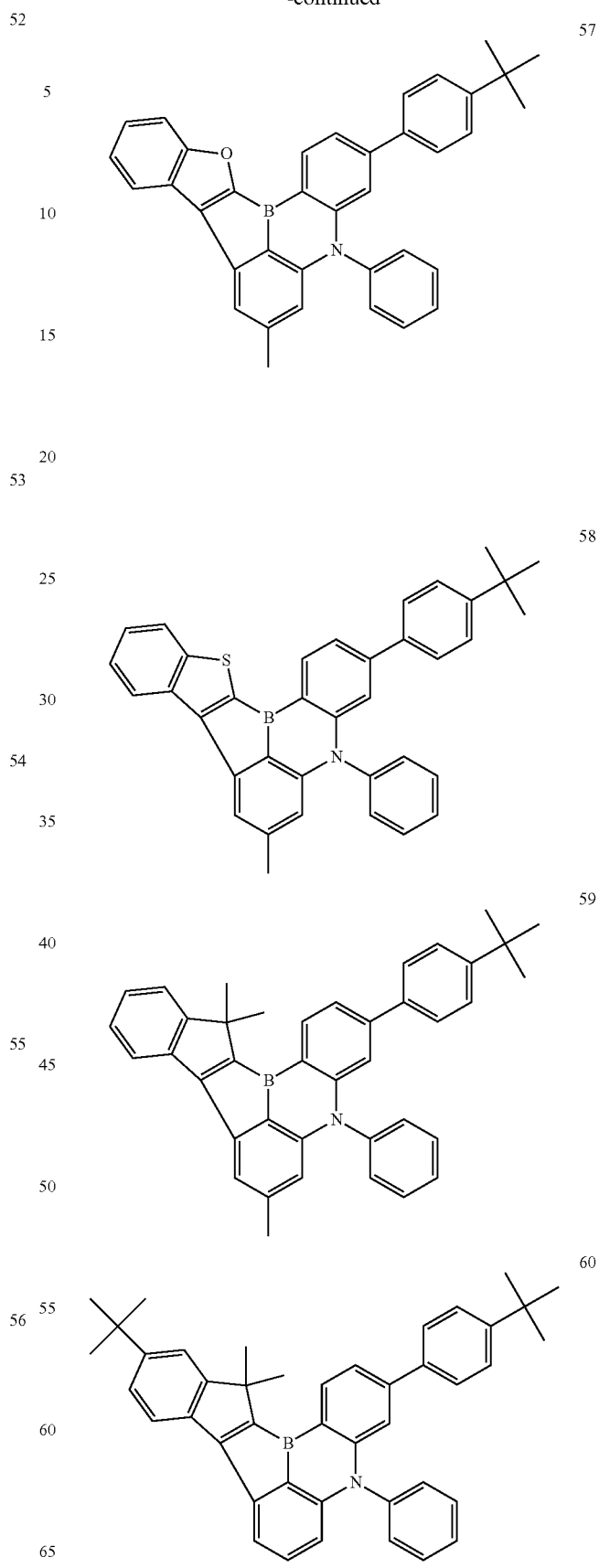

129
-continued
61
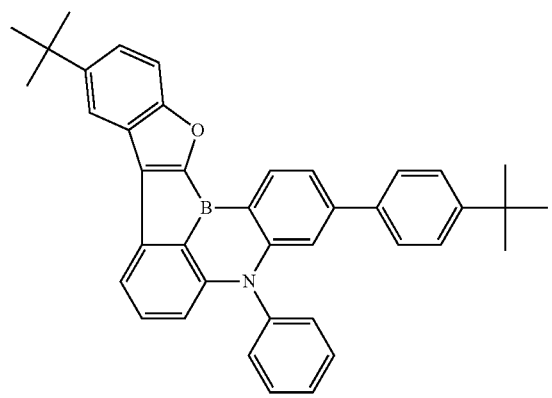
62
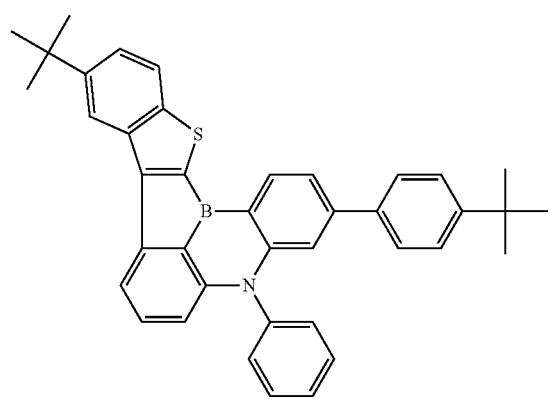
63
64
130
-continued
65
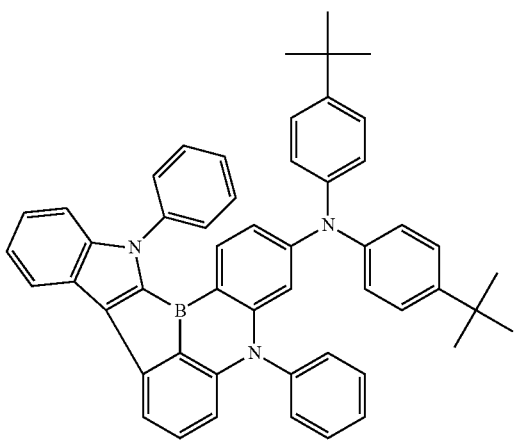
66
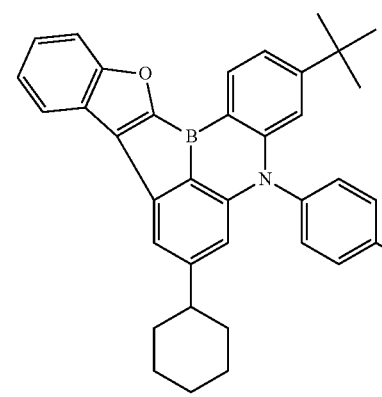
67
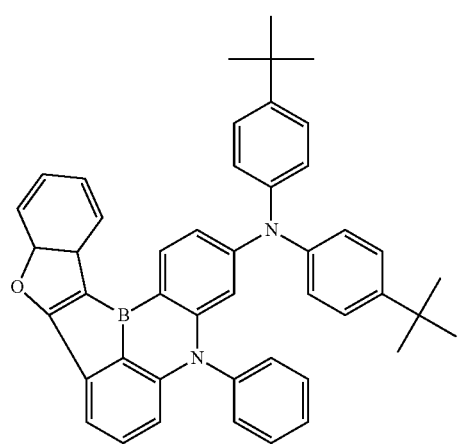

-continued
68
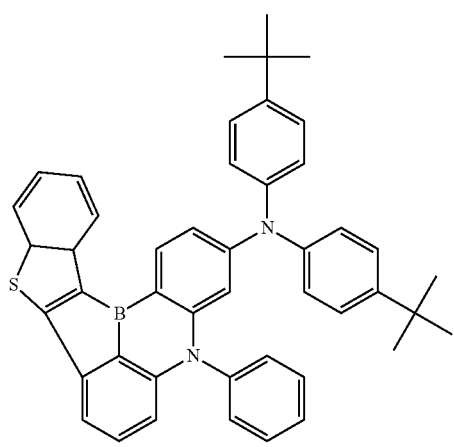
69
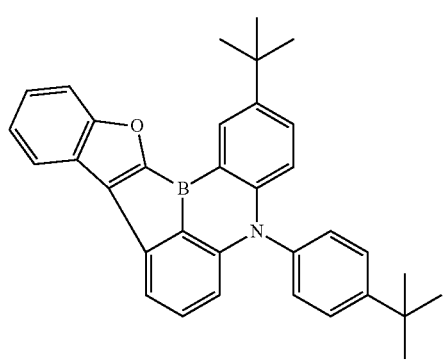
70
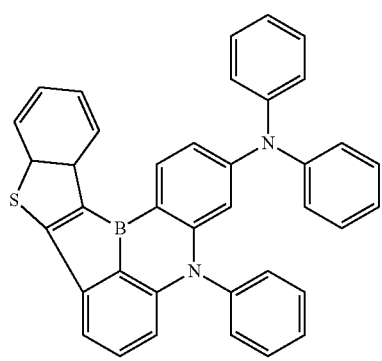
71
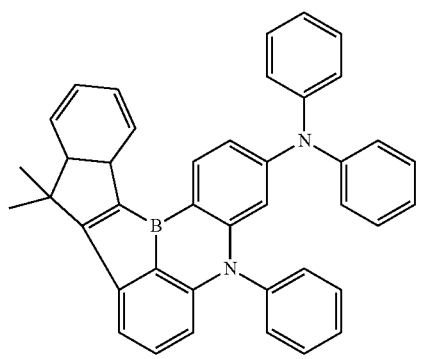
-continued
72
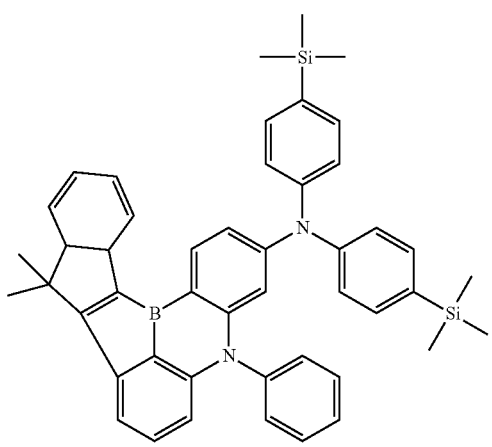
73
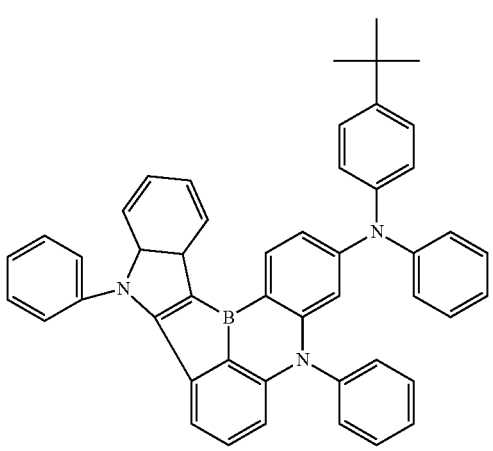
74
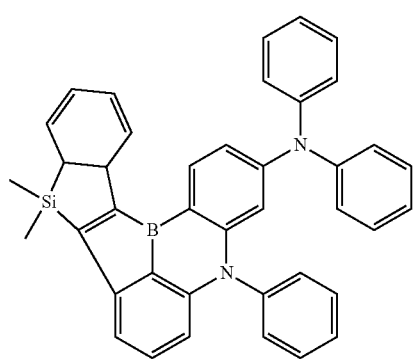

133
-continued
75
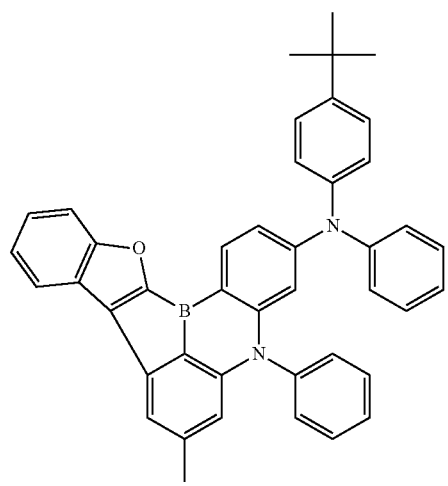
76
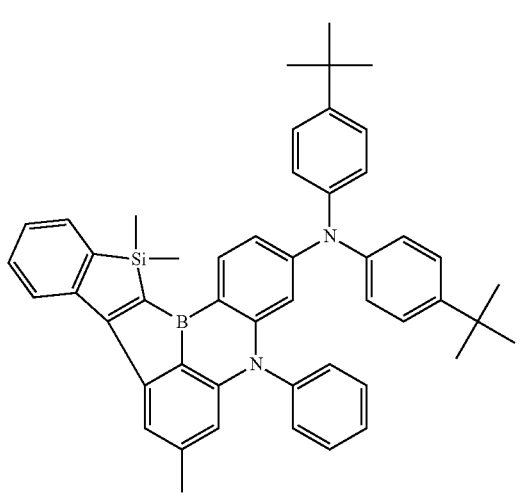
77
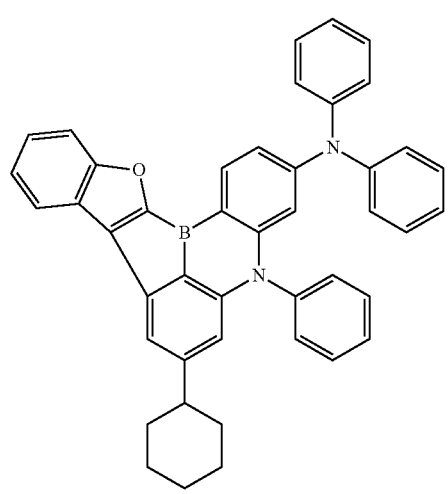
134
-continued
78
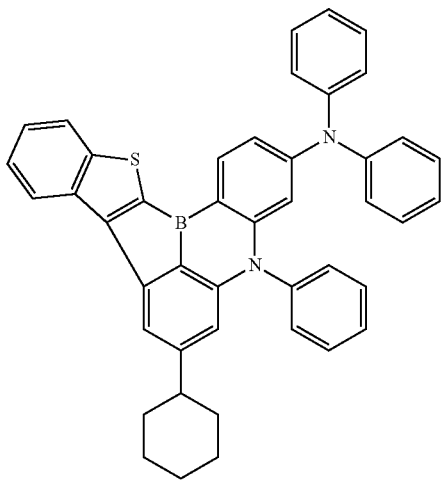
79
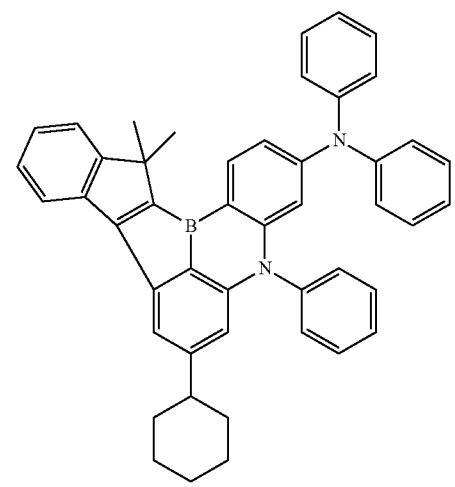
80
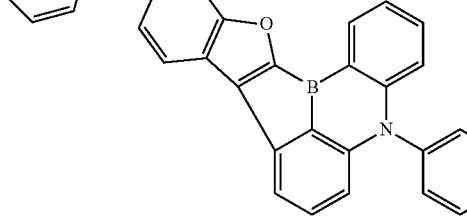
81
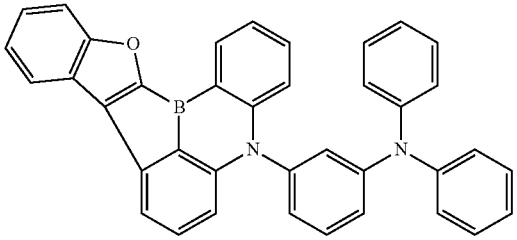

82
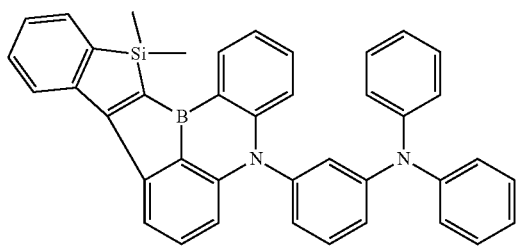
83
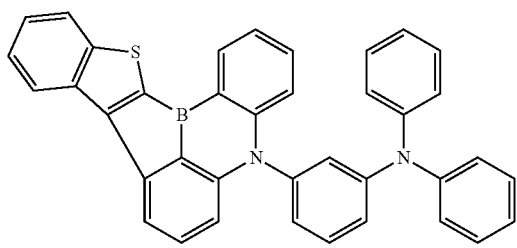
84
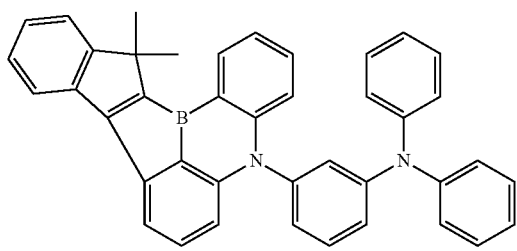
85
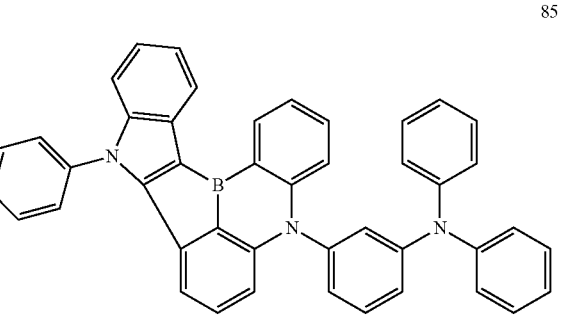
86
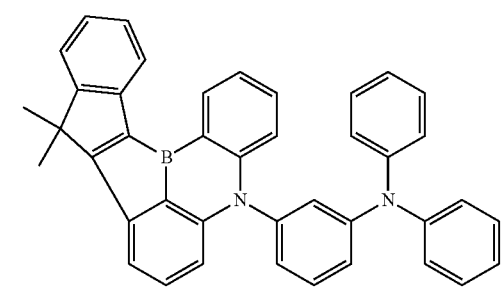
87
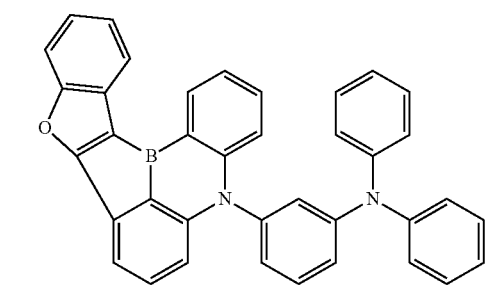
88
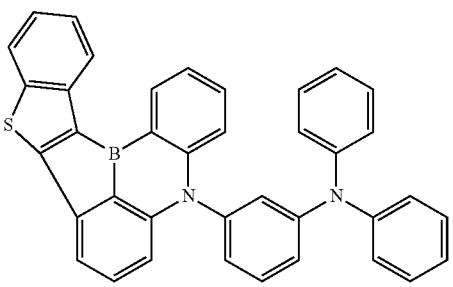
89
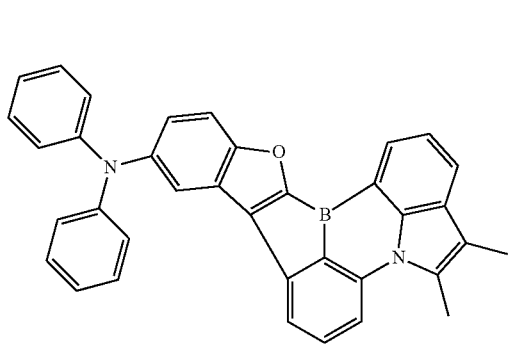
90
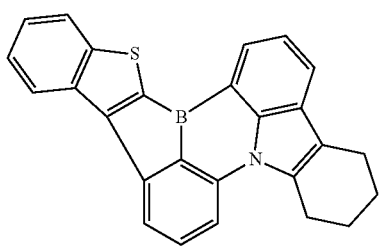
91
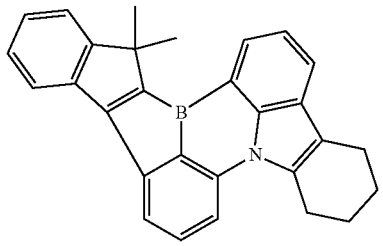
92
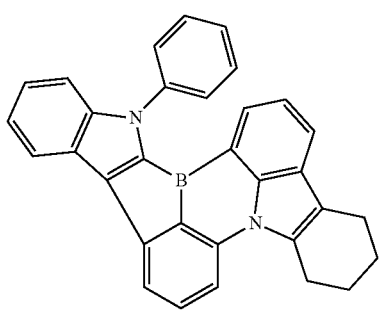

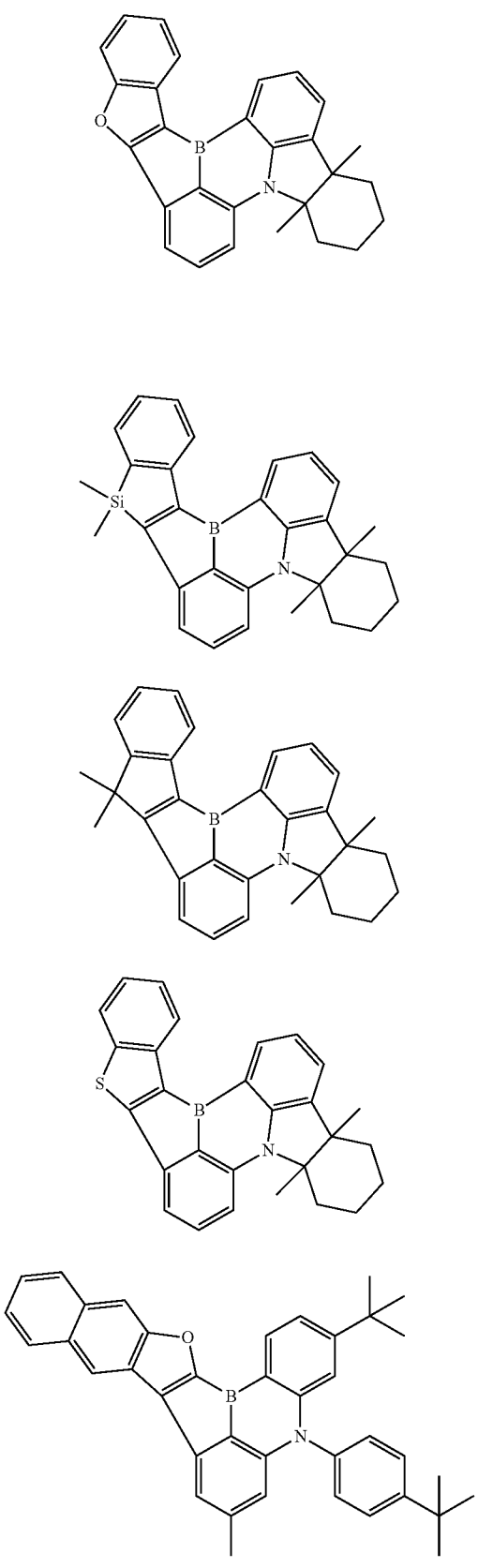
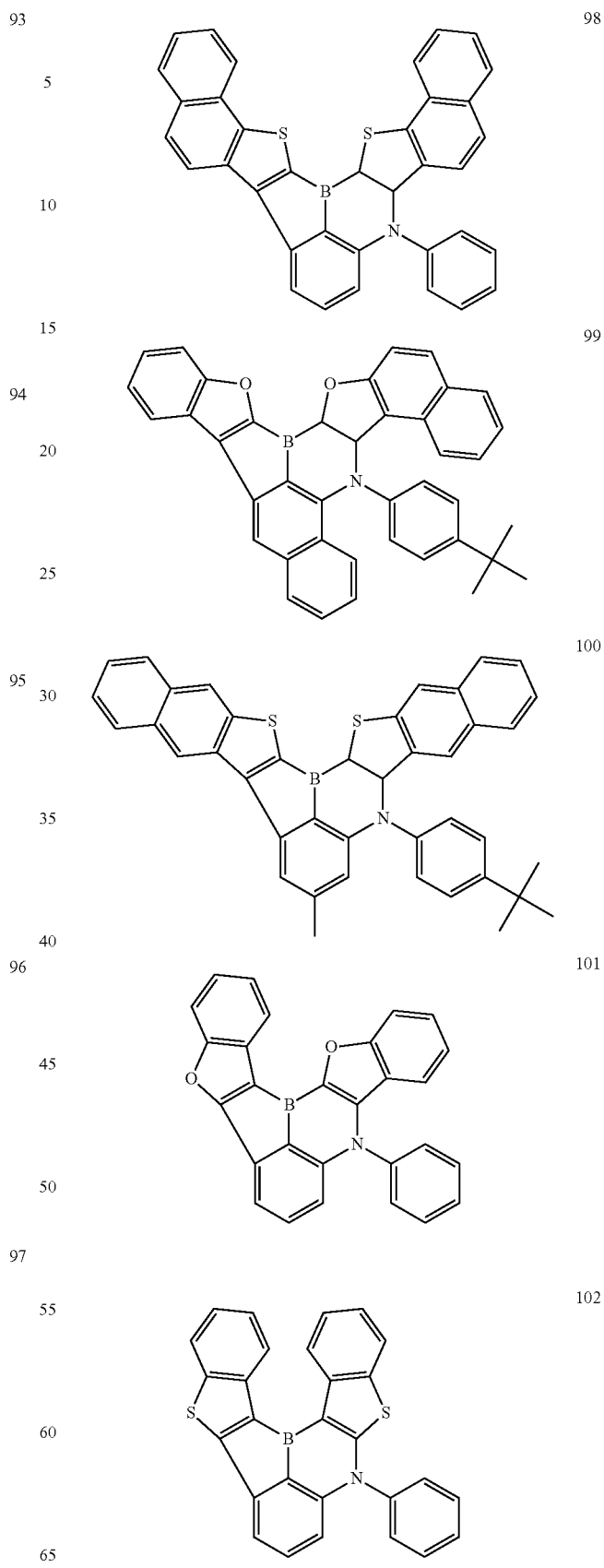

103 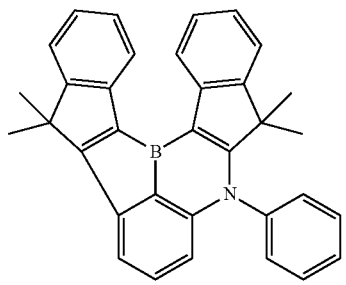
108 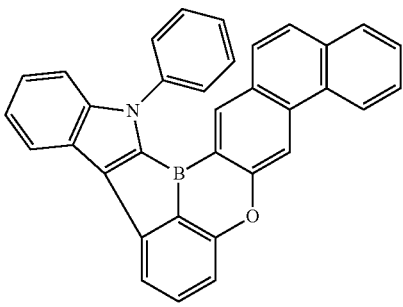
104 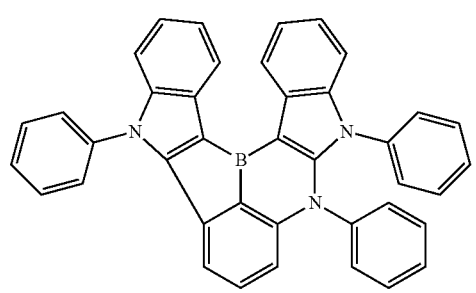
109 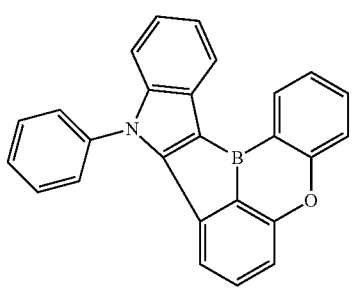
105 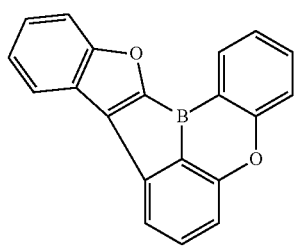
110 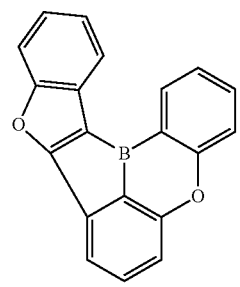
106 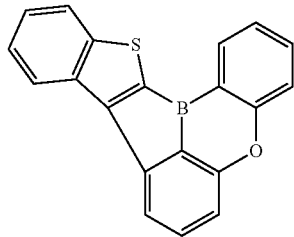
111 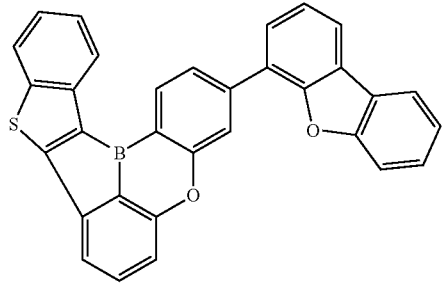
107 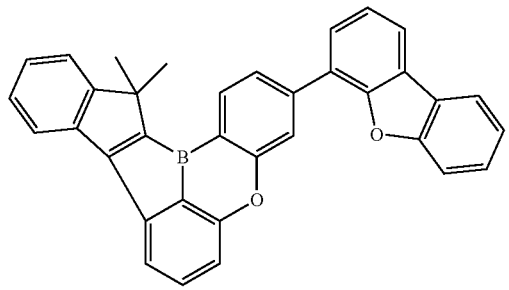
112 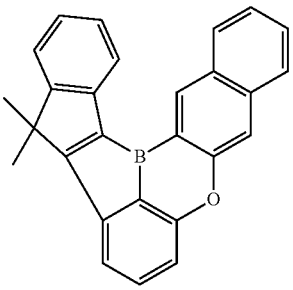

113
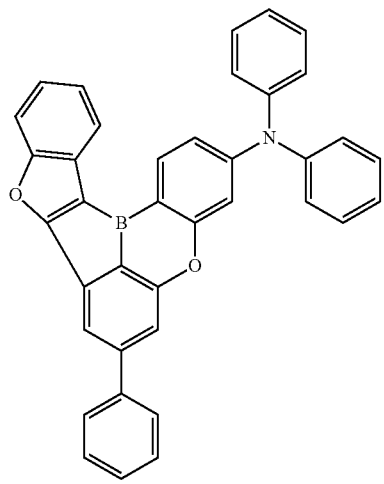
114
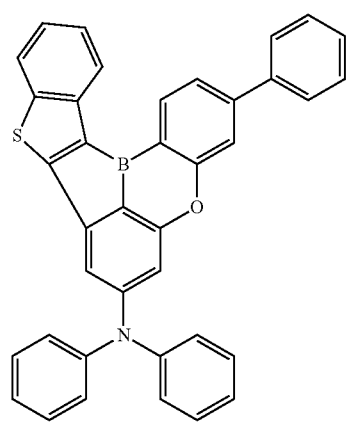
115
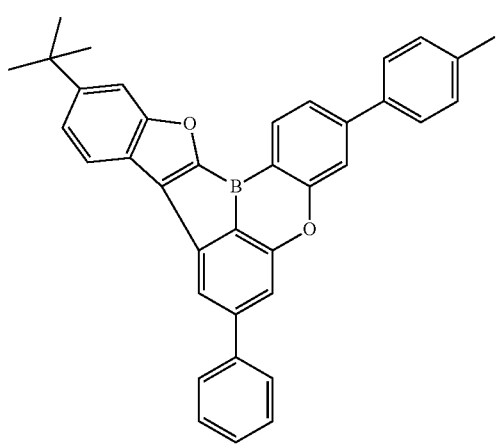
116
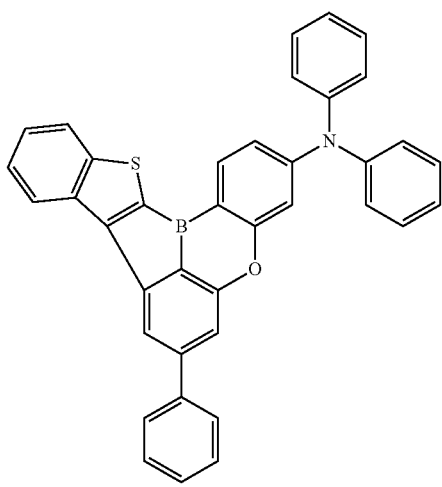
117
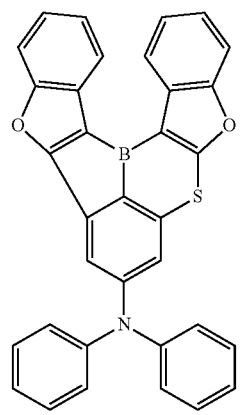
118
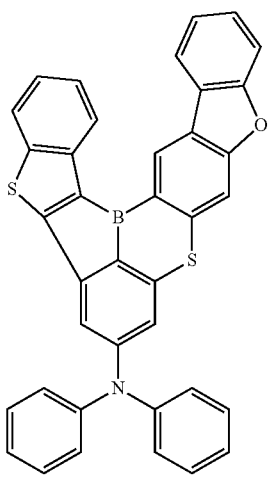

119
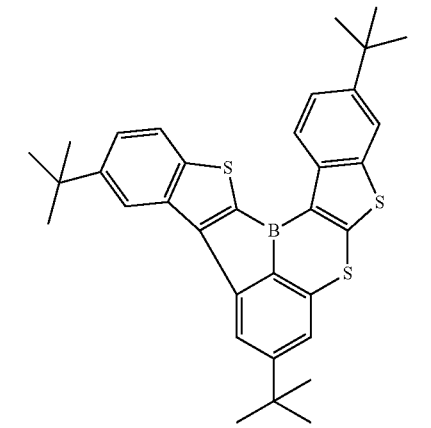
120
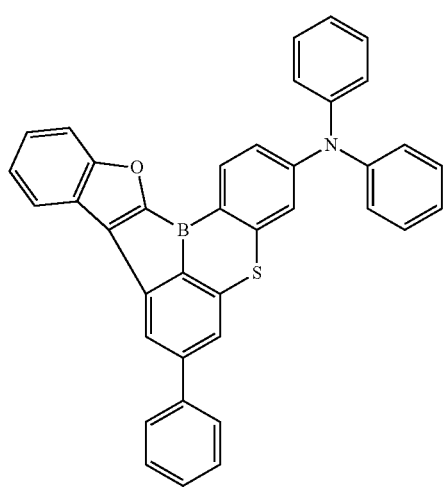
121
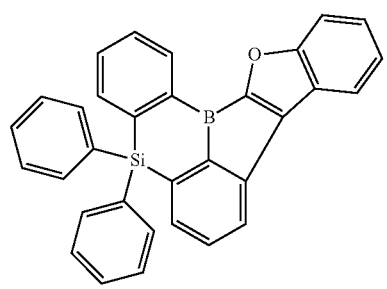
122
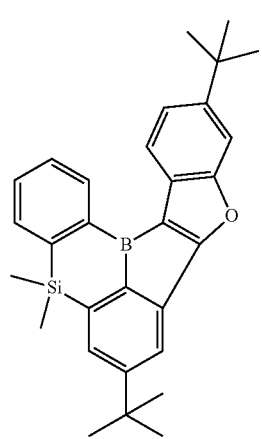
123
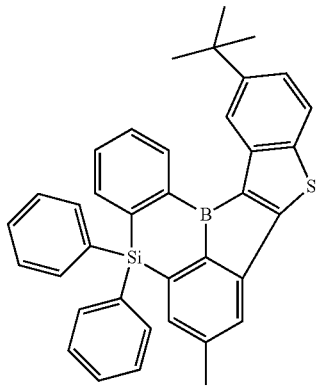
124
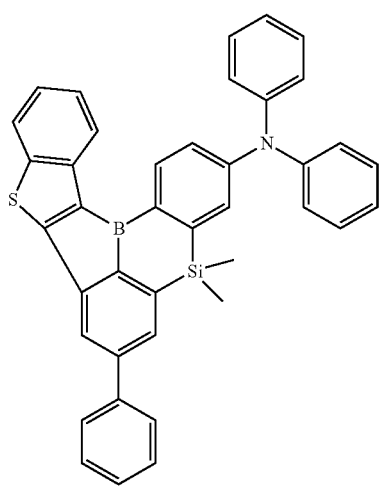
125
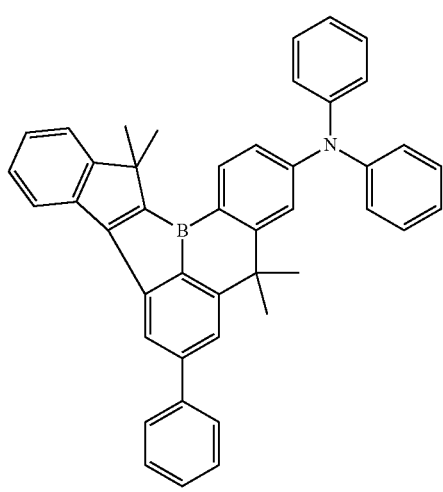

126
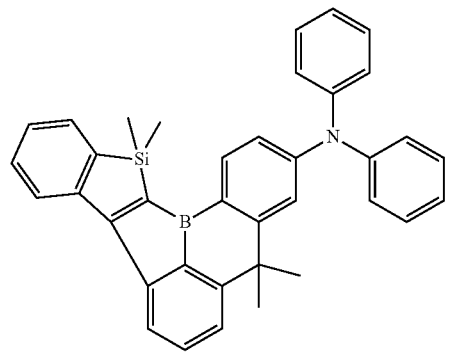
127
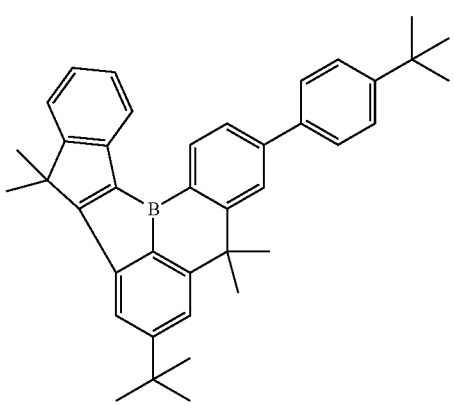
128
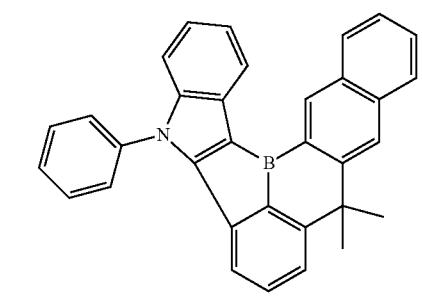
129
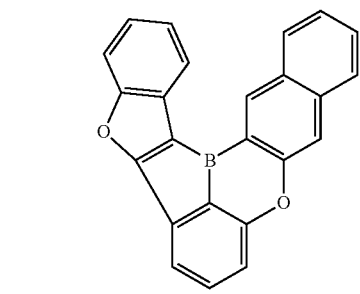
130
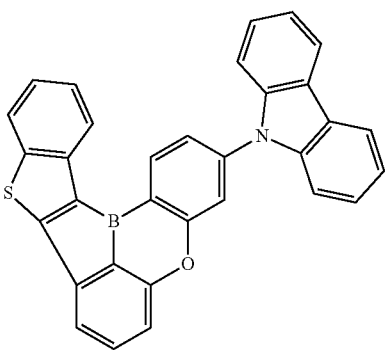
131
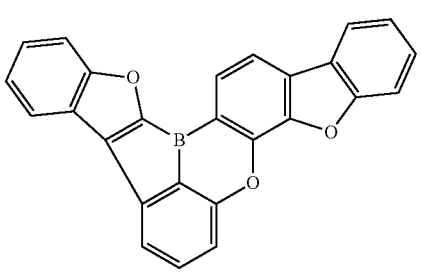
132
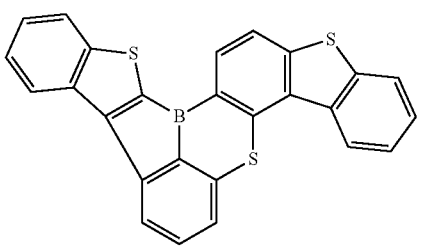
133
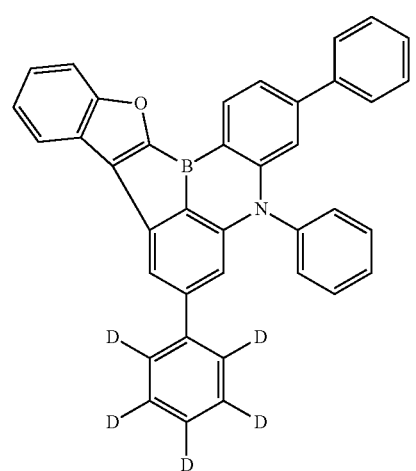

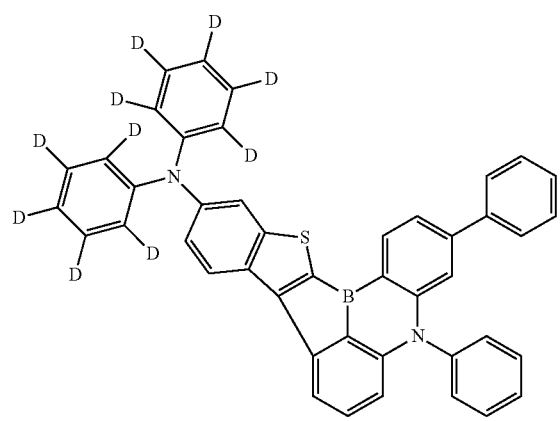
134
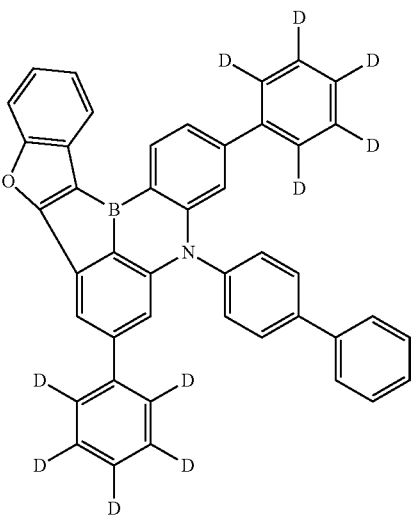
137
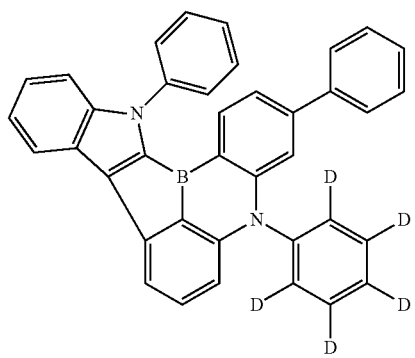
135
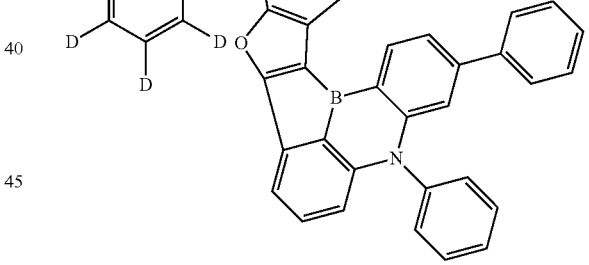
138
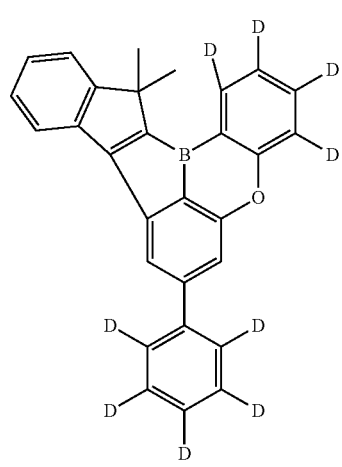
136
139

-continued
140
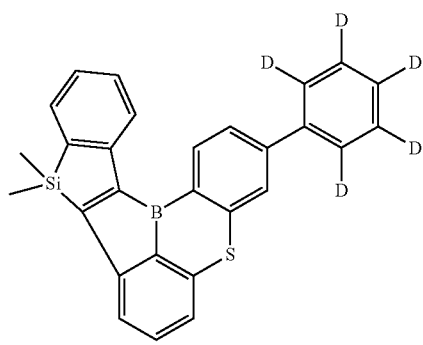
141
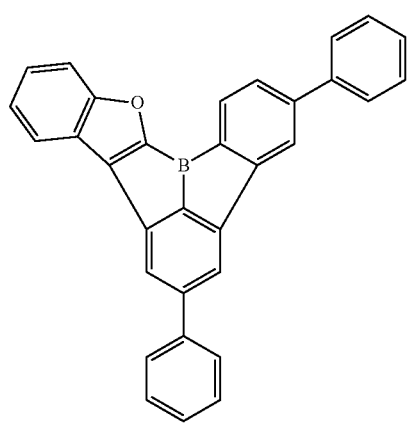
142
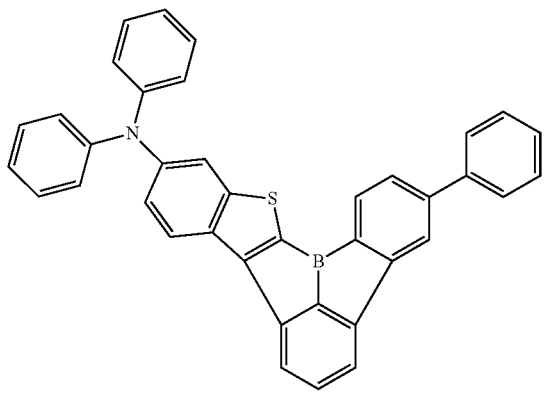
143
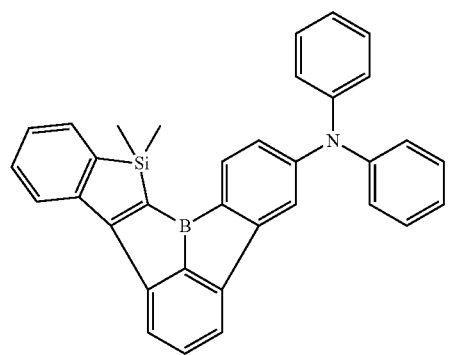
-continued
144
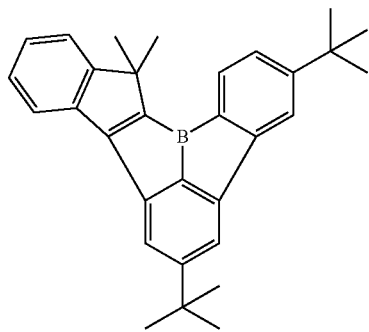
145
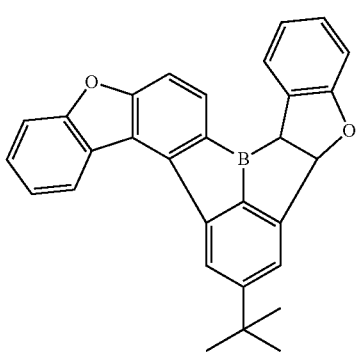
146
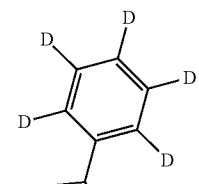
147
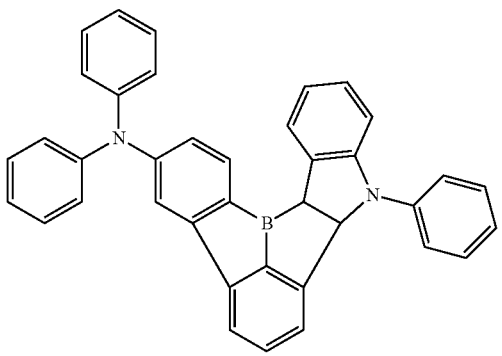

151
-continued

148
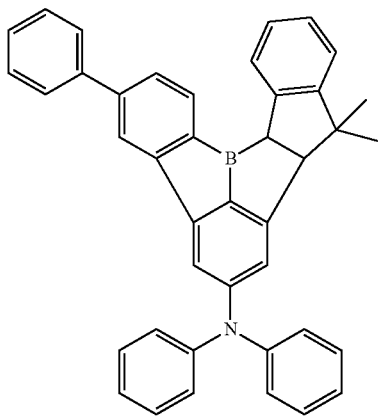

149
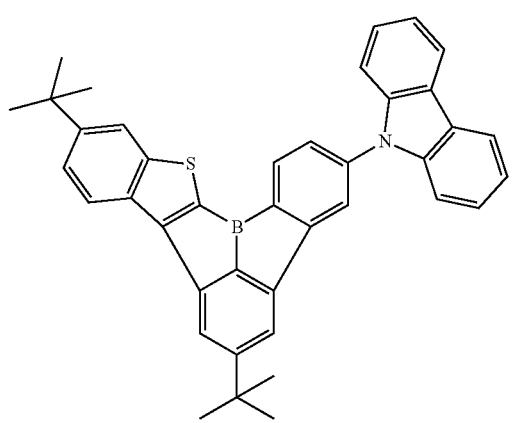

150
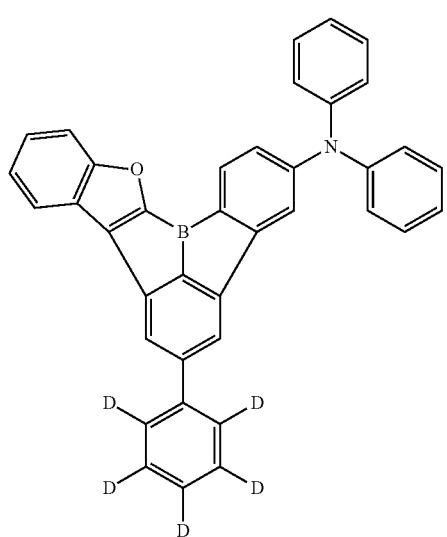

152
-continued

151
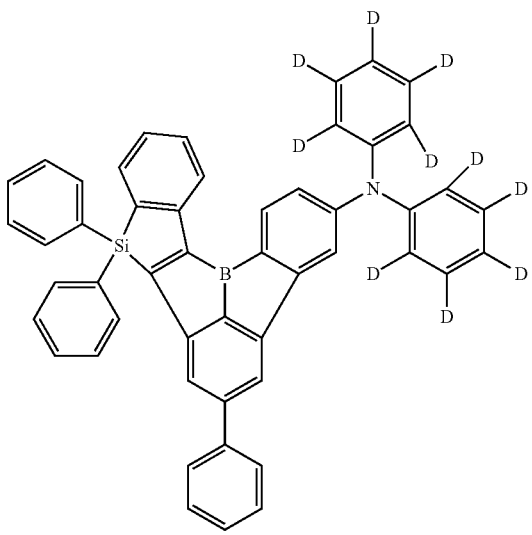

152

9. An organic electroluminescent device comprising a first electrode, a second electrode opposite to the first electrode, and one or more organic layers interposed between the first and second electrodes wherein at least one of the one or more organic layers comprises the organic electroluminescent compound of claim 8.

10. The organic electroluminescent device according to claim 9, wherein the organic layers comprise at least one layer selected from the group consisting of a hole injecting layer, a hole transport layer, a hole blocking layer, a light emitting layer, an electron blocking layer, an electron transport layer, and an electron injecting layer.

11. The organic electroluminescent device according to claim 10, wherein the light emitting layer comprises a host and the compound of claim 8 as a dopant.

12. The organic electroluminescent device according to claim 11, wherein the light emitting layer further comprises a compound represented by Formula H1:

[Formula H1]

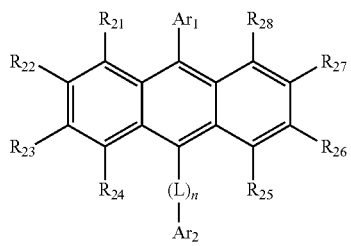

wherein $R_{21}$ to $R_{28}$ are identical to or different from each other and are each independently selected from the group consisting of hydrogen, deuterium, substituted or unsubstituted $C_1$-$C_{30}$ alkyl, substituted or unsubstituted $C_2$-$C_{30}$ alkenyl, substituted or unsubstituted $C_3$-$C_{30}$ cycloalkyl, substituted or unsubstituted $C_5$-$C_{30}$ cycloalkenyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_6$-$C_{50}$ aryl, substituted or unsubstituted $C_2$-$C_{50}$ heteroaryl, substituted or unsubstituted silicon, substituted or unsubstituted boron, substituted or unsubstituted silane, carbonyl, phosphoryl, amino, nitrile, hydroxyl, nitro, halogen, amide, and ester, with the proviso that $R_{21}$ to $R_{28}$ are optionally bonded to each other to form a fused aliphatic, aromatic, heteroaliphatic or heteroaromatic ring or each of $R_{21}$ to $R_{28}$ is optionally linked to an adjacent substituent to form a fused aliphatic, aromatic, heteroaliphatic or heteroaromatic ring, $Ar_1$ and $Ar_2$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, L is a single bond or is substituted or unsubstituted $C_6$-$C_{20}$ arylene or substituted or unsubstituted $C_2$-$C_{20}$ heteroarylene, and n is an integer from 0 to 3.

13. The organic electroluminescent device according to claim 11, wherein the light emitting layer further comprises a compound represented by Formula H2:

[Formula H2]

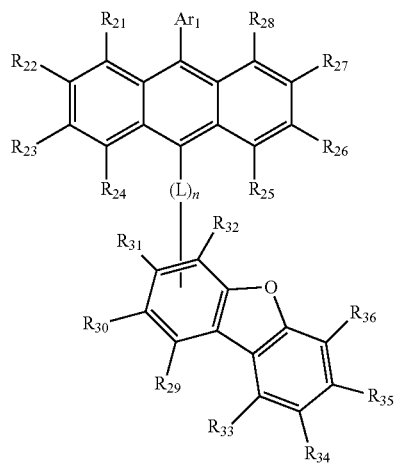

wherein $R_{21}$ to $R_{36}$ are identical to or different from each other and are each independently selected from the group consisting of hydrogen, deuterium, substituted or unsubstituted $C_1$-$C_{30}$ alkyl, substituted or unsubstituted $C_2$-$C_{30}$ alkenyl, substituted or unsubstituted $C_3$-$C_{30}$ cycloalkyl, substituted or unsubstituted $C_5$-$C_{30}$ cycloalkenyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_6$-$C_{50}$ aryl, substituted or unsubstituted $C_2$-$C_{59}$ heteroaryl, substituted or unsubstituted silicon, substituted or unsubstituted boron, substituted or unsubstituted silane, carbonyl, phosphoryl, amino, nitrile, hydroxyl, nitro, halogen, amide, and ester, with the proviso that one of $R_{29}$ to $R_{32}$ is bonded to L and that $R_{21}$ to $R_{36}$ are optionally bonded to each other to form a fused aliphatic, aromatic, heteroaliphatic or heteroaromatic ring or each of $R_{21}$ to $R_{36}$ is optionally linked to an adjacent substituent to form a fused aliphatic, aromatic, heteroaliphatic or heteroaromatic ring, $Ar_1$ is selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, L is a single bond or is substituted or unsubstituted $C_6$-$C_{20}$ arylene or substituted or unsubstituted $C_2$-$C_{20}$ heteroarylene, and n is an integer from 0 to 3.

14. The organic electroluminescent device according to claim 10, wherein each of the one or more organic layers is formed by a deposition or solution process.

15. The organic electroluminescent device according to claim 9, wherein the organic electroluminescent device is used in a display or lighting system selected from the group consisting of flat panel displays, flexible displays, monochromatic flat panel lighting systems, white flat panel lighting systems, flexible monochromatic lighting systems, and flexible white lighting systems.

16. An organic electroluminescent device comprising a first electrode, a second electrode opposite to the first electrode, and one or more organic layers interposed between the first and second electrodes wherein at least one of the one or more organic layers comprises an organic electroluminescent compound represented by Formula A or B:

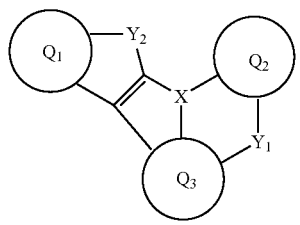

[Formula A]

wherein $Q_1$ to $Q_3$ are identical to or different from each other and are each independently a substituted or unsubstituted $C_6$-$C_{50}$ aromatic hydrocarbon ring or a substituted or unsubstituted $C_2$-$C_{50}$ aromatic heterocyclic ring, X is selected from the group consisting of B, P, P=O, and P=S, $Y_1$ is a single bond or is selected from the group consisting of $NR_1$, $CR_2R_3$, O, S, and $SiR_4R_5$, $Y_2$ is selected from the group consisting of $NR_6$, $CR_7R_8$, O, S, and $SiR_9R_{10}$, and $R_1$ to $R_{10}$ are identical to or different from each other and are each independently selected from the group consisting of hydrogen, deuterium, substituted or unsubstituted $C_1$-$C_{30}$ alkyl, substituted or unsubstituted $C_2$-$C_{30}$ alkenyl, substituted or unsubstituted $C_2$-$C_{30}$ alkynyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that $R_1$ to $R_{10}$ are optionally bonded to each other or each of $R_1$ to $R_{10}$ is optionally bonded to one or more of the rings $Q_1$ to $Q_3$ to form an alicyclic or aromatic monocyclic or polycyclic ring, $R_2$ and $R_3$ are optionally linked together to form an alicyclic or aromatic monocyclic or polycyclic ring, $R_4$ and $R_5$ are optionally linked together to form an alicyclic or aromatic monocyclic or polycyclic ring, $R_7$ and $R_8$ are optionally linked together to form an alicyclic or aromatic monocyclic or polycyclic ring, and $R_9$ and $R_{10}$ are optionally linked together to form an alicyclic or aromatic monocyclic or polycyclic ring, or Formula B:

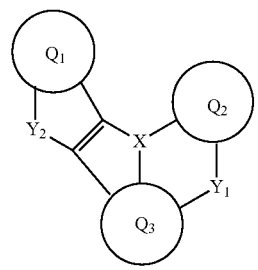

[Formula B]

wherein $Q_1$ to $Q_3$, X, $Y_1$, and $Y_2$ are as defined in Formula A, wherein the at least one of the one or more organic layers comprise at least one layer selected from the group consisting of a hole injecting layer, a hole transport layer, a hole blocking layer, a light emitting layer, an electron blocking layer, an electron transport layer, and an electron injecting layer, wherein the light emitting layer comprises a host and the compound represented by Formula A or B as a dopant, and wherein the light emitting layer further comprises a compound represented by Formula H1:

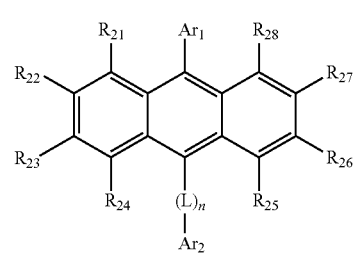

[Formula H1]

wherein $R_{21}$ to $R_{28}$ are identical to or different from each other and are each independently selected from the group consisting of hydrogen, deuterium, substituted or unsubstituted $C_1$-$C_{30}$ alkyl, substituted or unsubstituted $C_2$-$C_{30}$ alkenyl, substituted or unsubstituted $C_3$-$C_{30}$ cycloalkyl, substituted or unsubstituted $C_5$-$C_{30}$ cycloalkenyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_6$-$C_{50}$ aryl, substituted or unsubstituted $C_2$-$C_{50}$ heteroaryl, substituted or unsubstituted silicon, substituted or unsubstituted boron, substituted or unsubstituted silane, carbonyl, phosphoryl, amino, nitrile, hydroxyl, nitro, halogen, amide, and ester, with the proviso that $R_{21}$ to $R_{28}$ are optionally bonded to each other to form a fused aliphatic, aromatic, heteroaliphatic or heteroaromatic ring or each of $R_{21}$ to $R_{28}$ is optionally linked to an adjacent substituent to form a fused aliphatic, aromatic, heteroaliphatic or heteroaromatic ring, $Ar_1$ and $Ar_2$ are identical to or different from each other and are each independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, L is a single bond or is substituted or unsubstituted $C_6$-$C_{20}$ arylene or substituted or unsubstituted $C_2$-$C_{20}$ heteroarylene, and n is an integer from 0 to 3.

17. The organic electroluminescent device of claim 16, wherein each of the one or more organic layers is formed by a deposition or solution process.

18. The organic electroluminescent device of claim 16, wherein the organic electroluminescent device is used in a display or lighting system selected from the group consisting of flat panel displays, flexible displays, monochromatic flat panel lighting systems, white flat panel lighting systems, flexible monochromatic lighting systems, and flexible white lighting systems.

19. An organic electroluminescent device comprising a first electrode, a second electrode opposite to the first electrode, and one or more organic layers interposed between the first and second electrodes wherein at least one of the one or more organic layers comprises an organic electroluminescent compound represented by Formula A or B:

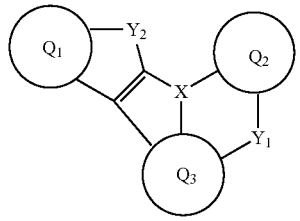

[Formula A]

wherein $Q_1$ to $Q_3$ are identical to or different from each other and are each independently a substituted or unsubstituted $C_6$-$C_{50}$ aromatic hydrocarbon ring or a substituted or unsubstituted $C_2$-$C_{50}$ aromatic heterocyclic ring, X is selected from the gorup consisting of B, P, P=O, and P=S, $Y_1$ is a single bond or is selected from the group consisting of $NR_1$, $CR_2R_3$, O, S, and $SiR_4R_5$, $Y_2$ is selected from the group consisting of $NR_6$, $CR_7R_8$, O, S, and $SiR_9R_{10}$, and $R_1$ to $R_{10}$ are identical to or different from each other and are each independently selected from the group consisting of hydrogen, deuterium, substituted or unsubstituted $C_1$-$C_{30}$ alkyl, substituted or unsubstituted $C_2$-$C_{30}$ alkenyl, substituted or unsubstituted $C_2$-$C_{39}$ alkynyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that $R_1$ to $R_{10}$ are optionally bonded to each other or each of $R_1$ to $R_{10}$ is optionally bonded to one or more of the rings $Q_1$ to $Q_3$ to form an alicyclic or aromatic monocyclic or polycyclic ring, $R_2$ and $R_3$ are optionally linked together to form an alicyclic or aromatic monocyclic or polycyclic ring, $R_4$ and $R_5$ are optionally linked together to form an alicyclic or aromatic monocyclic or polycyclic ring, $R_7$ and $R_8$ are optionally linked together to form an alicyclic or aromatic monocyclic or polycyclic ring, and $R_9$ and $R_{10}$ are optionally linked together to form an alicyclic or aromatic monocyclic or polycyclic ring, or Formula B:

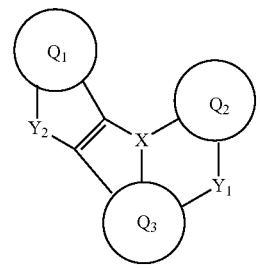

[Formula B]

wherein $Q_1$ to $Q_3$, X, $Y_1$, and $Y_2$ are as defined in Formula A, wherein the at least one of the one or more organic layers comprise at least one layer selected from the group consisting of a hole injecting layer, a hole transport layer, a hole blocking layer, a light emitting layer, an electron blocking layer, an electron transport layer, and an electron injecting layer, wherein the light emitting layer comprises a host and the compound represented by Formula A or B as a dopant, and wherein the light emitting layer further comprises a compound represented by Formula H2:

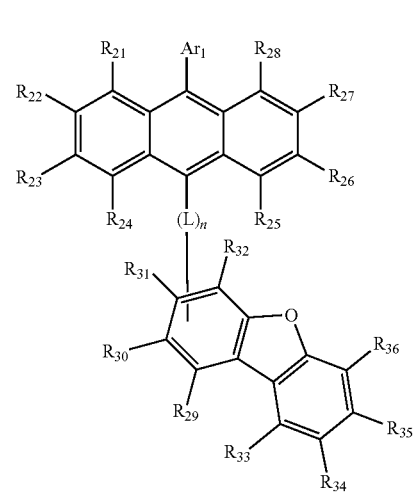

[Formula H2]

wherein $R_{21}$ to $R_{36}$ are identical to or different from each other and are each independently selected from the group consisting of hydrogen, deuterium, substituted or unsubstituted $C_1$-$C_{30}$ alkyl, substituted or unsubstituted $C_2$-$C_{30}$ alkenyl, substituted or unsubstituted $C_3$-$C_{30}$ cycloalkyl, substituted or unsubstituted $C_5$-$C_{30}$ cycloalkenyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_6$-$C_{50}$ aryl, substituted or unsubstituted $C_2$-$C_{59}$ heteroaryl, substituted or unsubstituted silicon, substituted or unsubstituted boron, substituted or unsubstituted silane, carbonyl, phosphoryl, amino, nitrile, hydroxyl, nitro, halogen, amide, and ester, with the proviso that one of $R_{29}$ to $R_{32}$ is bonded to L and that $R_{21}$ to $R_{36}$ are optionally bonded to each other to form a fused aliphatic, aromatic, heteroaliphatic or heteroaromatic ring or each of $R_{21}$ to $R_{36}$ is optionally linked to an adjacent substituent to form a fused aliphatic, aromatic, heteroaliphatic or heteroaromatic ring, $Ar_1$ is selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, L is a single bond or is substituted or unsubstituted $C_6$-$C_{20}$ arylene or substituted or unsubstituted $C_2$-$C_{20}$ heteroarylene, and n is an integer from 0 to 3.

20. The organic electroluminescent device of claim 19, wherein each of the one or more organic layers is formed by a deposition or solution process.

21. The organic electroluminescent device according to claim 19, wherein the organic electroluminescent device is used in a display or lighting system selected from the group consisting of flat panel displays, flexible displays, monochromatic flat panel lighting systems, white flat panel lighting systems, flexible monochromatic lighting systems, and flexible white lighting systems.

* * * * *